(12) United States Patent
Umezaki

(10) Patent No.: US 10,839,766 B2
(45) Date of Patent: Nov. 17, 2020

(54) SEMICONDUCTOR DEVICE, DISPLAY MODULE, AND ELECTRONIC DEVICE

(71) Applicant: SEMICONDUCTOR ENERGY LABORATORY CO., LTD., Atsugi (JP)

(72) Inventor: Atsushi Umezaki, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/263,153

(22) Filed: Jan. 31, 2019

(65) Prior Publication Data

US 2019/0164517 A1    May 30, 2019

Related U.S. Application Data

(62) Division of application No. 14/680,520, filed on Apr. 7, 2015, now Pat. No. 10,199,006.

(30) Foreign Application Priority Data

Apr. 24, 2014 (JP) .................................. 2014-090314

(51) Int. Cl.
  *G09G 3/20* (2006.01)
  *H03K 5/15* (2006.01)
  (Continued)

(52) U.S. Cl.
  CPC ............. *G09G 3/3688* (2013.01); *G09G 3/20* (2013.01); *G11C 19/287* (2013.01);
  (Continued)

(58) Field of Classification Search
  CPC ................... G09G 3/3688; G09G 3/20; G09G 2310/0267; G09G 2310/0283;
  (Continued)

(56) References Cited

U.S. PATENT DOCUMENTS 7,038,653 B2    5/2006    Moon
7,486,269 B2    2/2009    Moon
(Continued)

FOREIGN PATENT DOCUMENTS

JP    2004-103226 A    4/2004
JP    2005-050502 A    2/2005
(Continued)

*Primary Examiner* — Julie Anne Watko
(74) *Attorney, Agent, or Firm* — Nixon Peabody LLP; Jeffrey L. Costellia

(57) ABSTRACT

A first flipflop outputs a first signal synchronized with a first clock signal, a second flipflop outputs a second signal synchronized with a second clock signal, and a third flipflop outputs a third signal synchronized with a third clock signal. The second flipflop includes first to fifth transistors. In the first transistor, the second clock signal is input to a first terminal and the second signal is output from a second terminal. In the second transistor, a first signal is input to a first terminal, a second terminal is electrically connected to a gate of the first transistor, and the first clock signal is input to a gate. In the third transistor, the third signal is input to a first terminal, a second terminal is electrically connected to the gate of the first transistor, and the third clock signal is input to a gate.

6 Claims, 38 Drawing Sheets

(51) Int. Cl.
*G11C 19/28* (2006.01)
*G09G 3/36* (2006.01)
*H03K 3/356* (2006.01)
*H03K 4/02* (2006.01)

(52) U.S. Cl.
CPC ... *H03K 3/356026* (2013.01); *H03K 5/15066* (2013.01); *H03K 5/15093* (2013.01); *G09G 2310/0267* (2013.01); *G09G 2310/0283* (2013.01); *G09G 2310/0286* (2013.01); *H03K 4/026* (2013.01)

(58) Field of Classification Search
CPC ......... G09G 2310/0286; G11C 19/287; H03K 3/356026; H03K 3/15066; H03K 5/15093; H03K 4/026
See application file for complete search history.

(56) References Cited

U.S. PATENT DOCUMENTS

| | | | |
|---|---|---|---|
| 8,018,423 B2 | 9/2011 | Tsai et al. | |
| 8,314,765 B2 * | 11/2012 | Umezaki | G11C 19/184 345/98 |
| 8,456,200 B2 | 6/2013 | Sato et al. | |
| 8,519,929 B2 | 8/2013 | Umezaki | |
| 8,531,224 B2 | 9/2013 | Iwamoto et al. | |
| 8,564,523 B2 | 10/2013 | Moon | |
| 8,698,551 B2 | 4/2014 | Umezaki | |
| 8,774,347 B2 * | 7/2014 | Umezaki | G09G 3/3677 377/64 |
| 8,902,144 B2 | 12/2014 | Umezaki | |
| 8,902,374 B2 | 12/2014 | Umezaki | |
| 9,337,184 B2 | 5/2016 | Umezaki | |
| 9,881,688 B2 | 1/2018 | Sasaki et al. | |
| 9,941,308 B2 | 4/2018 | Umezaki | |
| 10,008,519 B1 | 6/2018 | Umezaki | |
| 10,304,873 B2 | 5/2019 | Umezaki | |
| 10,629,134 B2 | 4/2020 | Umezaki | |
| 2005/0134545 A1 * | 6/2005 | Jang | G09G 3/3688 345/100 |
| 2006/0170061 A1 | 8/2006 | Nagao et al. | |
| 2008/0007296 A1 * | 1/2008 | Umezaki | G02F 1/13306 326/62 |
| 2008/0062112 A1 * | 3/2008 | Umezaki | G02F 1/136213 345/100 |
| 2010/0244029 A1 | 9/2010 | Yamazaki et al. | |
| 2011/0001752 A1 | 1/2011 | Ohta et al. | |
| 2011/0267326 A1 * | 11/2011 | Kim | G09G 3/3677 345/211 |
| 2012/0008731 A1 | 1/2012 | Hsu et al. | |
| 2012/0086477 A1 | 4/2012 | Sato et al. | |
| 2012/0320008 A1 * | 12/2012 | Takahashi | G11C 19/28 345/204 |
| 2013/0009856 A1 * | 1/2013 | Takahashi | G11C 19/184 345/92 |
| 2013/0127809 A1 | 5/2013 | Han | |
| 2013/0223584 A1 | 8/2013 | Umezaki | |
| 2015/0262703 A1 | 9/2015 | Murakami et al. | |
| 2015/0279480 A1 | 10/2015 | Murakami et al. | |
| 2016/0125954 A1 * | 5/2016 | Gu | G09G 3/3688 377/64 |
| 2016/0141308 A1 * | 5/2016 | Umezaki | G11C 19/28 349/43 |
| 2018/0190180 A1 * | 7/2018 | Shang | G09G 3/2092 |
| 2019/0164517 A1 * | 5/2019 | Umezaki | G09G 3/3688 |
| 2019/0304559 A1 * | 10/2019 | Wang | G11C 19/287 |

FOREIGN PATENT DOCUMENTS

| | | |
|---|---|---|
| JP | 2010-152347 A | 7/2010 |
| JP | 2010-192019 A | 9/2010 |
| JP | 2012-083478 A | 4/2012 |
| WO | WO-2010/061723 | 6/2010 |
| WO | WO-2011/055569 | 5/2011 |
| WO | WO-2014/054516 | 4/2014 |
| WO | WO-2014/054517 | 4/2014 |
| WO | WO-2014/054518 | 4/2014 |

* cited by examiner

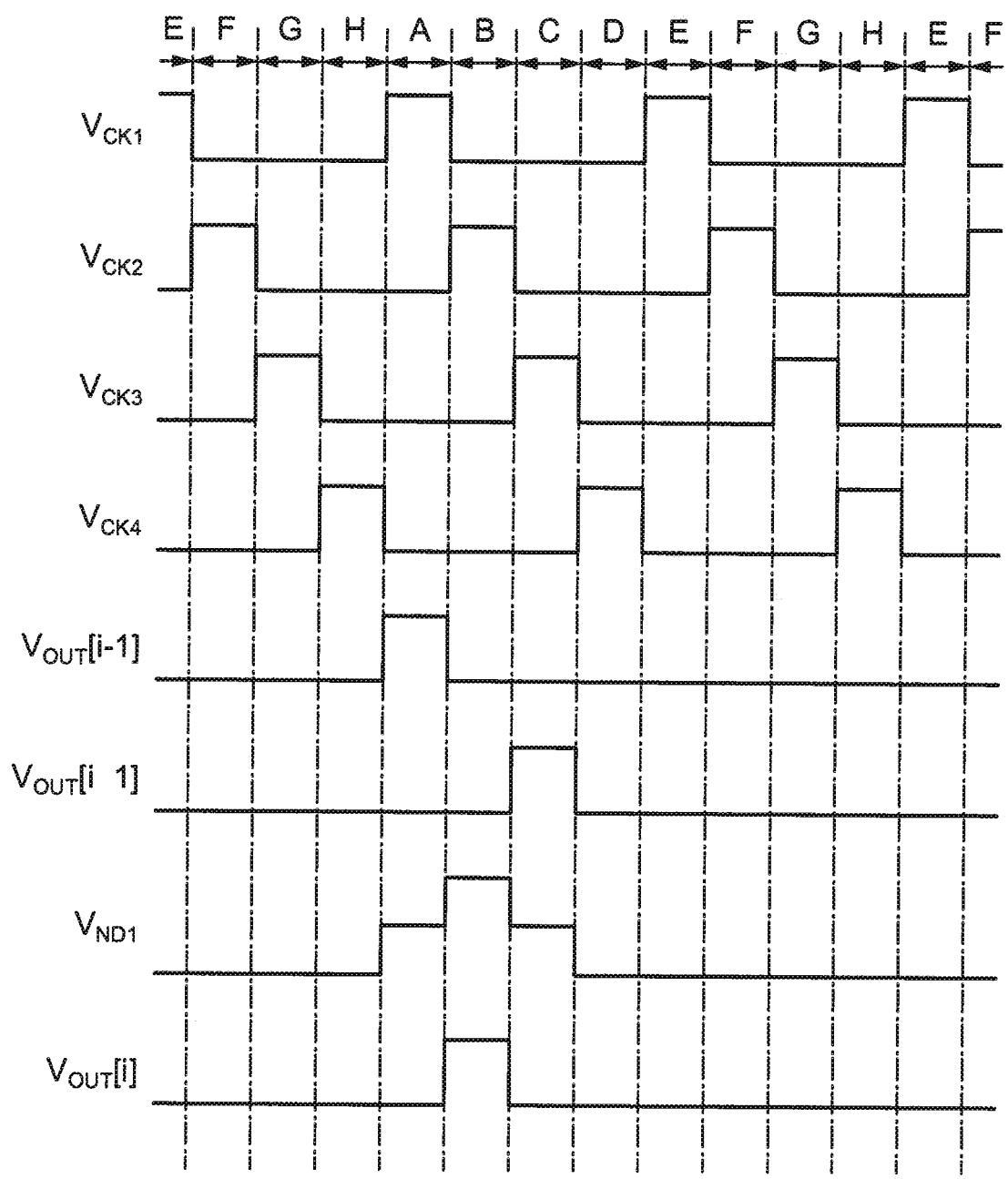

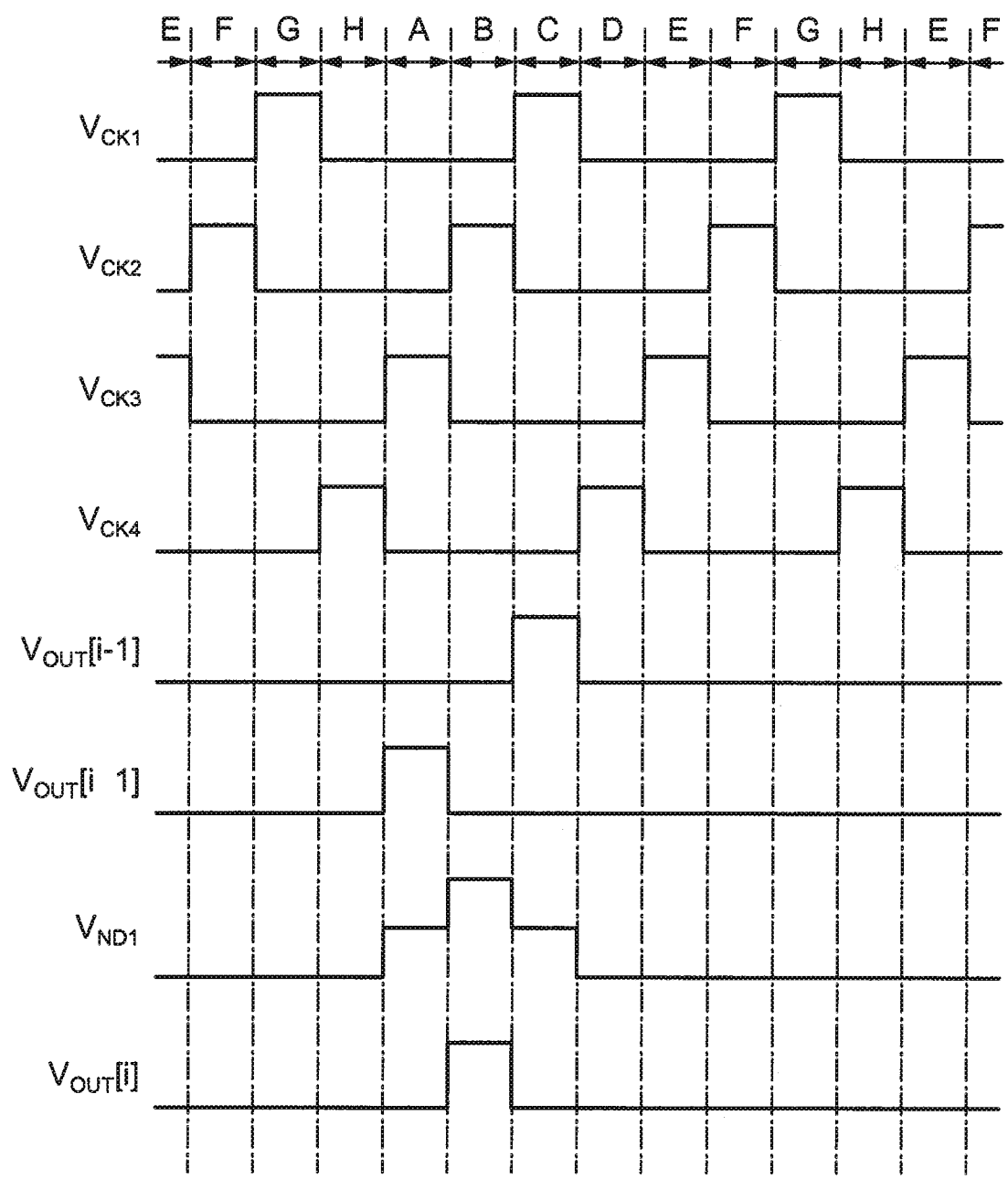

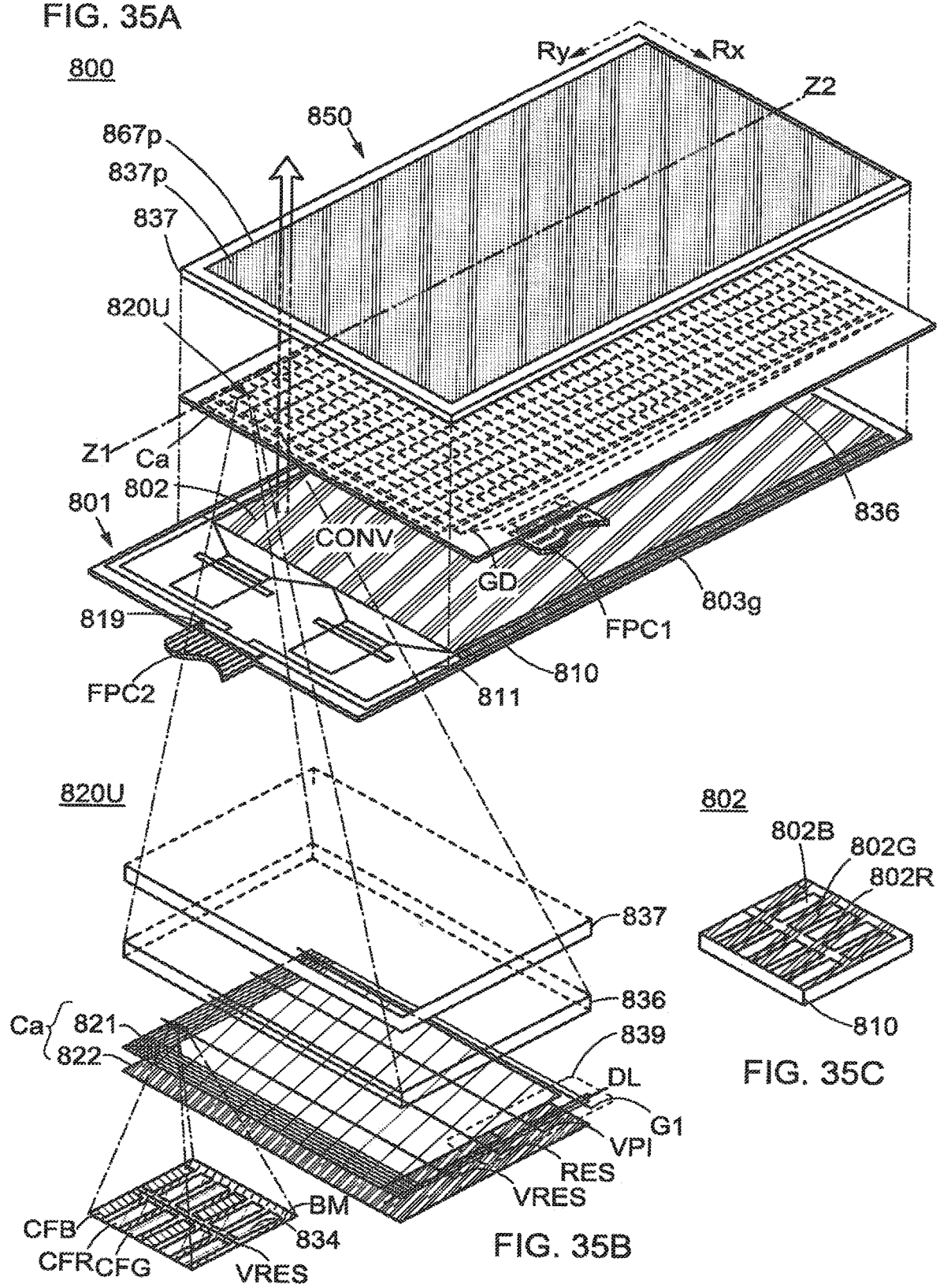
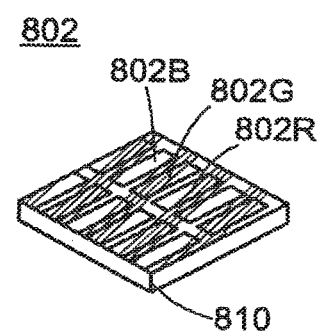
FIG. 35A
FIG. 35B
FIG. 35C

1400

1401 1402 1403

1410  1414  1412

1411
1415  1413

1420  1424
1421  1422
1423

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display device, a display module, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A shift register is used for a driver circuit of a memory device, an image sensor, a display device, or the like. In particular, a shift register formed using transistors having the same polarity has been developed. A technique relating to such a shift register is disclosed in Patent Documents 1 and 2.

The shift direction of the shift registers disclosed in Patent Documents 1 and 2 is only one way.

REFERENCE

Patent Document

[Patent Document 1] Japanese Published Patent Application No. 2004-103226
[Patent Document 2] Japanese Published Patent Application No. 2005-050502

SUMMARY OF THE INVENTION

An object of one embodiment of the present invention is to provide a novel circuit or a method for driving the circuit. In particular, an object of one embodiment of the present invention is to provide a novel circuit which can be used for at least part of a shift register in which the shift direction can be changed or a method for driving the circuit.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a shift register. The shift register includes first to third flipflops. The first flipflop has a function of outputting a first signal to a first wiring. The second flipflop has a function of outputting a second signal to a second wiring. The third flipflop has a function of outputting a third signal to a third wiring. The first signal has a value synchronized with a first clock signal. The second signal has a value synchronized with a second clock signal. The third signal has a value synchronized with a third clock signal. The second flipflop includes first to third transistors. One of a source and a drain of the first transistor is electrically connected to a fourth wiring. The other of the source and the drain of the first transistor is electrically connected to the second wiring. One of a source and a drain of the second transistor is electrically connected to the first wiring. The other of the source and the drain of the second transistor is electrically connected to a gate of the first transistor. A gate of the second transistor is electrically connected to a fifth wiring. One of a source and a drain of the third transistor is electrically connected to the third wiring. The other of the source and the drain of the third transistor is electrically connected to the gate of the first transistor. A gate of the third transistor is electrically connected to a sixth wiring. The fourth wiring has a function of transmitting the second clock signal. The fifth wiring has a function of transmitting the first clock signal. The sixth wiring has a function of transmitting the third clock signal.

One embodiment of the present invention is a semiconductor device including a shift register. The shift register includes first to third flipflops. The first flipflop has a function of outputting a first signal to a first wiring. The second flipflop has a function of outputting a second signal to a second wiring. The third flipflop has a function of outputting a third signal to a third wiring. The first signal has a value synchronized with a first clock signal. The second signal has a value synchronized with a second clock signal. The third signal has a value synchronized with a third clock signal. The second flipflop includes first to third transistors. One of a source and a drain of the first transistor is electrically connected to a fourth wiring. The other of the source and the drain of the first transistor is electrically connected to the second wiring. One of a source and a drain of the second transistor is electrically connected to a fifth wiring. The other of the source and the drain of the second transistor is electrically connected to a gate of the first transistor. A gate of the second transistor is electrically connected to the first wiring. One of a source and a drain of the third transistor is electrically connected to a sixth wiring. The other of the source and the drain of the third transistor is electrically connected to the gate of the first transistor. A gate of the third transistor is electrically connected to the third wiring. The fourth wiring has a function of transmitting the second clock signal. The fifth wiring has a function of transmitting the first clock signal. The sixth wiring has a function of transmitting the third clock signal.

One embodiment of the present invention is a semiconductor device including a shift register. The shift register includes first to fifth flipflops. The first flipflop has a function of outputting a first signal to a first wiring. The second flipflop has a function of outputting a second signal to a second wiring. The third flipflop has a function of outputting a third signal to a third wiring. The fourth flipflop has a function of outputting a fourth signal to a fourth wiring. The fifth flipflop has a function of outputting a fifth signal to a fifth wiring. The first signal has a value synchronized with a first clock signal. The second signal has a value synchronized with a second clock signal. The third signal has a value synchronized with a third clock signal. The fourth signal has a value synchronized with a fourth clock signal. The fifth signal has a value synchronized with the first clock signal. The third flipflop includes first to fifth transistors. One of a source and a drain of the first transistor is electrically connected to a sixth wiring. The other of the source and the drain of the first transistor is electrically connected to the third wiring. One of a source and a drain of the second transistor is electrically connected to the second wiring. The other of the source and the drain of the second transistor is electrically connected to a gate of the first transistor. One of a source and a drain of the third transistor is electrically connected to the fourth wiring. The other of the source and the drain of the third transistor is electrically connected to the gate of the first transistor. At least one of a gate and one of a source and a drain of the fourth transistor is electrically connected to the first wiring. The other of the source and the drain of the fourth transistor is electrically connected to a gate of the second transistor. At least one of a gate and one of a source and a drain of the fifth transistor is electrically connected to the fifth wiring. The other of the source and the drain of the fifth transistor is electrically connected to a gate of the third transistor. The sixth wiring has a function of transmitting the third clock signal.

One embodiment of the present invention is a semiconductor device including a shift register. The shift register includes first to third flipflops. The first flipflop has a function of outputting a first signal to a first wiring. The second flipflop has a function of outputting a second signal to a second wiring. The third flipflop has a function of outputting a third signal to a third wiring. The first signal has a value synchronized with a first clock signal. The second signal has a value synchronized with a second clock signal. The third signal has a value synchronized with a third clock signal. The second flipflop includes first to fifth transistors. One of a source and a drain of the first transistor is electrically connected to a fourth wiring. The other of the source and the drain of the first transistor is electrically connected to the second wiring. One of a source and a drain of the second transistor is electrically connected to the first wiring. The other of the source and the drain of the second transistor is electrically connected to a gate of the first transistor. One of a source and a drain of the third transistor is electrically connected to the third wiring. The other of the source and the drain of the third transistor is electrically connected to the gate of the first transistor. At least one of a gate and one of a source and a drain of the fourth transistor is electrically connected to the first wiring. The other of the source and the drain of the fourth transistor is electrically connected to a gate of the second transistor. At least one of a gate and one of a source and a drain of the fifth transistor is electrically connected to the third wiring. The other of the source and the drain of the fifth transistor is electrically connected to a gate of the third transistor. The fourth wiring has a function of transmitting the second clock signal.

Note that W (W refers to a channel width)/L (L refers to a channel length) of the fourth transistor is preferably 0.8 to 1.2 times W/L of the fifth transistor.

Note that W (W refers to a channel width)/L (L refers to a channel length) of the second transistor is preferably 0.8 to 1.2 times W/L of the third transistor.

Note that the first transistor preferably includes an oxide semiconductor in a channel formation region.

One embodiment of the present invention is a display module including the above semiconductor device and an FPC.

One embodiment of the present invention is an electronic device including the above semiconductor device or the above display module, a speaker, an operation button, and/or an antenna.

According to one embodiment of the present invention, a novel circuit or a method for driving the circuit can be provided. In particular, a novel circuit which can be applied to at least part of a shift register in which the shift direction can be switched or a method for driving the circuit can be provided.

Note that the descriptions of these effects do not disturb the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

In the accompanying drawings:

FIG. 5 is a timing chart showing operation of a device of one embodiment of the present invention;

FIG. 10 is a timing chart showing operation of a device of one embodiment of the present invention;

FIGS. 35A to 35C are projection drawings illustrating a structure of an input/output device of one embodiment;

DETAILED DESCRIPTION OF THE INVENTION

Figure 1:
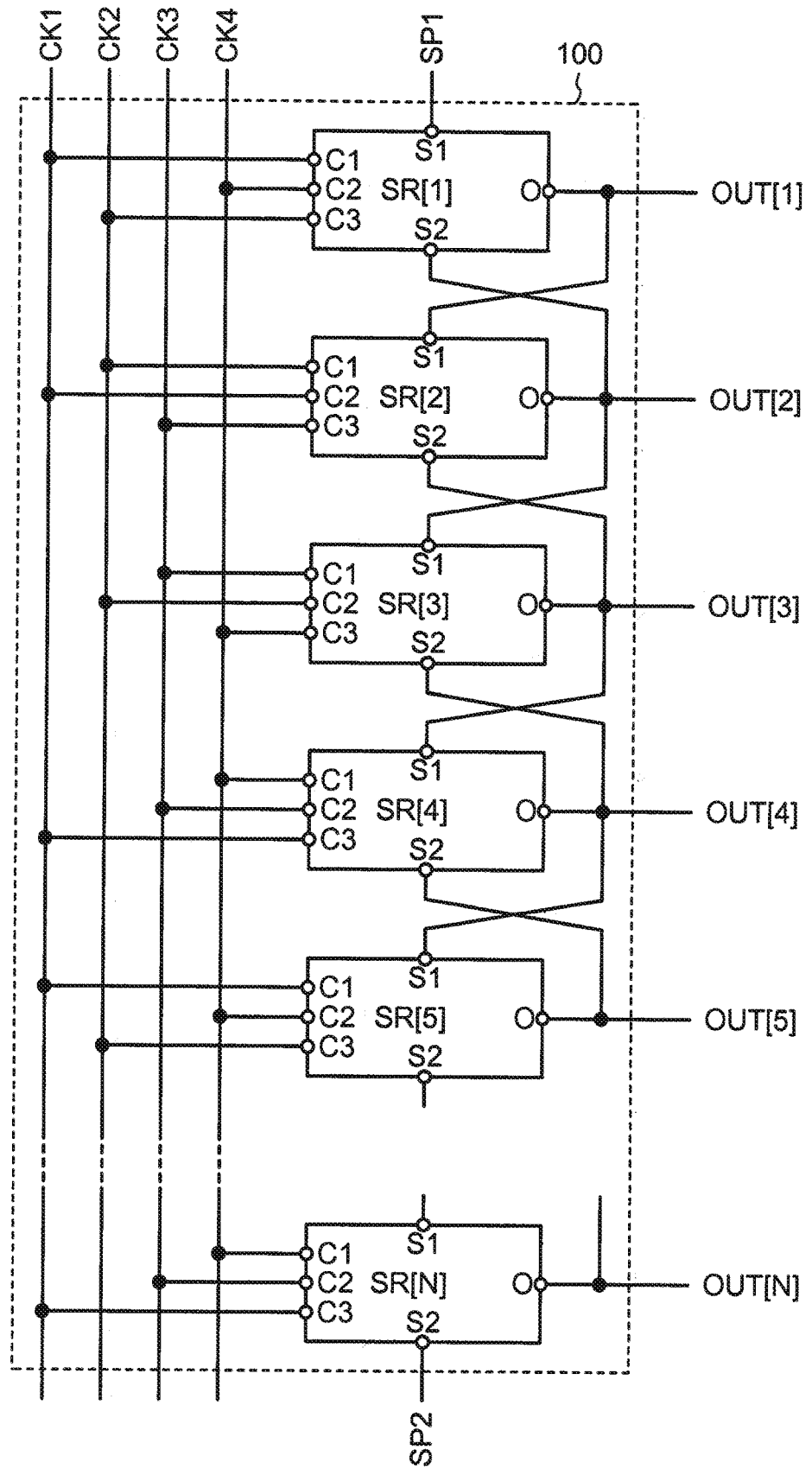
FIG. 1 is a circuit diagram illustrating a device of one embodiment of the present invention.

Embodiments of the present invention will be described below in detail with reference to the drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments.

One embodiment of the present invention includes, in its category, an integrated circuit, a display device, an RF tag, and any other devices. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, common reference numerals are used for the same portions in different drawings.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

Embodiment 1

In this embodiment, a device of one embodiment of the present invention is described.

A device of one embodiment of the present invention illustrated in FIG. 1 includes a circuit 100. The circuit 100 is connected to a wiring CK1, a wiring CK2, a wiring CK3, a wiring CK4, a wiring SP1, a wiring SP2, and N (N is a natural number of 3 or more) wirings OUT (also referred to as wirings OUT[1] to [N]).

Each of the wiring CK1, the wiring CK2, the wiring CK3, the wiring CK4, the wiring SP1, the wiring SP2, and the wirings OUT[1] to [N] has a function of transmitting a signal, a potential, a current, or the like. In other words, each of the wiring CK1, the wiring CK2, the wiring CK3, the wiring CK4, the wiring SP1, the wiring SP2, and the wirings OUT[1] to [N] has a function of a signal line, a power supply line, or a current supply line. For example, a signal is input to each of the wiring CK1, the wiring CK2, the wiring CK3, and the wiring CK4. Examples of a signal input to the wiring CK1 (also referred to as a signal $V_{CK1}$), a signal input to the wiring CK2 (also referred to as a signal $V_{CK2}$), a signal input to the wiring CK3 (also referred to as a signal $V_{CK3}$), and a signal input to the wiring CK4 (also referred to as a signal $V_{CK4}$) are clock signals. Note that the signal $V_{CK1}$ to the signal $V_{CK4}$ preferably have different phases. For example, a signal is input to each of the wiring SP1 and the wiring SP2. Examples of a signal input to the wiring SP1 (also referred to as a signal $V_{SP1}$) and a signal input to the wiring SP2 (also referred to as a signal $V_{SP2}$) are start pulses. As described later, the shift direction of data can be controlled by the signal $V_{SP1}$ and the signal $V_{SP2}$. For example, signals are output from the circuit 100 to the corresponding wirings OUT[1] to [N]. Examples of signals output to the corresponding wirings OUT[1] to [N] (also referred to as signals $V_{OUT}[1]$ to [N]) are output signals of the circuit 100. As described later, the signals $V_{OUT}[1]$ to [N] are signals delayed from the signal $V_{SP1}$ or the signal $V_{SP2}$.

Figure 2:
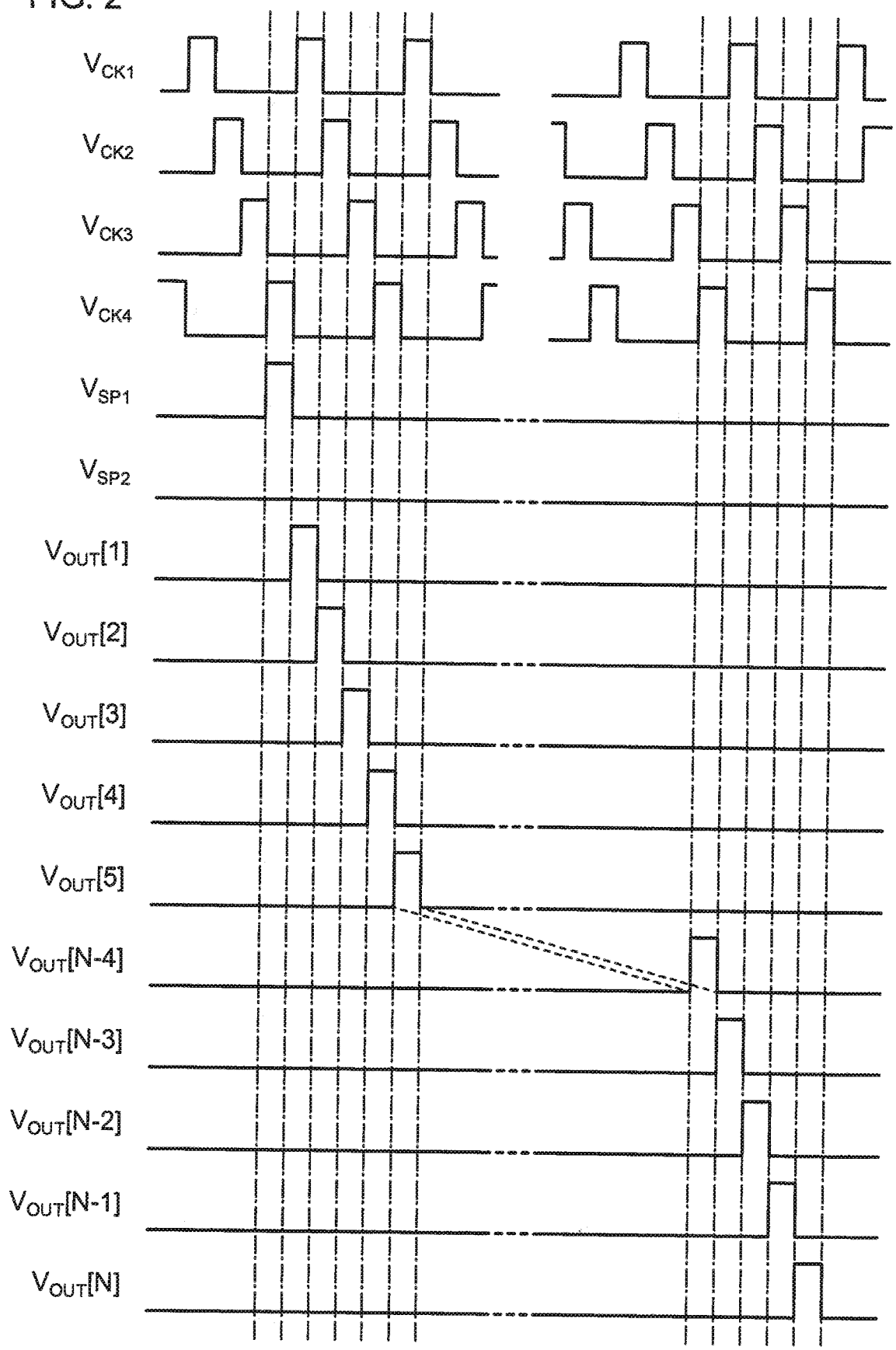
FIG. 2 is a timing chart showing operation of a device of one embodiment of the present invention.
Figure 3:
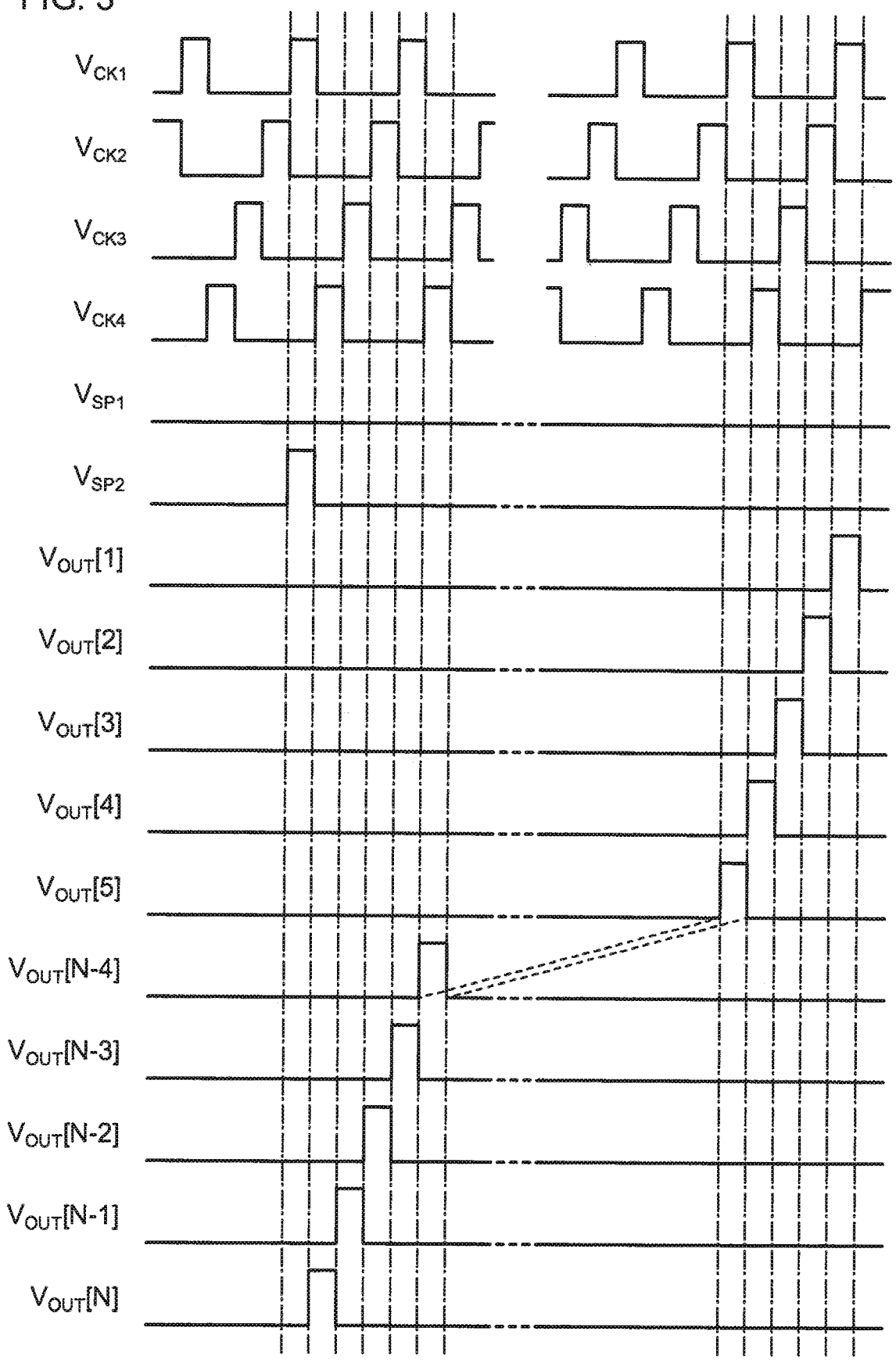
FIG. 3 is a timing chart showing operation of a device of one embodiment of the present invention.

The circuit 100 has a function of controlling the potentials of the wirings OUT[1] to [N]. Specifically, the circuit 100 has a function of shifting the signal $V_{SP1}$ and a function of shifting the signal $V_{SP2}$. Furthermore, the circuit 100 has a function of outputting the signals $V_{OUT}$[1] to [N] delayed from the signal $V_{SP1}$ to the corresponding wirings OUT[1] to [N] and a function of outputting the signals $V_{OUT}$[1] to [N] delayed from the signal $V_{SP2}$ to the corresponding wirings OUT[1] to [N]. As exemplified in FIG. 2, when the signal $V_{SP1}$ is set at high level (in an active state), the signal $V_{SP1}$ is shifted in a direction from the wiring OUT[1] to the wiring OUT[N]. The signal $V_{OUT}$[1] is delayed from the signal $V_{SP1}$, the signal $V_{OUT}$[i] (i is one of 2 to N−1) is delayed from the signal $V_{OUT}$[i−1], and the signal $V_{OUT}$[N] is delayed from the signal $V_{OUT}$[N−1]. As exemplified in FIG. 3, when the signal $V_{SP2}$ is set at high level (in an active state), the signal $V_{SP2}$ is shifted in a direction from the wiring OUT[N] to the wiring OUT[1]. The signal $V_{OUT}$[N] is delayed from the signal $V_{SP2}$, the signal $V_{OUT}$[i] is delayed from the signal $V_{OUT}$[i+1], and the signal $V_{OUT}$[1] is delayed from the signal $V_{OUT}$[2]. As described above, the circuit 100 has a function of a shift register, particularly a bidirectional shift register. The shift direction of data is determined depending on which of the signal $V_{SP1}$ and the signal $V_{SP2}$ is shifted. Which of the signal $V_{SP1}$ and the signal $V_{SP2}$ is shifted depends on which of the signal $V_{SP1}$ and the signal $V_{SP2}$ is set in the active state. Note that the function of the circuit 100 is not limited thereto.

Next, a structure example of the circuit 100 is described with reference to FIG. 1. The circuit 100 includes N circuits SR (also referred to as circuits SR[1] to [N]). In FIG. 1, the circuits SR[1] to [5] and the circuit SR[N] are shown. A terminal C1 of the circuit SR[1] is connected to a corresponding wiring of the wirings CK1 to CK4, a terminal C2 thereof is connected to a corresponding wiring of the wirings CK1 to CK4, a terminal C3 thereof is connected to a corresponding wiring of the wirings CK1 to CK4, a terminal S1 thereof is connected to the wiring SP1, a terminal S2 thereof is connected to the wiring OUT[2], and a terminal O thereof is connected to the wiring OUT[1]. The circuit SR[i] is different from the circuit SR[1] in that the terminal S1 is connected to the wiring OUT[i−1]. The circuit SR[N] is different from the circuit SR[1] in that the terminal S1 is connected to the wiring OUT[N−1] and the terminal S2 is connected to the wiring SP2. Note that a terminal C1 of the circuit SR[4m+1] (m is 0 or a positive integer) is connected to the wiring CK1, a terminal C2 thereof is connected to the wiring CK4, and a terminal C3 thereof is connected to the wiring CK2. A terminal C1 of the circuit SR[4m+2] is connected to the wiring CK2, a terminal C2 thereof is connected to the wiring CK1, and a terminal C3 thereof is connected to the wiring CK3. A terminal C1 of the circuit SR[4m+3] is connected to the wiring CK3, a terminal C2 thereof is connected to the wiring CK2, and a terminal C3 thereof is connected to the wiring CK4. A terminal C1 of the circuit SR[4m+4] (4m+4≤N) is connected to the wiring CK4, a terminal C2 thereof is connected to the wiring CK3, and a terminal C3 thereof is connected to the wiring CK1.

The circuit SR has a function of controlling the potential of the terminal O. Specifically, the circuit SR has a function of shifting a signal of the terminal S and a function of shifting a signal of the terminal S2. Furthermore, the circuit SR has a function of outputting a signal delayed from the signal of the terminal S1 from the terminal O and a function of outputting a signal delayed from the signal of the terminal S2 from the terminal O. As exemplified in FIG. 2, in the case where the signal $V_{SP1}$ is shifted, a signal delayed from a signal input to the terminal S1 is output from the terminal O. For example, in the circuit SR[1], a signal $V_{OUT}$[i] delayed from a signal $V_{OUT}$[i−1] input to the terminal S1 is output from the terminal O. In contrast, as exemplified in FIG. 3, in the case where the signal $V_{SP2}$ is shifted, a signal delayed from a signal input to the terminal S2 is output from the terminal O. For example, in the circuit SR[1], a signal $V_{OUT}$[i] delayed from a signal $V_{OUT}$[i+1] input to the terminal S2 is output from the terminal O. As described above, the circuit SR has a function of a stage of a sequential circuit, a flipflop, or a shift register. Note that the function of the circuit SR is not limited thereto.

Next, a specific example of the circuit SR is described with reference to FIG. 4. The circuit SR includes a transistor 101, a transistor 102, a transistor 103, a transistor 104, and a transistor 105. A first terminal and a second terminal of the transistor 101 are connected to a terminal C1 and a terminal O, respectively. A first terminal and a second terminal of the transistor 102 are connected to a wiring VSS1 and the terminal O, respectively. A first terminal and a second terminal of the transistor 103 are connected to a wiring VSS2 and a gate of the transistor 101, respectively. A first terminal, a second terminal, and a gate of the transistor 104 are connected to a terminal S1, the gate of the transistor 101, and a terminal C2, respectively. A first terminal, a second terminal, and a gate of the transistor 105 are connected to a terminal S2, the gate of the transistor 101, and a terminal C3, respectively. Note that the gate of the transistor 101, the second terminal of the transistor 103, the second terminal of the transistor 104, or the second terminal of the transistor 105 is referred to as a node ND1.

Each of the transistors 101 to 105 has a function of controlling electrical conduction and non-conduction between a portion to which the first terminal (also referred to as one of a source and a drain) is connected and a portion to which the second terminal (also referred to as the other of the source and the drain) is connected. That is, each of the transistors 101 to 105 has a function of a switch. Note that the functions of the transistors 101 to 105 are not limited thereto.

Each of the wiring VSS1 and the wiring VSS2 has a function of transmitting a signal, a potential, or a current. In other words, each of the wiring VSS1 and the wiring VSS2 has a function of a signal line, a power supply line, or a current supply line. For example, a potential is input to each of the wiring VSS1 and the wiring VSS2. The potential input to each of the wiring VSS1 and the wiring VSS2 is a potential corresponding to the low-level or high-level signal $V_{CK1}$, the low-level or high-level signal $V_{CK2}$, the low-level or high-level signal $V_{CK3}$, or the low-level or high-level signal $V_{CK4}$. In particular, when the transistor 101 is an n-channel transistor, a potential corresponding to the low-level signal $V_{CK1}$, the low-level signal $V_{CK2}$, the low-level signal $V_{CK3}$, or the low-level signal $V_{CK4}$ is preferably input to each of the wiring VSS1 and the wiring VSS2. In contrast, when the transistor 101 is a p-channel transistor, a potential corresponding to the high-level signal $V_{CK1}$, the high-level signal $V_{CK2}$, the high-level signal $V_{CK3}$, or the high-level signal $V_{CK4}$ is preferably input to each of the wiring VSS1 and the wiring VSS2.

A potential corresponding to a low-level signal is a potential that is equal or substantially equal to the low-level signal. Note that the potential corresponding to the low-level signal may be a potential lower than the high-level signal or a potential lower than an intermediate potential between the high-level and low-level signals. Similarly, a potential corresponding to a high-level signal is a potential that is equal or substantially equal to the high-level signal. Note that the potential corresponding to the high-level signal may be a potential higher than the low-level signal or a potential higher than an intermediate potential between the high-level and low-level signals.

In the case where the same potential is input to the wiring VSS and the wiring VSS2, the wiring VSS1 and the wiring VSS2 may be one wiring. That is, the first terminal of the transistor 102 and the first terminal of the transistor 103 may be connected to the same wiring.

Figure 4:
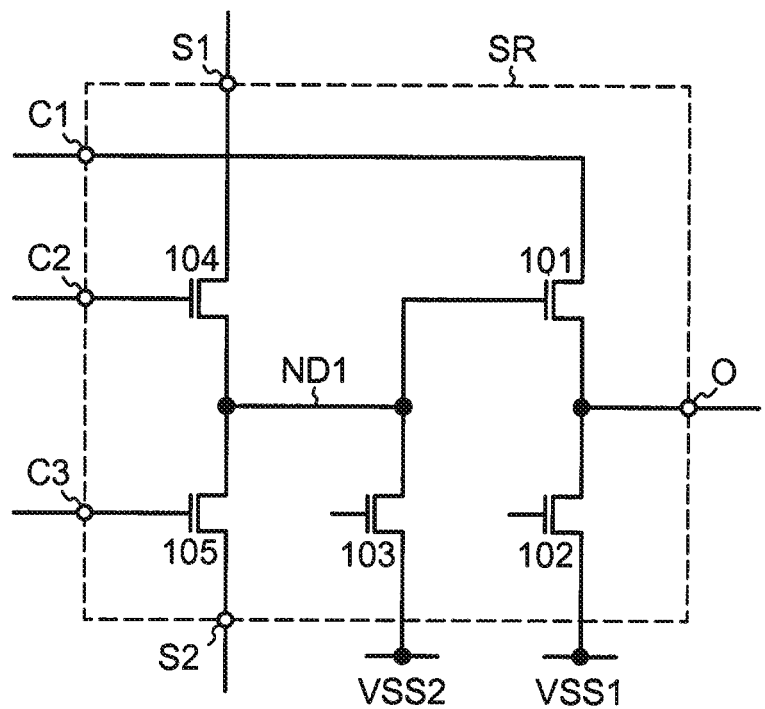
FIG. 4 is a circuit diagram illustrating a device of one embodiment of the present invention.

Next, an example of operation of the circuit SR exemplified in FIG. 4 is described using the circuit SR[i] as an example. For convenience, the terminal C1, the terminal C2, and the terminal C3 of the circuit SR[i] are connected to the wiring CK2, the wiring CK1, and the wiring CK3, respectively. Moreover, for convenience, at least the transistor 101, the transistor 104, and the transistor 105 are n-channel transistors.

The case where a signal delayed from a signal of the terminal S1 is output from the terminal O and the case where a signal delayed from a signal of the terminal S2 is output from the terminal O are separately described.

First, an example of operation in the case where a signal delayed from a signal of the terminal S1 is output from the terminal O is described with reference to FIG. 5.

Figure 6A:
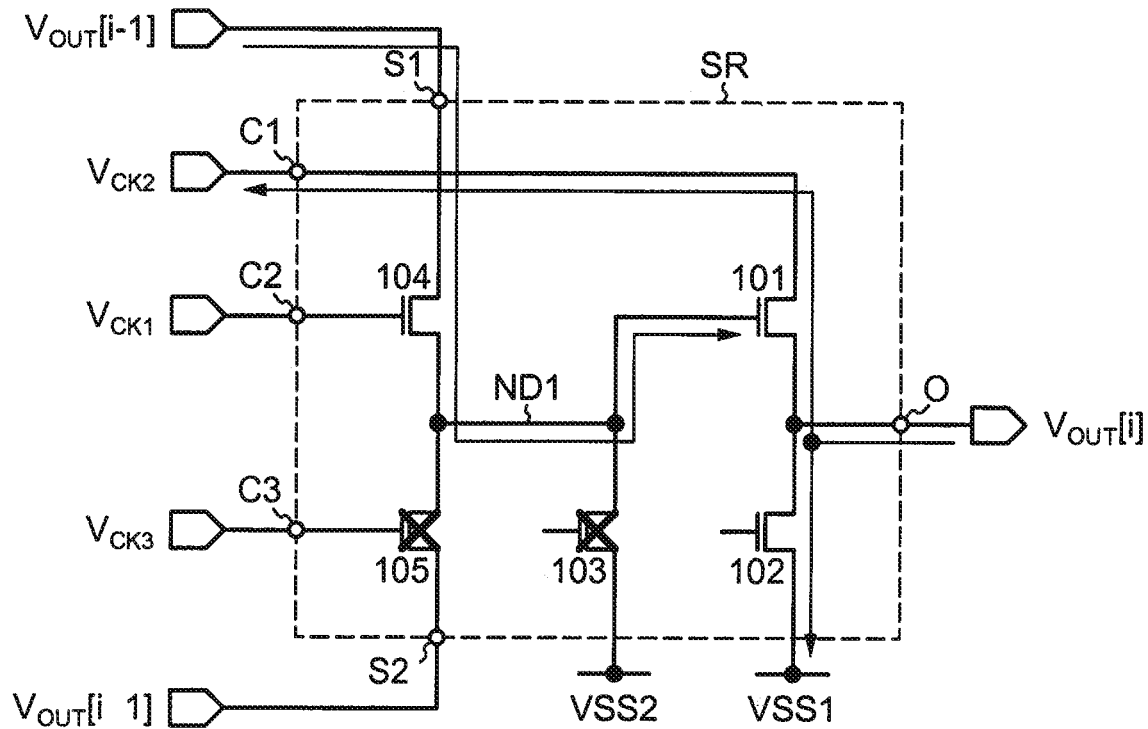
FIGS. 6A and 6B are schematic diagrams illustrating a device of one embodiment of the present invention.

An example of operation of the circuit SR in a period A is described. FIG. 6A is an example of a schematic diagram of the operation in the period A.

The transistor 104 is turned on because a signal (signal $V_{CK1}$) of the terminal C2 is set at high level. The transistor 105 is turned off because a signal (signal $V_{CK3}$) of the terminal C3 is set at low level. The transistor 103 is turned off. Thus, the potential of the node ND1 is increased because a signal (high-level signal $V_{OUT}[i-1]$) of the terminal S1 is supplied to the node ND1. After that, when the potential of the node ND1 becomes equal or substantially equal to a value obtained by subtracting the threshold voltage of the transistor 104 from the potential of the gate of the transistor 104 (signal (high-level signal $V_{CK1}$) of the terminal C2), the transistor 104 is turned off. Thus, the node ND1 is set in the floating state.

The transistor 101 is turned on because the potential of the node ND1 is set to a high value. The transistor 102 is turned on. Thus, the signal (signal $V_{OUT}[1]$) of the terminal O is set at low level because the signal (low-level signal $V_{CK2}$) of the terminal C1 and the potential of the wiring VSS1 are supplied to the terminal O.

Note that the high value of the potential of the node ND1 refers to a value by which the transistor 101 is turned on. Specifically, it is a value higher than the sum of the potential of the first terminal or the second terminal of the transistor 101 and the threshold voltage of the transistor 101.

Note that in the period A, the transistor 102 may be off.

Figure 6B:
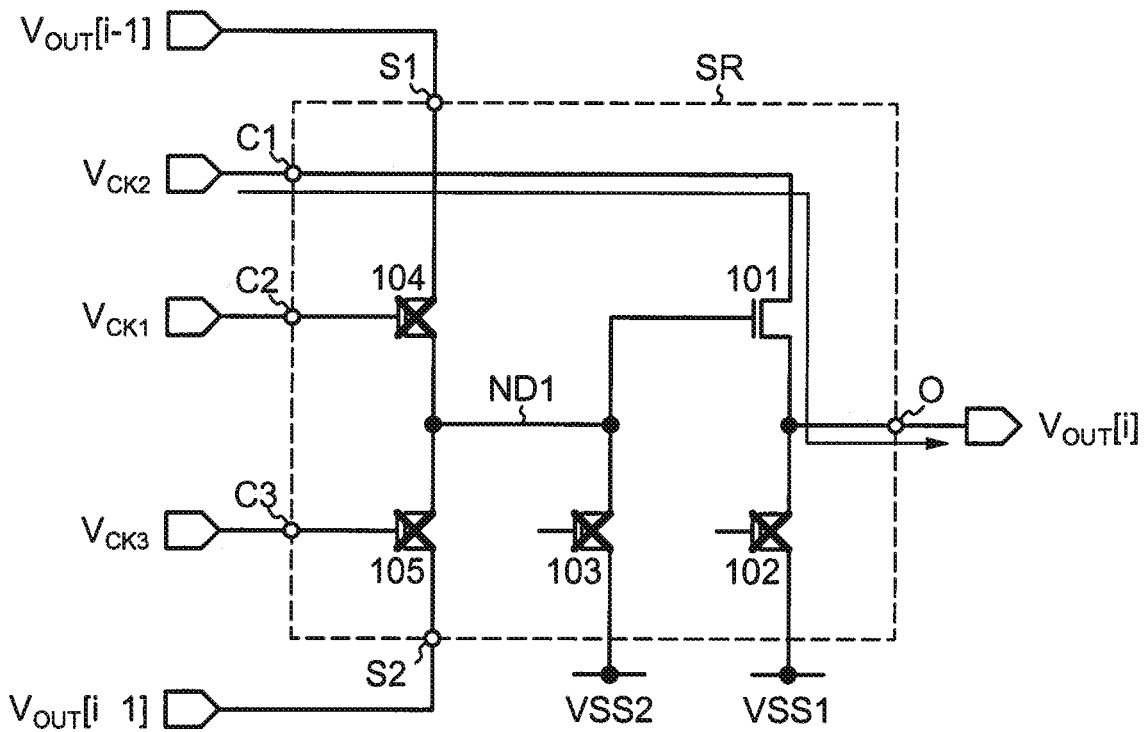

An example of operation of the circuit SR in a period B is described. FIG. 6B is an example of a schematic diagram of the operation in the period B.

The transistor 104 is turned off because the signal (signal $V_{CK1}$) of the terminal C2 is set at low level. Since the signal (signal $V_{CK3}$) of the terminal C3 is at low level, the transistor 105 is kept off. The transistor 103 is kept off. Thus, the potential of the node ND1 is maintained at the high value because the node ND1 is set in the floating state.

Since the potential of the node ND1 has the high value, the transistor 101 is kept on. The transistor 102 is turned off. Thus, the potential of the terminal O is increased because the signal (high-level signal $V_{CK2}$) of the terminal C1 is supplied to the terminal O. The potential difference between the terminal O and the node ND1 is maintained by parasitic capacitance between the gate and the second terminal of the transistor 101 and the node ND1 is in the floating state. Thus, when the potential of the terminal O is increased, the potential of the node ND1 is also increased. When the potential of the node ND1 is higher than the sum of the potential of the first terminal of the transistor 101 (signal (high-level signal $V_{CK2}$) of the terminal C1) and the threshold voltage of the transistor 101, the potential of the terminal O is increased to the same level as the signal (high-level signal $V_{CK2}$) of the terminal C1. Consequently, the signal (signal $V_{OUT}[i]$) of the terminal O is set at high level.

Figure 7A:
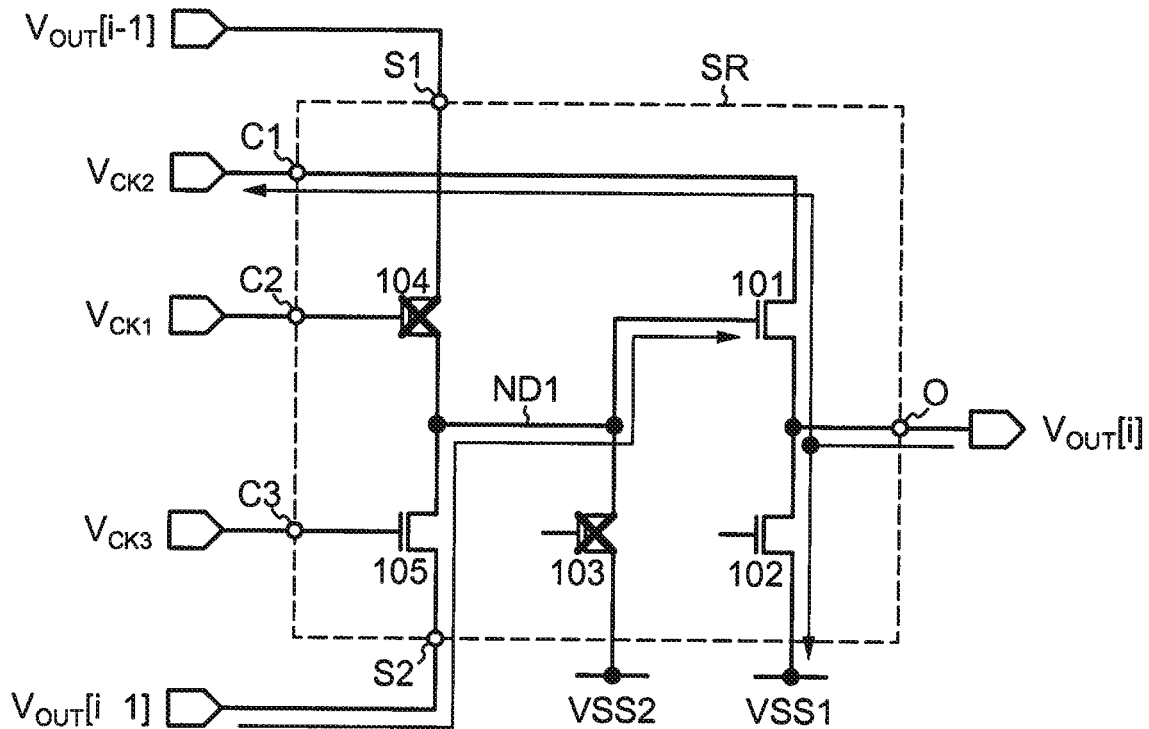
FIGS. 7A and 7B are schematic diagrams illustrating a device of one embodiment of the present invention.

An example of operation of the circuit SR in a period C is described. FIG. 7A is an example of a schematic diagram of the operation in the period C.

Since the signal (signal $V_{CK1}$) of the terminal C2 is at low level, the transistor 104 is kept off. The transistor 105 is turned on because the signal (signal $V_{CK2}$) of the terminal C3 is set at high level. The transistor 103 is kept off. Thus, the potential of the node ND1 is increased because the signal (high-level signal $V_{OUT}[i+1]$) of the terminal S2 is supplied to the node ND1. After that, when the potential of the node ND1 becomes equal or substantially equal to a value obtained by subtracting the threshold voltage of the transistor 105 from the potential of the gate of the transistor 105 (signal (high-level signal $V_{CK3}$) of the terminal C3), the transistor 105 is turned off. Thus, the node ND1 is set in the floating state.

Since the potential of the node ND1 has the high value, the transistor 101 is kept on. The transistor 102 is turned on. Thus, the signal (signal $V_{OUT}[i]$) of the terminal O is set at low level because the signal (low-level signal $V_{CK2}$) of the terminal C1 and the potential of the wiring VSS1 are supplied to the terminal O.

In the period C, the signal (the low-level signal $V_{CK2}$) of the terminal C1 is supplied to the terminal O through the transistor 101. The current supply capability of the transistor 101 is large in many cases. Thus, the fall time of the signal (signal $V_{OUT}[i]$) of the terminal O can be shortened.

Note that when the potential of the terminal O is decreased by supplying the signal (low-level signal $V_{CK2}$) of the terminal C1 and the potential of the wiring VSS1 to the terminal O, the potential of the node ND1 is also decreased. As described above, the transistor 105 is turned on in the case where the potential of the node ND1 is lower than a value obtained by subtracting the threshold voltage of the transistor 105 from the potential of the gate of the transistor 105 (signal (high-level signal $V_{CK3}$) of the terminal C3). The transistor 105 is not turned on in the case where the potential of the node ND1 is higher than the value obtained by subtracting the threshold voltage of the transistor 105 from the potential of the gate of the transistor 105 (signal (high-level signal $V_{CK3}$) of the terminal C3).

Note that in the period C, the transistor 102 may be off.

Figure 7B:
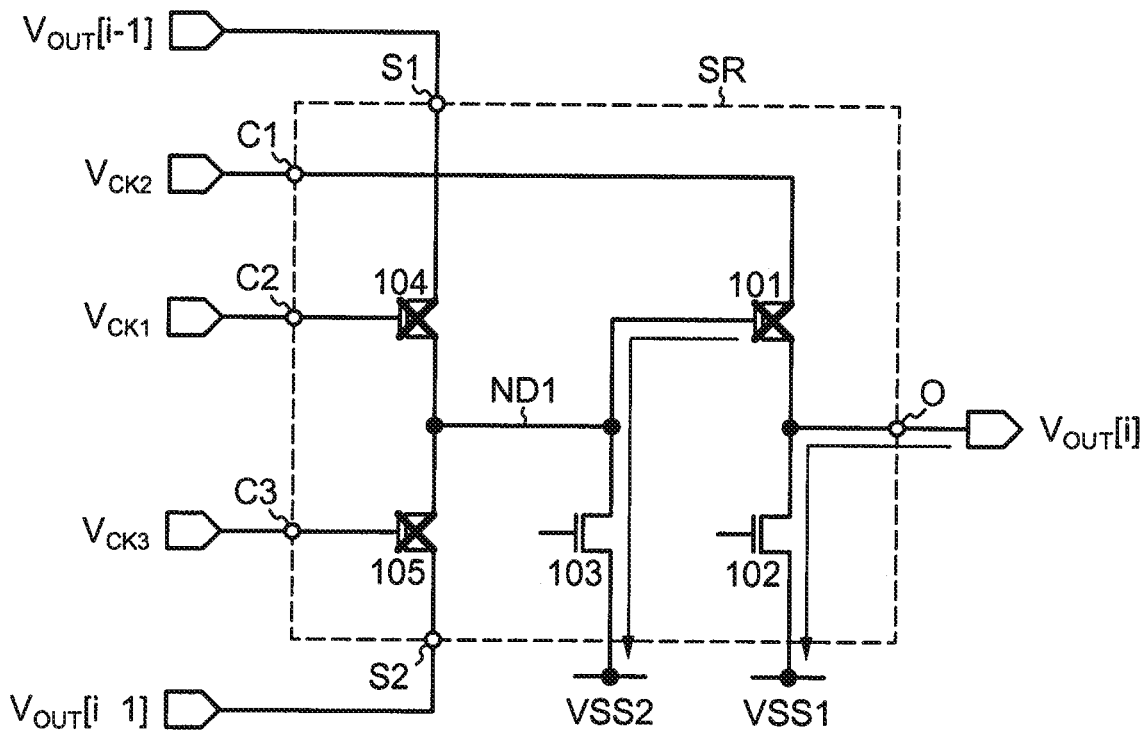

An example of operation of the circuit SR in a period D is described. FIG. 7B is an example of a schematic diagram of the operation in the period D.

Since the signal (signal $V_{CK1}$) of the terminal C2 is at low level, the transistor 104 is kept off. The transistor 105 is turned off because the signal (signal $V_{CK3}$) of the terminal C3 is set at low level. The transistor 103 is turned on. Thus, the potential of the node ND1 is decreased because the potential of the wiring VSS2 is supplied to the node ND1.

The transistor 101 is turned off because the potential of the node ND1 is set to a low value. The transistor 102 is kept on. Thus, the signal (signal $V_{OUT}[i]$) of the terminal O is set at low level because the potential of the wiring VSS1 is supplied to the terminal O.

Note that the low value of the potential of the node ND1 refers to a value by which the transistor 101 is turned off. Specifically, it is a value lower than the sum of the potential of the first terminal or the second terminal of the transistor 101 and the threshold voltage of the transistor 101.

Note that in the period D, the transistor 102 may be off. In that case, the signal (signal $V_{OUT}[i]$) of the terminal O is maintained at low level because the terminal O is set in the floating state.

Note that in the period D, the transistor 103 may be off. In that case, the potential of the node ND1 is maintained at the high value because the node ND1 is set in the floating state. The transistor 101 is turned on because the potential of the node ND1 has the high value. Thus, the low-level signal $V_{CK2}$ is supplied to the terminal O.

Figure 8A:
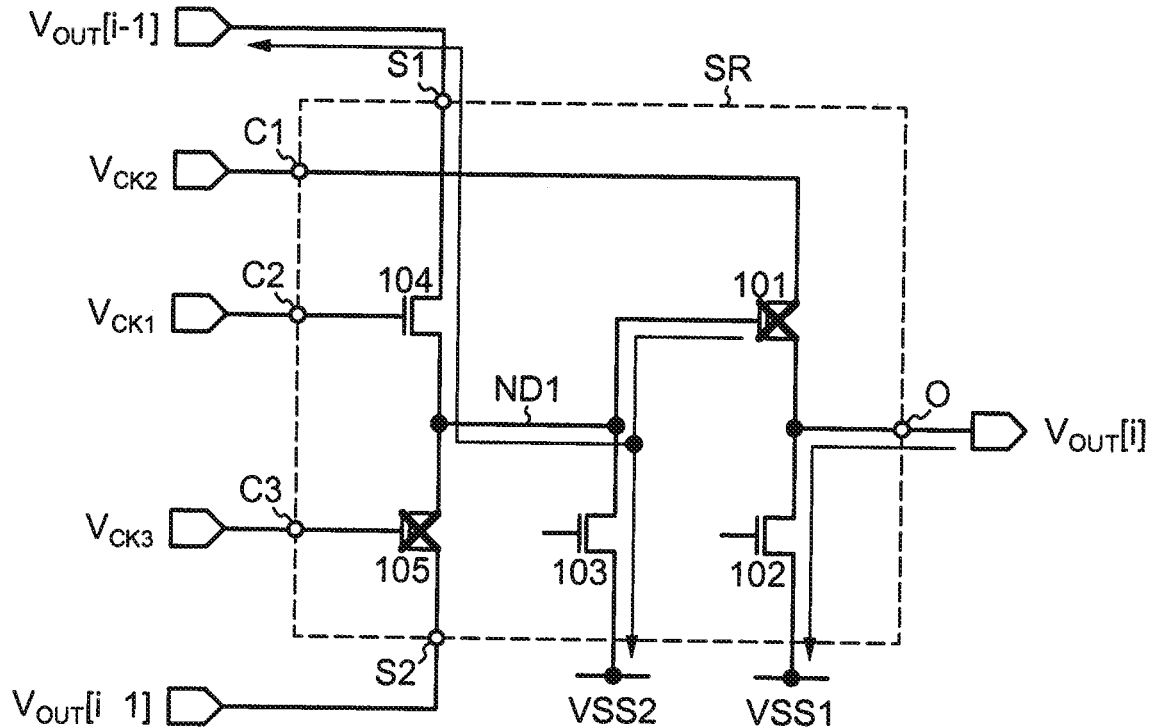
FIGS. 8A and 8B are schematic diagrams illustrating a device of one embodiment of the present invention.

An example of operation of the circuit SR in a period E is described. FIG. 8A is an example of a schematic diagram of the operation in the period E.

The transistor 104 is turned on because the signal (signal $V_{CK1}$) of the terminal C2 is set at high level. Since the signal (signal $V_{CK3}$) of the terminal C3 is at low level, the transistor 105 is kept off. The transistor 103 is kept on. Thus, the potential of the node ND1 is set to a low value because the signal (low-level signal $V_{OUT}[i-1]$) of the terminal S1 and the potential of the wiring VSS2 are supplied to the node ND1.

Since the potential of the node ND1 has the low value, the transistor 101 is kept off. The transistor 102 is kept on. Thus, the signal (signal $V_{OUT}[i]$) of the terminal O is set at low level because the potential of the wiring VSS1 is supplied to the terminal O.

In the period E, the wiring VSS2 and the terminal S1 are brought into electrical conduction through the transistor 103 and the transistor 104. Thus, noise of the wiring OUT[i−1] can be reduced because the potential of the wiring VSS2 is supplied to the wiring OUT[i−1].

Note that in the period E, the transistor 102 may be off. In that case, the signal (signal $V_{OUT}[i]$) of the terminal O is maintained at low level because the terminal O is set in the floating state.

Note that in the period E, the transistor 103 may be off.

Figure 8B:
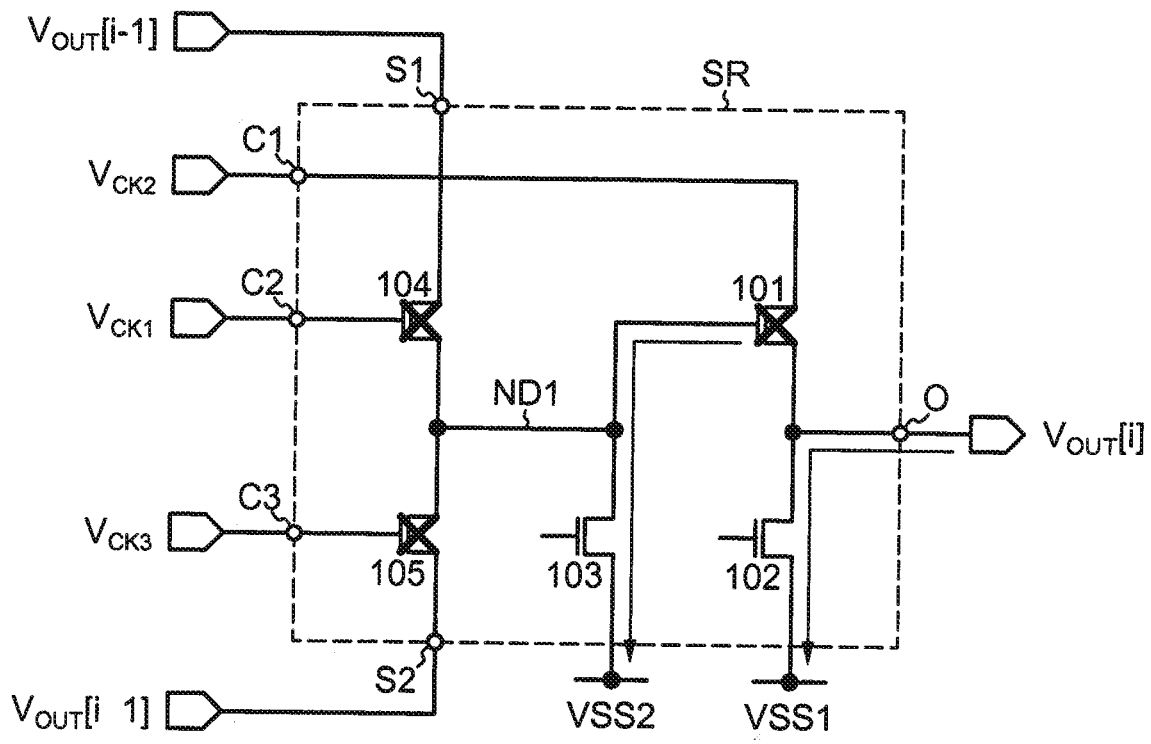

An example of operation of the circuit SR in a period F is described. FIG. 8B is an example of a schematic diagram of the operation in the period F.

The transistor 104 is turned off because the signal (signal $V_{CK1}$) of the terminal C2 is set at low level. Since the signal (signal $V_{CK3}$) of the terminal C3 is at low level, the transistor 105 is kept off. The transistor 103 is kept on. Thus, the potential of the node ND1 is set to a low value because the potential of the wiring VSS2 is supplied to the node ND1.

Since the potential of the node ND1 has the low value, the transistor 101 is kept off. The transistor 102 is kept on. Thus, the signal (signal $V_{OUT}[i]$) of the terminal O is at low level because the potential of the wiring VSS1 is supplied to the terminal O.

Note that in the period F, the transistor 102 may be off. In that case, the signal (signal $V_{OUT}[i]$) of the terminal O is maintained at low level because the terminal O is set in the floating state.

Note that in the period F, the transistor 103 may be off. In that case, the potential of the node ND1 is maintained at the low value because the node ND1 is set in the floating state.

Figure 9A:
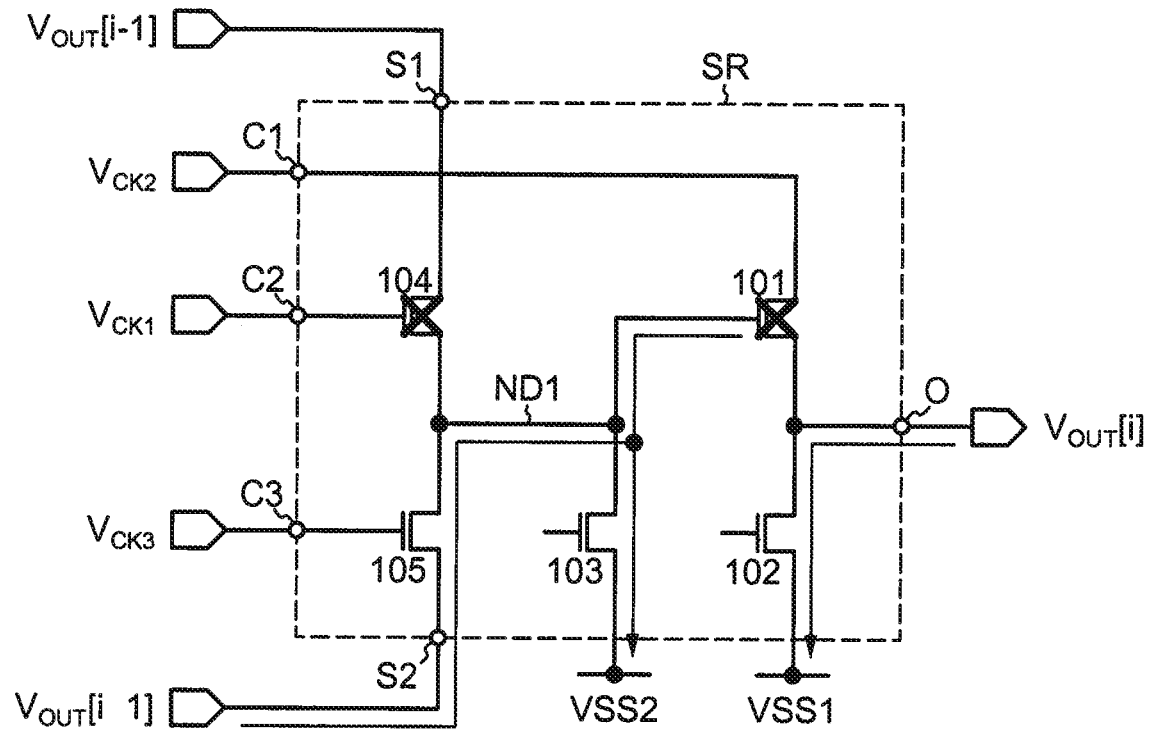
FIGS. 9A and 9B are schematic diagrams illustrating a device of one embodiment of the present invention.

An example of operation of the circuit SR in a period G is described. FIG. 9A is an example of a schematic diagram of the operation in the period G.

Since the signal (signal $V_{CK1}$) of the terminal C2 is at low level, the transistor 104 is kept off. The transistor 105 is turned on because the signal (signal $V_{CK3}$) of the terminal C3 is set at high level. The transistor 103 is kept on. Thus, the potential of the node ND1 is set to a low value because the signal (low-level signal $V_{OUT}[i+1]$) of the terminal S2 and the potential of the wiring VSS2 are supplied to the node ND1.

Since the potential of the node ND1 has the low value, the transistor 101 is kept off. The transistor 102 is kept on. Thus, the signal (signal $V_{OUT}[i]$) of the terminal O is at low level because the potential of the wiring VSS1 is supplied to the terminal O.

In the period G, the wiring VSS2 and the terminal S2 are brought into electrical conduction through the transistor 103 and the transistor 105. Thus, noise of the wiring OUT[i+1] can be reduced because the potential of the wiring VSS2 is supplied to the wiring OUT[i+1].

Note that in the period G, the transistor 102 may be off. In that case, the signal (signal $V_{OUT}[i]$) of the terminal O is maintained at low level because the terminal O is set in the floating state.

Note that in the period G, the transistor 103 may be off.

Figure 9B:
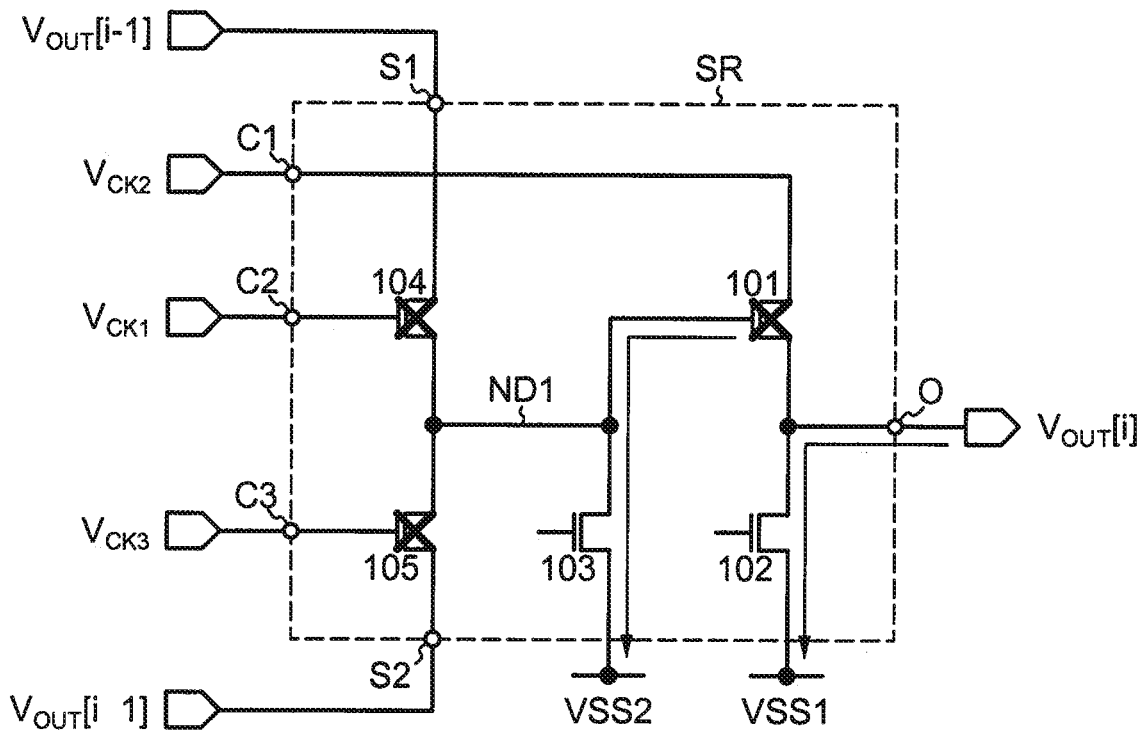

An example of operation of the circuit SR in a period H is described. FIG. 9B is an example of a schematic diagram of the operation in the period H.

Since the signal (signal $V_{CK1}$) of the terminal C2 is at low level, the transistor 104 is kept off. The transistor 105 is turned off because the signal (signal $V_{CK3}$) of the terminal C3 is set at low level. The transistor 103 is kept on. Thus, the potential of the node ND1 is set to a low value because the potential of the wiring VSS2 is supplied to the node ND1.

Since the potential of the node ND1 has the low value, the transistor 101 is kept off. The transistor 102 is kept on. Thus, the signal (signal $V_{OUT}[i]$) of the terminal O is at low level because the potential of the wiring VSS1 is supplied to the terminal O.

Note that in the period H, the transistor 102 may be off. In that case, the signal (signal $V_{OUT}[i]$) of the terminal O is maintained at low level because the terminal O is set in the floating state.

Note that in the period H, the transistor 103 may be off. In that case, the potential of the node ND1 is maintained at the low value because the node ND1 is set in the floating state.

Next, an example of operation in the case where a signal delayed from a signal of the terminal S2 is output from the terminal O is described with reference to FIG. 10. A timing chart in FIG. 10 is different from the timing chart in FIG. 5 in that the signal (signal $V_{OUT}[i-1]$) of the terminal S1 is set at high level in the period C and the signal (signal $V_{OUT}[i+1]$) of the terminal S2 is set at high level in the period A. Furthermore, the timing chart in FIG. 10 is different from the timing chart in FIG. 5 in that the signal (signal $V_{CK1}$) of the terminal C2 is set at high level in the period C and the period G and the signal (signal $V_{CK3}$) of the terminal C3 is set at high level in the period A and the period E. Note that the description of the operation that is the same as the operation in the case where a signal delayed from a signal of the terminal S1 is output from the terminal O is not repeated.

An example of operation of the circuit SR in a period A is described.

The transistor 104 is turned off because the signal (signal $V_{CK1}$) of the terminal C2 is set at low level. The transistor 105 is turned on because the signal (signal $V_{CK3}$) of the terminal C3 is set at high level. The transistor 103 is turned off. Thus, the potential of the node ND1 is increased because the signal (high-level signal $V_{OUT}[i+1]$) of the terminal S2 is supplied to the node ND1. After that, when the potential of the node ND1 becomes equal or substantially equal to a value obtained by subtracting the threshold voltage of the transistor 105 from the potential of the gate of the transistor 105 (signal (high-level signal $V_{CK3}$) of the terminal C3), the transistor 105 is turned off. Thus, the node ND1 is set in the floating state.

The transistor 101 is turned on because the potential of the node ND1 is set to a high value. The transistor 102 is turned on. Thus, the signal (signal $V_{OUT}[i]$) of the terminal O is set at low level because the signal (low-level signal $V_{CK2}$) of the terminal C1 and the potential of the wiring VSS1 are supplied to the terminal O.

Note that in the period A, the transistor 102 may be off.

The operation of the circuit SR in the period B is similar to the operation in the period B in the case where the signal delayed from the signal of the terminal S1 is output from the terminal O.

An example of operation of the circuit SR in a period C is described.

The transistor 104 is turned on because the signal (signal $V_{CK1}$) of the terminal C2 is set at high level. Since the signal (signal $V_{CK3}$) of the terminal C3 is at low level, the transistor 105 is kept off. The transistor 103 is kept off. Thus, the potential of the node ND1 is increased because the signal (high-level signal $V_{OUT}[i-1]$) of the terminal S1 is supplied to the node ND1. After that, when the potential of the node ND1 becomes equal or substantially equal to a value obtained by subtracting the threshold voltage of the transistor 104 from the potential of the gate of the transistor 104 (signal (high-level signal $V_{CK1}$) of the terminal C2), the transistor 104 is turned off. Thus, the node ND1 is set in the floating state.

Since the potential of the node ND1 has the high value, the transistor 101 is kept on. The transistor 102 is turned on. Thus, the signal (signal $V_{OUT}[i]$) of the terminal O is set at low level because the signal (low-level signal $V_{CK2}$) of the terminal C1 and the potential of the wiring VSS1 are supplied to the terminal O.

Note that when the potential of the terminal O is decreased by supplying the signal (low-level signal $V_{CK2}$) of the terminal C1 and the potential of the wiring VSS1 to the terminal O, the potential of the node ND1 is also decreased. As described above, the transistor 104 is turned on in the case where the potential of the node ND1 is lower than a value obtained by subtracting the threshold voltage of the transistor 104 from the potential of the gate of the transistor 104 (signal (high-level signal $V_{CK1}$) of the terminal C2). The transistor 104 is not turned on in the case where the potential of the node ND1 is higher than the value obtained by subtracting the threshold voltage of the transistor 104 from the potential of the gate of the transistor 104 (signal (high-level signal $V_{CK1}$) of the terminal C2).

Note that in the period C, the transistor 102 may be off.

The operation of the circuit SR in the period D is similar to the operation in the period D in the case where the signal delayed from the signal of the terminal S1 is output from the terminal O.

The operation of the circuit SR in the period E is similar to the operation in the period G in the case where the signal delayed from the signal of the terminal S1 is output from the terminal O.

The operation of the circuit SR in the period F is similar to the operation in the period F or H in the case where the signal delayed from the signal of the terminal S is output from the terminal O.

The operation of the circuit SR in the period G is similar to the operation in the period E in the case where the signal delayed from the signal of the terminal S1 is output from the terminal O.

The operation of the circuit SR in the period H is similar to the operation in the period F or H in the case where the signal delayed from the signal of the terminal S1 is output from the terminal O.

Next, a preferred example of the device of one embodiment of the present invention is described.

The transistors 101 to 105 preferably have the same polarity. That is, the transistors 101 to 105 are preferably n-channel transistors. Alternatively, the transistors 101 to 105 are preferably p-channel transistors. Thus, manufacturing steps can be simplified, which enables improvement in yield and/or a reduction in costs. In particular, in the case where the transistors 101 to 105 are n-channel transistors, a transistor including an oxide semiconductor in a channel formation region (also referred to as an OS transistor) can be used as each of the transistors 101 to 105. The OS transistor has higher mobility than a transistor including amorphous silicon in a channel formation region, and has an extremely low off-state current. Therefore, the transistors 101 to 105 can be downsized.

A first conductor (also referred to as a conductive film or a conductive layer) includes a region serving as a first terminal (one of a source electrode and a drain electrode) on the terminal C1 side of the transistor 101. A second conductor includes a region serving as a second terminal (the other of the source electrode and the drain electrode) on the terminal O side of the transistor 101. A third conductor includes a region serving as a gate (gate electrode) of the transistor 101. The third conductor includes a first region overlapping with the first conductor and a second region overlapping with the second conductor. In that case, the area of the second region is preferably larger than the area of the first region. Thus, the capacitance between the second terminal and the gate of the transistor 101 can be large, which can increase the amount of rise in the potential of the node ND1 in the period B.

Note that the first region may be an area where the third conductor and the first conductor overlap with each other without a semiconductor layer interposed therebetween, and the second region may be an area where the third conductor and the second conductor overlap with each other without a semiconductor layer interposed therebetween. The semiconductor layer includes the channel formation region of the transistor 101.

Note that W (channel width)/L (channel length) of the transistor 101 is preferably higher than W/L of the transistor 102. Furthermore, W/L of the transistor 101 is preferably higher than W/L of the transistor 103. Furthermore, W/L of the transistor 101 is preferably higher than W/L of the transistor 104. Furthermore, W/L of the transistor 101 is preferably higher than W/L of the transistor 105. That is, the transistor 101 preferably has the highest W/L among the transistors 101 to 105. Thus, the current supply capability of the transistor 101 can be increased, so that the rise time and fall time of the signal of the terminal O can be shortened.

In the case where the transistor is formed using a plurality of transistors, W/L of the transistor is a value of the sum of W/L of the plurality of transistors. For example, in the case where the plurality of transistors are connected in parallel, W is the sum of W of the plurality of transistors and L is the average value of L of the plurality of transistors.

Note that W/L of the transistor 104 is preferably equal or substantially equal to W/L of the transistor 105. The phrase "W/L of the transistor 104 is substantially equal to W/L of the transistor 105" means that W/L of the transistor 104 is 0.8 to 1.2 times W/L of the transistor 105. More preferably, W/L of the transistor 104 is 0.9 to 1.1 times W/L of the transistor 105. Thus, the same operation can be performed in the circuit SR even in the case where the signal of the terminal S1 is shifted or the case where the signal of the terminal S2 is shifted.

Here, the configuration of the circuit SR is not limited to the configuration exemplified in FIG. 4. Modification examples of the circuit SR exemplified in FIG. 4 are described. Note that components in common with those in FIG. 4 are denoted by the same reference numerals, and description thereof is omitted.

Figure 11A:
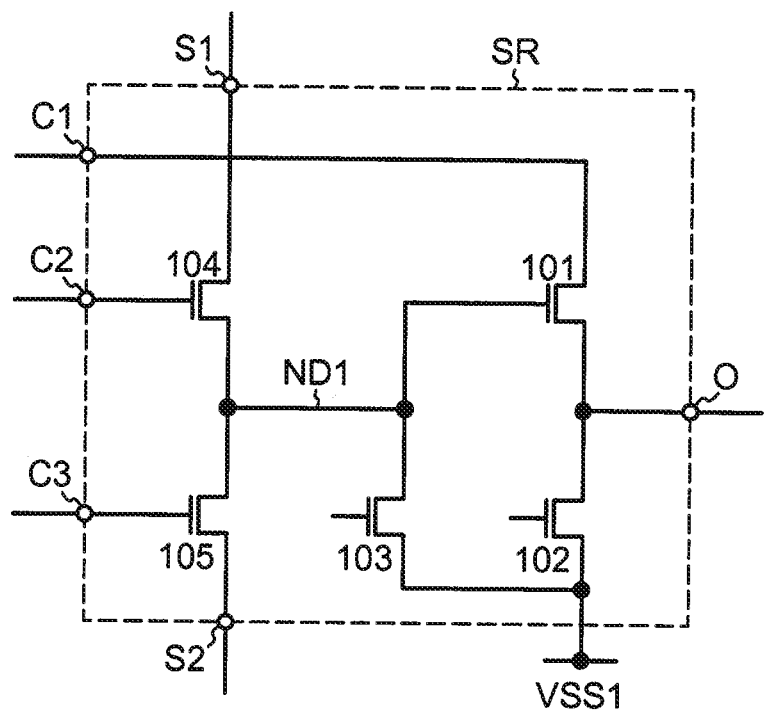
FIGS. 11A and 11B are circuit diagrams each illustrating a device of one embodiment of the present invention.
Figure 11B:
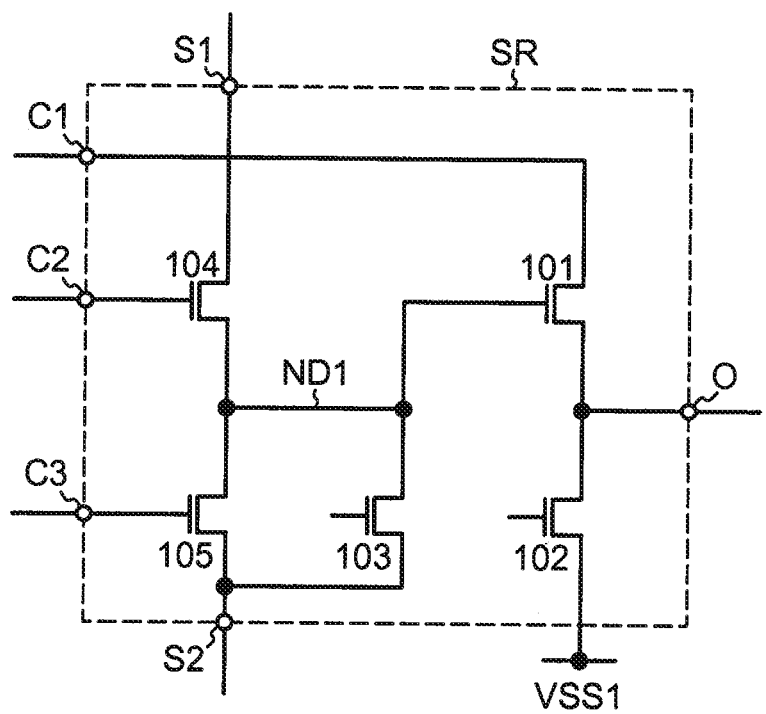
Figure 12A:
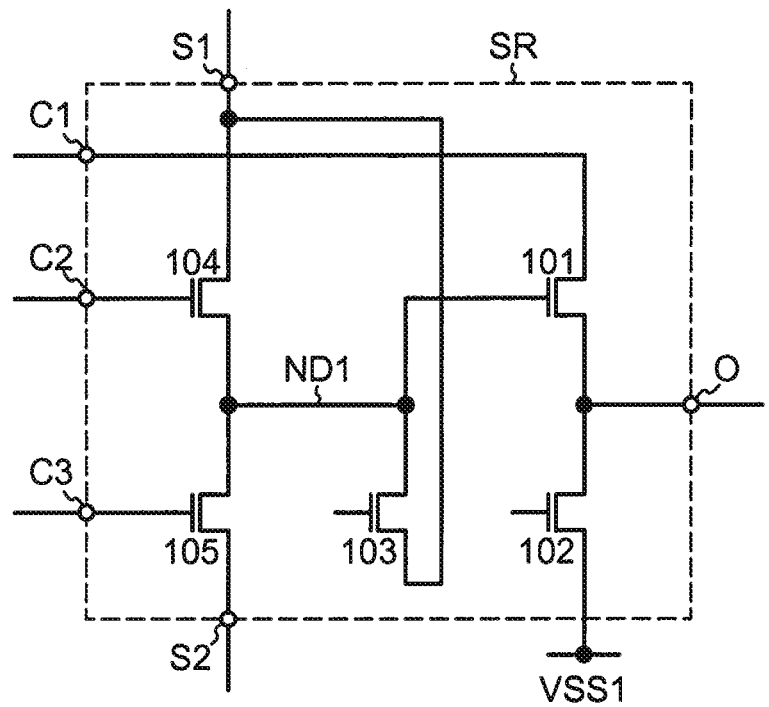
FIGS. 12A and 12B are circuit diagrams each illustrating a device of one embodiment of the present invention.

In the circuit SR in this embodiment that is described with or without reference to FIG. 4 or the like, the first terminal of the transistor 103 may be connected to the wiring VSS1, the terminal S1, the terminal S2, the terminal C1, the terminal C2, the terminal C3, the terminal C4, the terminal S3, the terminal S4, or the terminal O. The terminal C4, the terminal S3, and the terminal S4 are described later. FIG. 11A illustrates a configuration example where the first terminal of the transistor 103 is connected to the wiring VSS1 in FIG. 4. FIG. 11B illustrates a configuration example where the first terminal of the transistor 103 is connected to the terminal S2 in FIG. 4. FIG. 12A illustrates a configuration example where the first terminal of the transistor 103 is connected to the terminal S1 in FIG. 4.

Figure 12B:
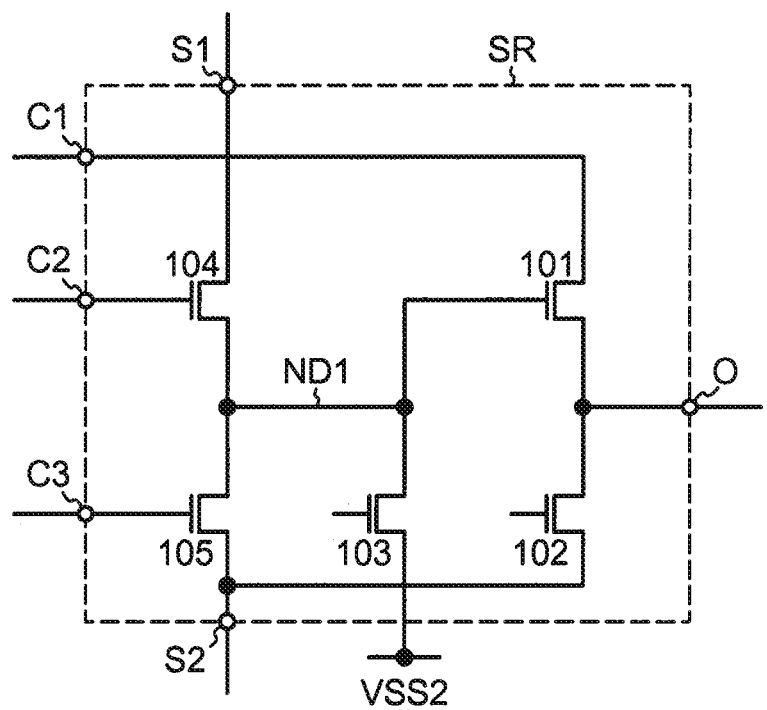
Figure 13A:
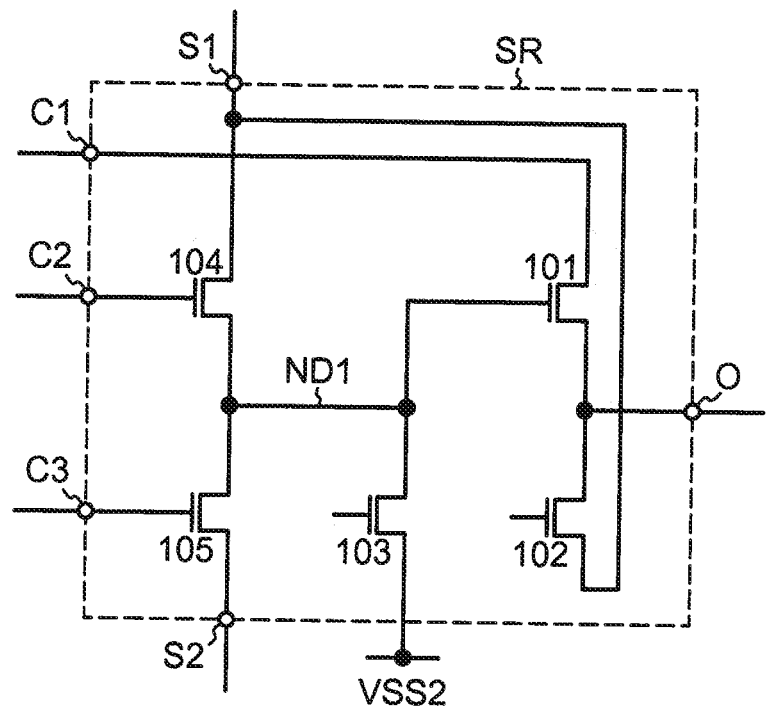
FIGS. 13A and 13B are circuit diagrams each illustrating a device of one embodiment of the present invention.

In the circuit SR in this embodiment that is described with or without reference to FIG. 4, FIG. 11A, FIG. 11B, FIG. 12A, or the like, the first terminal of the transistor 104 may be connected to the wiring VSS2, the terminal S1, the terminal S2, the terminal C1, the terminal C2, the terminal C3, the terminal C4, the terminal S3, or the terminal S4. FIG. 12B illustrates a configuration example where the first terminal of the transistor 102 is connected to the terminal S2 in FIG. 4. FIG. 13A illustrates a configuration example where the first terminal of the transistor 102 is connected to the terminal S1 in FIG. 4.

Figure 13B:
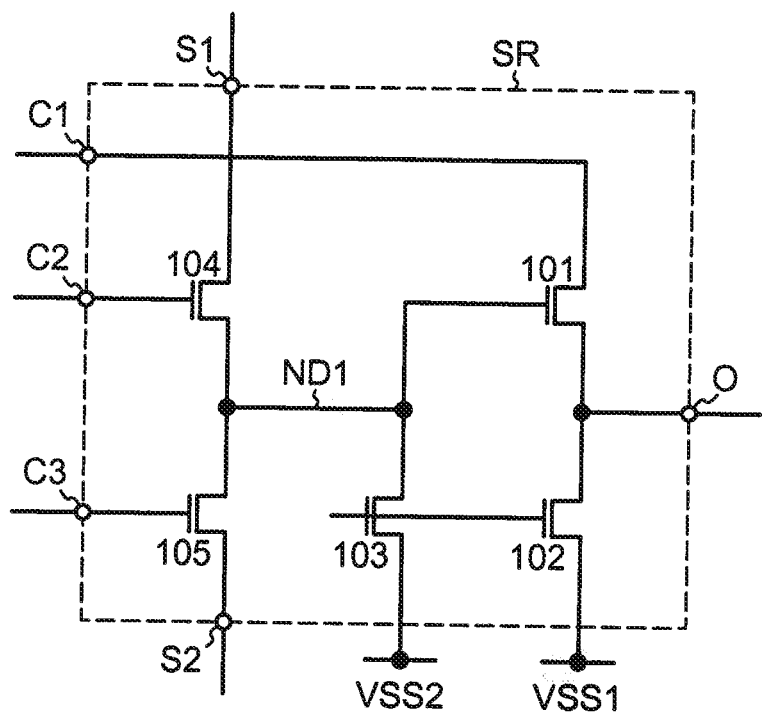

In the circuit SR in this embodiment that is described with or without reference to FIG. 4, FIG. 11A, FIG. 11B, FIG. 12A, FIG. 12B, FIG. 13A, or the like, the gate of the transistor 102 may be connected to the gate of the transistor 103. FIG. 13B illustrates a configuration example where the gate of the transistor 102 is connected to the gate of the transistor 103 in FIG. 4.

Figure 14A:
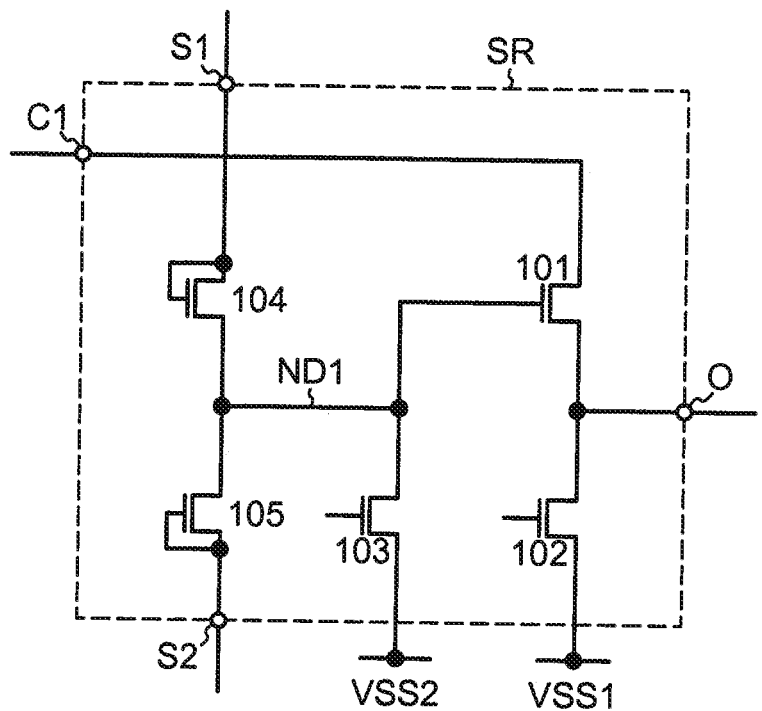
FIGS. 14A and 14B are circuit diagrams each illustrating a device of one embodiment of the present invention.
Figure 14B:
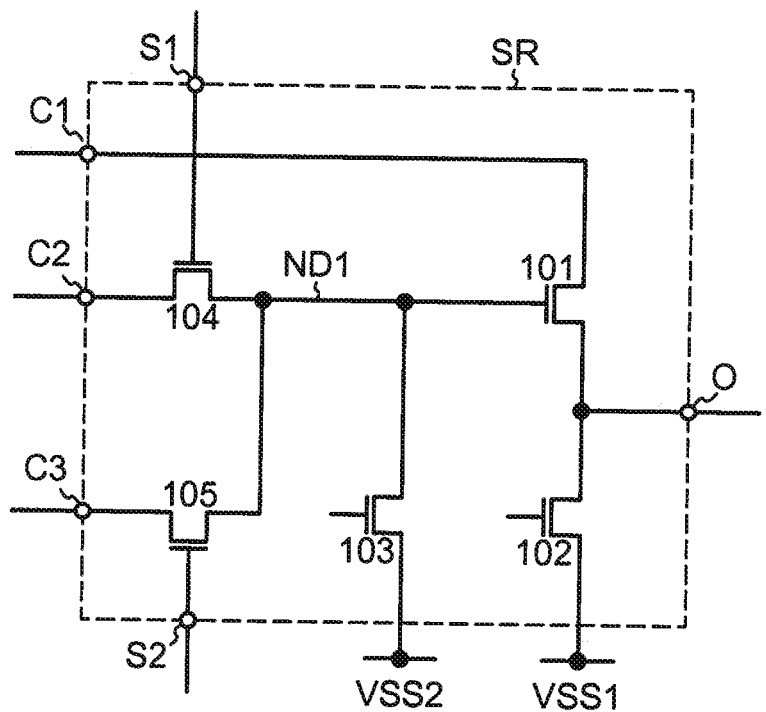

In the circuit SR in this embodiment that is described with or without reference to FIG. 4, FIG. 11A, FIG. 11B, FIG. 12A, FIG. 12B, FIG. 13A, FIG. 13B, or the like, one of the first terminal and the gate of the transistor 104 is connected to the terminal S1. One of the first terminal and the gate of the transistor 105 is connected to the terminal S2. FIG. 14A illustrates a configuration example where the gate of the transistor 104 is connected to the terminal S1 and the gate of the transistor 105 is connected to the terminal S2 in FIG. 4. FIG. 14B illustrates a configuration example where the first terminal of the transistor 104 is connected to the terminal C2, the gate of the transistor 104 is connected to the terminal S1, the first terminal of the transistor 105 is connected to the terminal C3, and the gate of the transistor 105 is connected to the terminal S2 in FIG. 4.

Figure 15A:
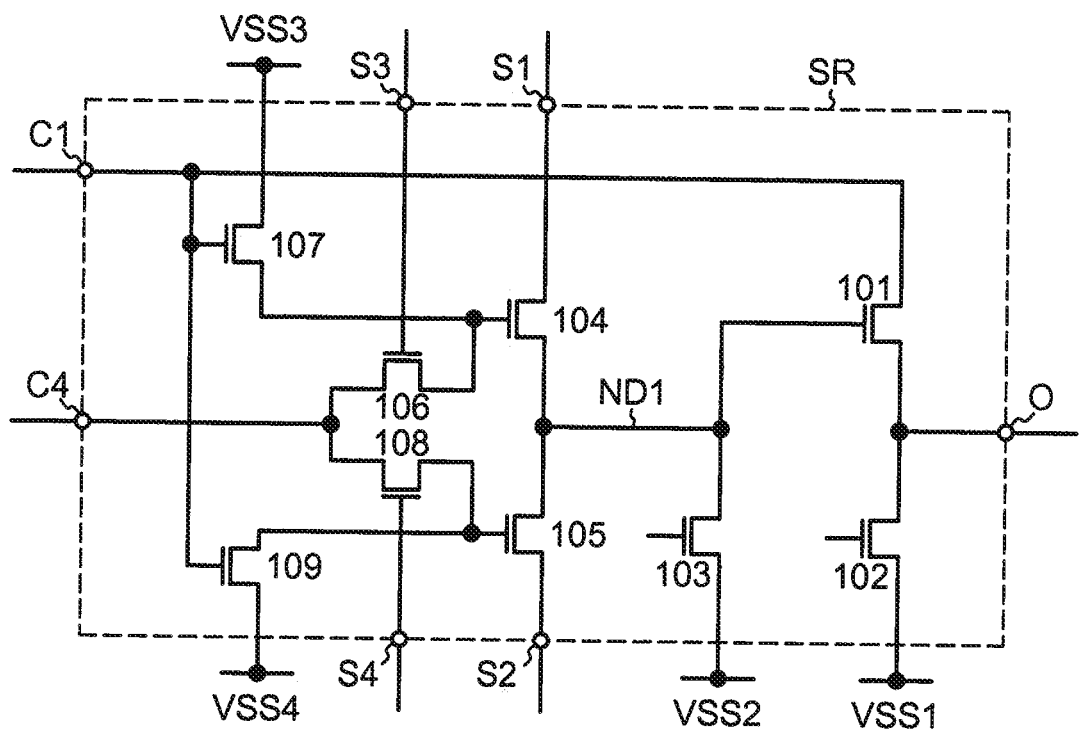
FIGS. 15A and 15B are circuit diagrams each illustrating a device of one embodiment of the present invention.

In the circuit SR in this embodiment that is described with or without reference to FIG. 4, FIG. 11A, FIG. 11B, FIG. 12A, FIG. 12B, FIG. 13A, FIG. 13B, or the like, a configuration for controlling the potential of the gate of the transistor 104 may be added. Furthermore, a configuration for controlling the potential of the gate of the transistor 105 may be added. FIG. 15A illustrates a configuration example where a transistor 106, a transistor 107, a transistor 108, and a transistor 109 are added in FIG. 4. A first terminal, a second terminal, and a gate of the transistor 106 are connected to the terminal C4, the gate of the transistor 104, and the terminal S3, respectively. A first terminal, a second terminal, and a gate of the transistor 107 are connected to the wiring VSS3, the gate of the transistor 104, and the terminal C1, respectively. A first terminal, a second terminal, and a gate of the transistor 108 are connected to the terminal C4, the gate of the transistor 105, and the terminal S4, respectively. A first terminal, a second terminal, and a gate of the transistor 109 are connected to the wiring VSS4, the gate of the transistor 105, and the terminal C1, respectively.

Each of the wiring VSS3 and the wiring VSS4 has a function of transmitting a signal, a potential, or a current. In other words, each of the wiring VSS3 and the wiring VSS4 has a function of a signal line, a power supply line, or a current supply line. For example, a potential is input to each of the wiring VSS3 and the wiring VSS4. The potential input to each of the wiring VSS3 and the wiring VSS4 is a potential corresponding to the low-level or high-level signal $V_{CK1}$, the low-level or high-level signal $V_{CK2}$, the low-level or high-level signal $V_{CK3}$, or the low-level or high-level signal $V_{CK4}$. In particular, when the transistor 104 and the transistor 105 are n-channel transistors, a potential corresponding to the low-level signal $V_{CK1}$, the low-level signal $V_{CK2}$, the low-level signal $V_{CK3}$, or the low-level signal $V_{CK4}$ is preferably input to each of the wiring VSS3 and the wiring VSS4. Furthermore, when the transistor 104 and the transistor 105 are p-channel transistors, a potential corresponding to the high-level signal $V_{CK1}$, the high-level signal $V_{CK2}$, the high-level signal $V_{CK3}$, or the high-level signal $V_{CK4}$ is preferably input to each of the wiring VSS3 and the wiring VSS4.

The terminal S3 is preferably connected to the wiring OUT[i−2]. The terminal S4 is preferably connected to the wiring OUT[i+2]. The terminal C4 is preferably connected to a corresponding wiring of the wirings CK1 to CK4. Specifically, the terminal C4 in the circuit SR[4m+1] is connected to the wiring CK3, the terminal C4 in the circuit SR[4m+2] is connected to the wiring CK4, the terminal C4 in the circuit SR[4m+3] is connected to the wiring CK1, and the terminal C4 in the circuit SR[4m+4] is connected to the wiring CK2. For example, the terminal C4 is connected to the wiring CK4 in the case where the terminal C1 is connected to the wiring CK2, the terminal C2 is connected to the wiring CK1, and the terminal C3 is connected to the wiring CK3.

An example of operation of the circuit SR exemplified in FIG. 15A is described. Note that an example of the operation in the case where a signal delayed from the signal of the terminal S1 is output from the terminal O is described.

An example of operation of the circuit SR in a period H immediately before a period A is described.

The transistor 106 is turned on because the signal (signal $V_{OUT}[i-2]$) of the terminal S3 is set at high level. The transistor 107 is turned off because the signal (signal $V_{CK2}$) of the terminal C1 is set at low level. Thus, the potential of the gate of the transistor 104 is increased because the signal (high-level signal $V_{CK4}$) of the terminal C4 is supplied to the gate of the transistor 104. When the potential of the gate of the transistor 104 becomes a value obtained by subtracting the threshold voltage of the transistor 106 from the potential of the gate of the transistor 106 (signal (high-level signal $V_{OUT}[i-2]$) of the terminal S3), the transistor 106 is turned off. Thus, the gate of the transistor 104 is set in the floating state.

The transistor 108 is turned off because the signal (signal $V_{OUT}[i+2]$) of the terminal S4 is set at low level. The transistor 109 is turned off because the signal (signal $V_{CK2}$) of the terminal C1 is set at low level. Thus, the gate of the transistor 105 is set in the floating state. In the case where the initial value of the potential of the gate of the transistor 105 is low, the potential of the gate of the transistor 105 is maintained at the low value.

The transistor 104 is turned on because the potential of the gate of the transistor 104 becomes a high value. Furthermore, the transistor 105 is turned off because the potential of the gate of the transistor 105 becomes a low value. Thus, the signal (low-level signal $V_{OUT}[i-1]$) of the terminal S1 is supplied to the node ND1.

An example of operation of the circuit SR in the period A is described.

The transistor 106 is turned off because the signal (signal $V_{OUT}[i-2]$) of the terminal S3 is set at low level. Since the signal (signal $V_{CK2}$) of the terminal C1 is at low level, the transistor 107 is kept off. Thus, the potential of the gate of the transistor 104 is maintained at the high value because the gate of the transistor 104 is set in the floating state.

Since the signal (signal $V_{OUT}[i+2]$) of the terminal S4 is at low level, the transistor 108 is kept off. Since the signal (signal $V_{CK2}$) of the terminal C1 is at low level, the transistor 109 is kept off. Thus, the potential of the gate of the transistor 105 is maintained at the low value because the gate of the transistor 105 is in the floating state.

Since the potential of the gate of the transistor 104 has the high value, the transistor 104 is kept on. Furthermore, since the potential of the gate of the transistor 105 has the low value, the transistor 105 is kept off. Thus, the signal (high-level signal $V_{OUT}[i-1]$) of the terminal S1 is supplied to the node ND1, so that the potential of the node ND1 is increased. The potential difference between the gate and the second terminal of the transistor 104 is maintained by parasitic capacitance between the gate and the second terminal of the transistor 104, and the gate of the transistor 104 is in the floating state. Thus, as the potential of the node ND1 is increased, the potential of the gate of the transistor 104 is also increased. In the case where the potential of the gate of the transistor 104 is higher than the sum of the potential of the first terminal of the transistor 104 (signal (high-level signal $V_{OUT}[i-1]$) of the terminal S1) and the threshold voltage of the transistor 104, the potential of the node ND1 is increased to the same level as the high-level signal $V_{OUT}[i-1]$. Since the potential difference between the gate and the second terminal of the transistor 104 can be large as described above, the drain current of the transistor 104 can be increased. Thus, the rise time of the potential of the node ND1 can be shortened. Alternatively, the transistor 104 can be downsized, which enables a reduction in layout.

An example of operation of the circuit SR in a period B is described.

Since the signal (signal $V_{OUT}[i-2]$) of the terminal S3 is at low level, the transistor 106 is kept off. The transistor 107 is turned on because the signal (signal $V_{CK2}$) of the terminal C1 is act at high level. Thus, the potential of the gate of the transistor 104 is decreased because the potential of the wiring VSS3 is supplied to the gate of the transistor 104.

Since the signal (signal $V_{OUT}[i+2]$) of the terminal S4 is at low level, the transistor 108 is kept off. The transistor 109 is turned on because the signal (signal $V_{CK2}$) of the terminal C1 is set at high level. Thus, the potential of the gate of the transistor 105 has the low value because the potential of the wiring VSS4 is supplied to the gate of the transistor 105.

The transistor 104 is turned off because the potential of the gate of the transistor 104 becomes a low value. Since the potential of the gate of the transistor 105 has the low value, the transistor 105 is kept off.

An example of operation of the circuit SR in a period C is described.

Since the signal (signal $V_{OUT}[i-2]$) of the terminal S3 is at low level, the transistor 106 is kept off. The transistor 107 is turned off because the signal (signal $V_{CK2}$) of the terminal C1 is set at low level. Thus, the potential of the gate of the transistor 104 is maintained at the low value because the gate of the transistor 104 is set in the floating state.

Since the signal (signal $V_{OUT}[i+2]$) of the terminal S4 is at low level, the transistor 108 is kept off. The transistor 109 is turned off because the signal (signal $V_{CK2}$) of the terminal C1 is set at low level. Thus, the potential of the gate of the transistor 105 is maintained at the low value because the gate of the transistor 105 is set in the floating state.

Since the potential of the gate of the transistor 104 has the low value, the transistor 104 is kept off. Since the potential of the gate of the transistor 105 has the low value, the transistor 105 is kept off.

An example of operation of the circuit SR in a period D is described.

Since the signal (signal $V_{OUT}[i-2]$) of the terminal S3 is at low level, the transistor 106 is kept off. Since the signal (signal $V_{CK2}$) of the terminal C1 is at low level, the transistor 107 is kept off. Thus, the potential of the gate of the transistor 104 is maintained at the low value because the gate of the transistor 104 is set in the floating state.

The transistor 108 is turned on because the signal (signal $V_{OUT}[i+2]$) of the terminal S4 is set at high level. Since the signal (signal $V_{CK2}$) of the terminal C1 is at low level, the transistor 109 is kept off. Thus, the potential of the gate of the transistor 105 is increased because the signal (high-level signal $V_{CK4}$) of the terminal C4 is supplied to the gate of the transistor 105.

Since the potential of the gate of the transistor 104 has the low value, the transistor 104 is kept off. The transistor 105 is turned on because the potential of the gate of the transistor 105 becomes a high value. Thus, the signal (low-level signal $V_{OUT}[+1]$) of the terminal S2 is supplied to the node ND1.

An example of operation in a period E immediately after the period D is described.

Since the signal (signal $V_{OUT}[i-2]$) of the terminal S3 is at low level, the transistor 106 is kept off. Since the signal (signal $V_{CK2}$) of the terminal C1 is at low level, the transistor 107 is kept off. Thus, since the gate of the transistor 104 is in the floating state, the potential of the gate of the transistor 104 is maintained at the low value.

The transistor 108 is turned off because the signal (signal $V_{OUT}[i+2]$) of the terminal S4 is set at low level. Since the signal (signal $V_{CK2}$) of the terminal C1 is at low level, the transistor 109 is kept off. Thus, the potential of the gate of the transistor 105 is maintained at the high value because the gate of the transistor 105 is set in the floating state.

Since the potential of the gate of the transistor 104 has the low value, the transistor 104 is kept off. Since the potential of the gate of the transistor 105 has the high value, the transistor 105 is kept on. Thus, the signal (low-level signal $V_{OUT}[i+1]$) of the terminal S2 is supplied to the node ND1.

The operation in the period E except immediately after the period D is similar to the operation in the period C.

The operation in the period F is similar to the operation in the period B.

The operation in the period G is similar to the operation in the period C.

The operation in the period H except immediately before the period A is similar to the operation in the period C.

Figure 15B:
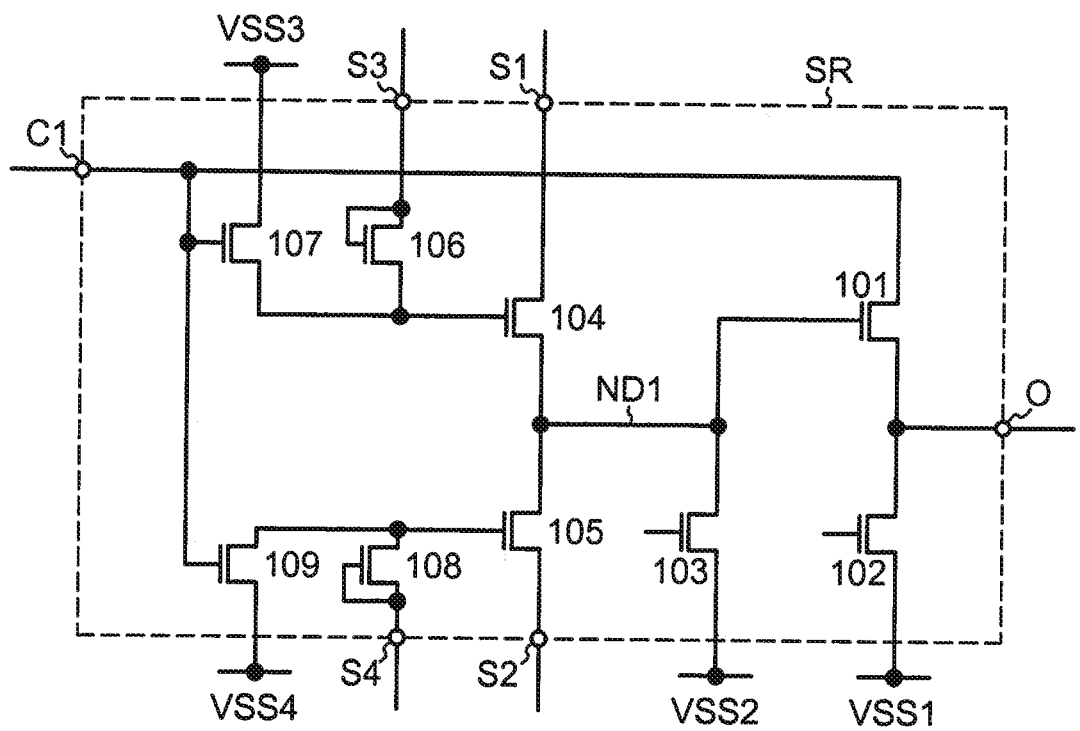
Figure 16A:
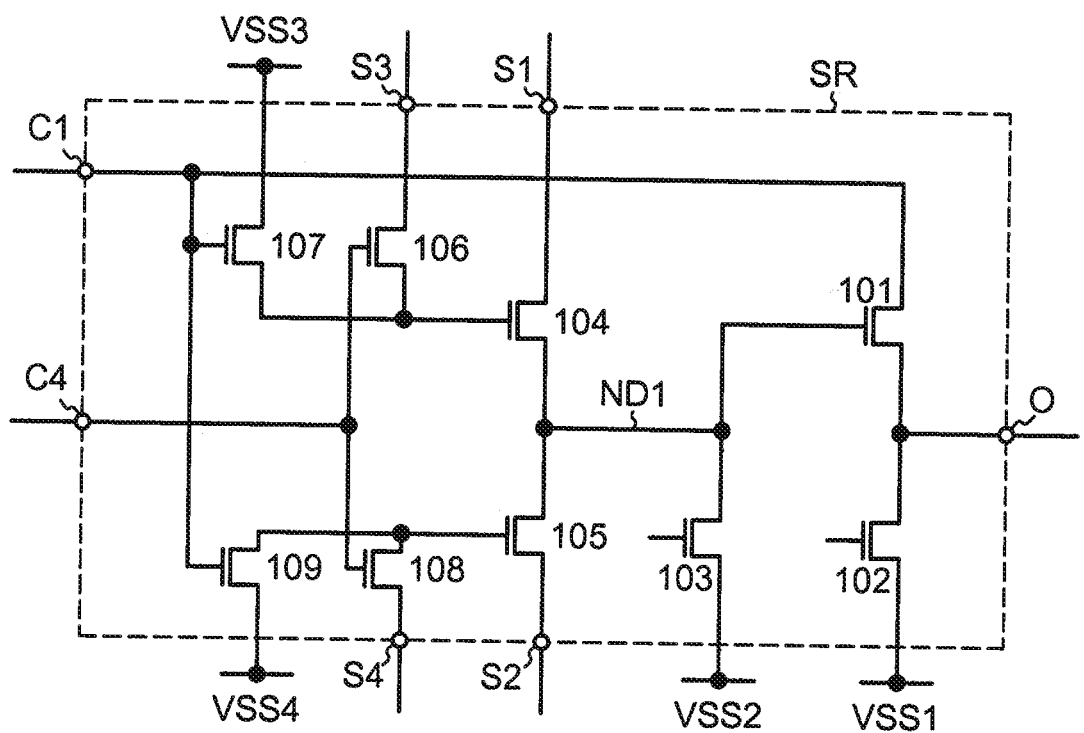
FIGS. 16A and 16B are circuit diagrams each illustrating a device of one embodiment of the present invention.

Note that at least one of the first terminal and the gate of the transistor 106 is connected to the terminal S3. At least one of the first terminal and the gate of the transistor 108 is connected to the terminal 84. FIG. 15B illustrates a configuration example where the first terminal of the transistor 106 is connected to the terminal S3 and the first terminal of the transistor 108 is connected to the terminal S4 in FIG. 15A. FIG. 16A illustrates a configuration example where the first terminal of the transistor 106 is connected to the terminal S3, the gate of the transistor 106 is connected to the terminal C4, the first terminal of the transistor 108 is connected to the terminal S4, and the gate of the transistor 108 is connected to the terminal C4 in FIG. 4.

Figure 16B:
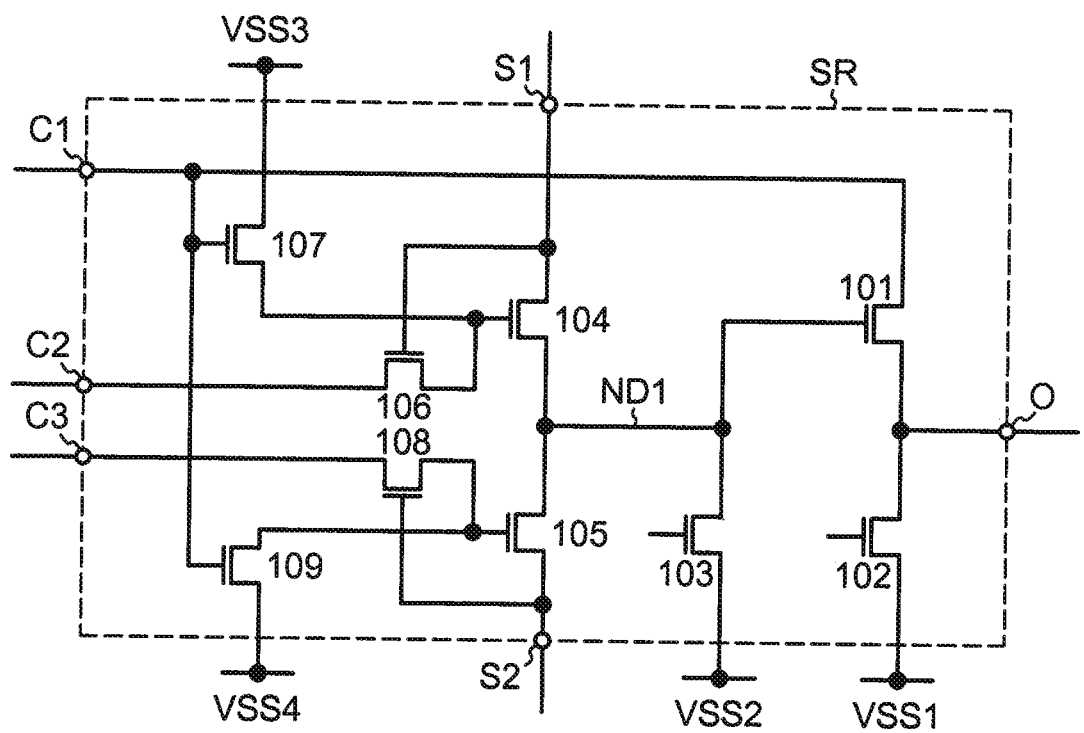
Figure 17A:
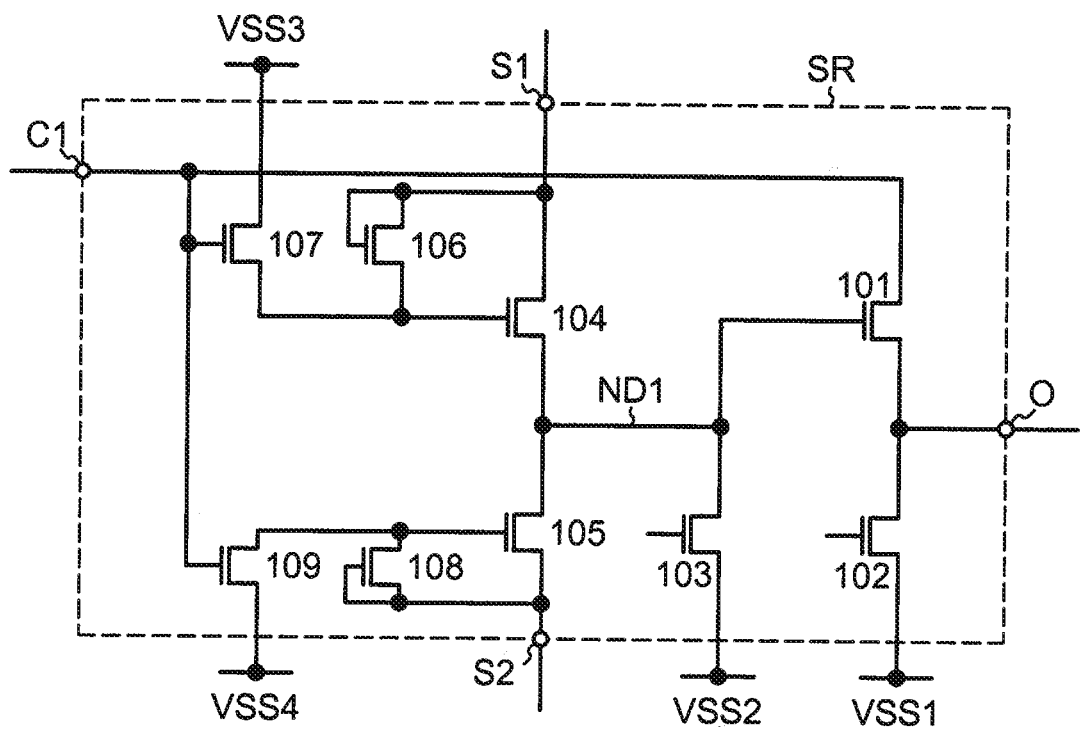
FIGS. 17A and 17B are circuit diagrams each illustrating a device of one embodiment of the present invention.
Figure 17B:
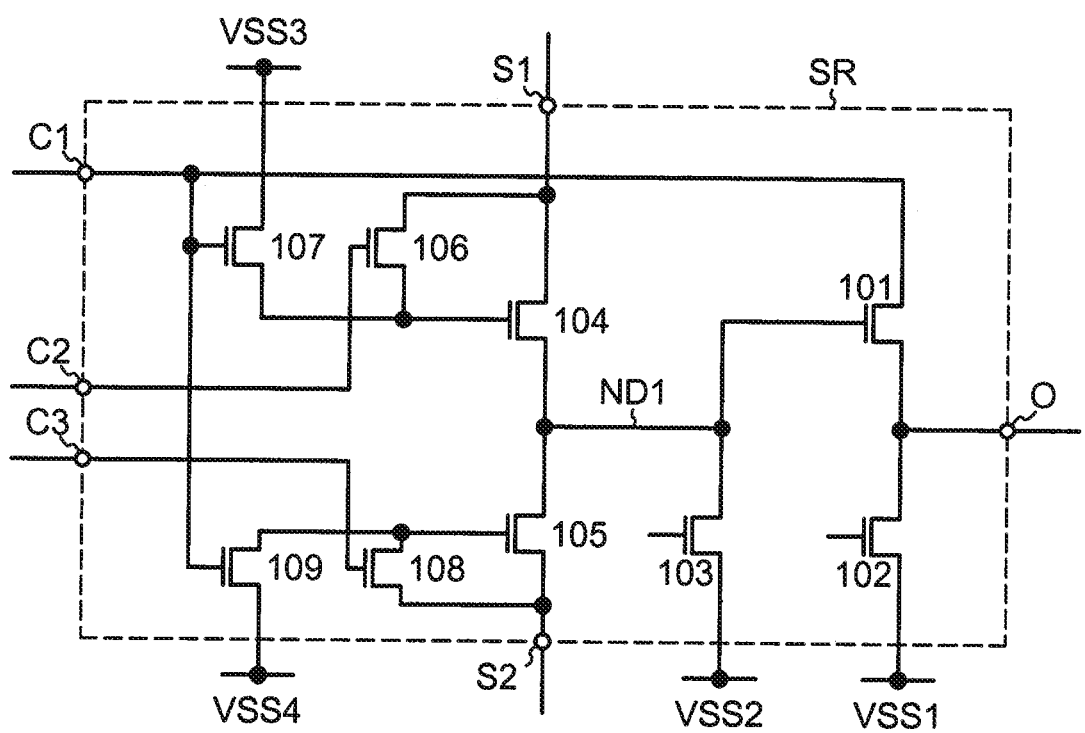

Note that at least one of the first terminal and the gate of the transistor 106 may be connected to the terminal S1. At least one of the first terminal and the gate of the transistor 108 may be connected to the terminal S2. FIG. 16B illustrates a configuration example where the first terminal of the transistor 106 is connected to the terminal C2, the gate of the transistor 106 is connected to the terminal S1, the first terminal of the transistor 108 is connected to the terminal C3, and the gate of the transistor 108 is connected to the terminal S2 in FIG. 15A. FIG. 17A illustrates a configuration example where the first terminal of the transistor 106 is connected to the terminal S1, the gate of the transistor 106 is connected to the terminal S1, the first terminal of the transistor 108 is connected to the terminal S2, and the gate of the transistor 108 is connected to the terminal S2 in FIG. 15A. FIG. 17B illustrates a configuration example where the first terminal of the transistor 106 is connected to the terminal S1, the gate of the transistor 106 is connected to the terminal C2, the first terminal of the transistor 108 is connected to the terminal S2, and the gate of the transistor 108 is connected to the terminal C3 in FIG. 15A.

Figure 18A:
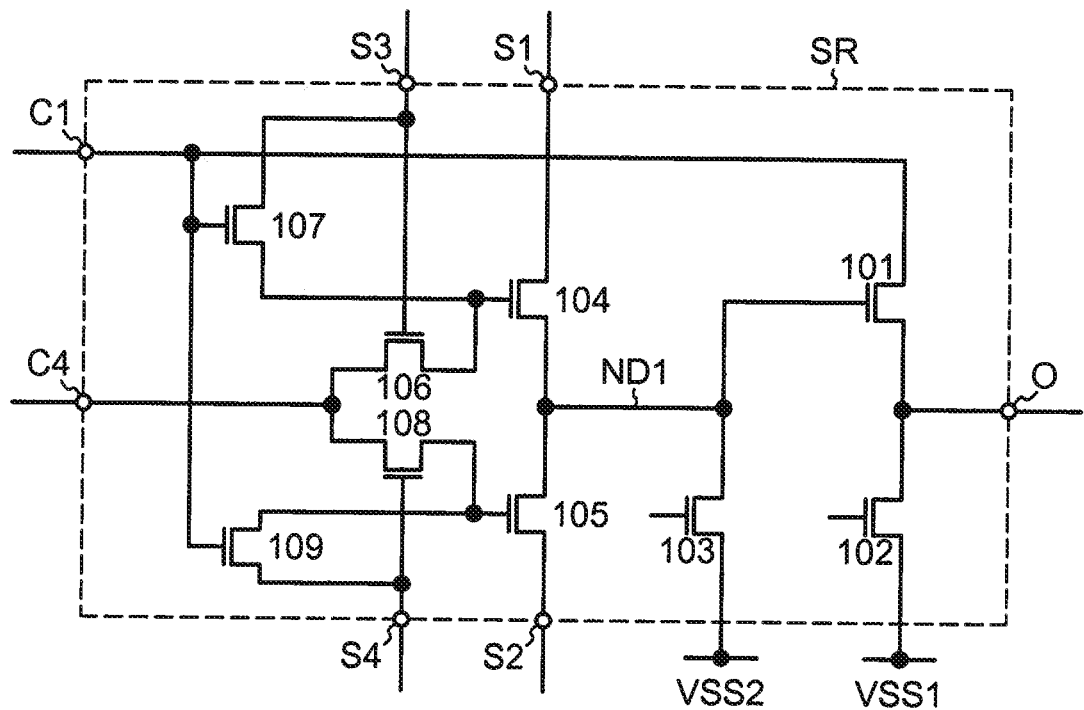
FIGS. 18A and 18B are circuit diagrams each illustrating a device of one embodiment of the present invention.
Figure 18B:
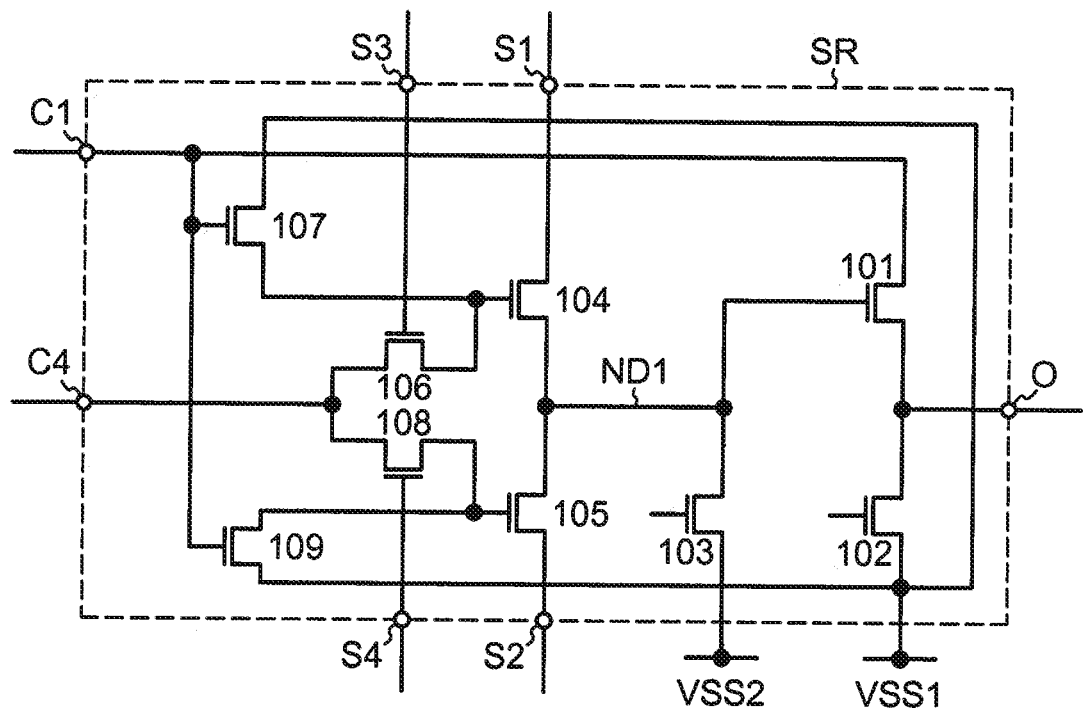

Note that the first terminal of the transistor 107 may be connected to the wiring VSS1, the wiring VSS2, the wiring VSS4, the terminal S1, the terminal S2, the terminal S3, the terminal S4, the terminal C2, the terminal C3, or the terminal C4. Furthermore, the first terminal of the transistor 109 may be connected to the wiring VSS1, the wiring VSS2, the wiring VSS3, the terminal S1, the terminal S2, the terminal S3, the terminal S4, the terminal C2, the terminal C3, or the terminal C4. FIG. 18A illustrates a configuration example where the first terminal of the transistor 107 is connected to the terminal S3 and the first terminal of the transistor 109 is connected to the terminal S4 in FIG. 15A. FIG. 18B illustrates a configuration example where the first terminal of the transistor 107 is connected to the wiring VSS1 and the first terminal of the transistor 109 is connected to the wiring VSS1 in FIG. 15A.

Note that W/L of the transistor 106 is preferably equal or substantially equal to W/L of the transistor 108. The phrase "W/L of the transistor 106 is substantially equal to W/L of the transistor 108" means that W/L of the transistor 106 is 0.8 to 1.2 times W/L of the transistor 108. More preferably, W/L of the transistor 106 is 0.9 to 1.1 times W/L of the transistor 108.

Note that W/L of the transistor 107 is preferably equal or substantially equal to W/L of the transistor 109. The phrase "W/L of the transistor 107 is substantially equal to W/L of the transistor 109" means that W/L of the transistor 107 is 0.8 to 1.2 times W/L of the transistor 109. More preferably, W/L of the transistor 107 is 0.9 to 1.1 times W/L of the transistor 109.

Note that the transistors 106 to 109 preferably have the same polarity as the transistor 101.

Figure 19A:
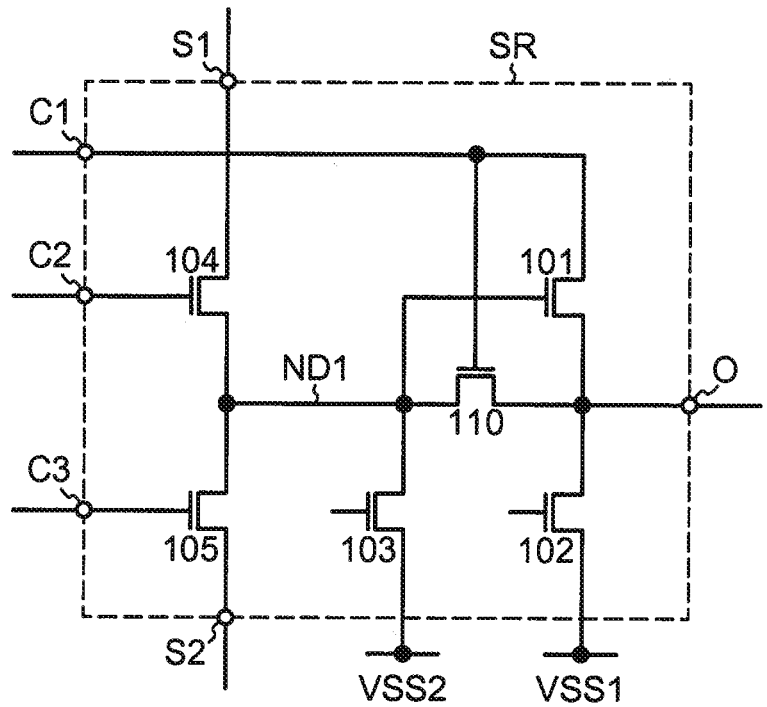
FIGS. 19A and 19B are circuit diagrams each illustrating a device of one embodiment of the present invention.

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, or the like, a transistor may be added between the terminal O and the node ND1. FIG. 19A illustrates a configuration example where a transistor 110 is added in FIG. 4. A first terminal, a second terminal, and a gate of the transistor 110 are connected to the terminal O, the node ND1, and the terminal C1, respectively.

Note that the transistor 110 preferably has the same polarity as the transistor 101.

Figure 19B:
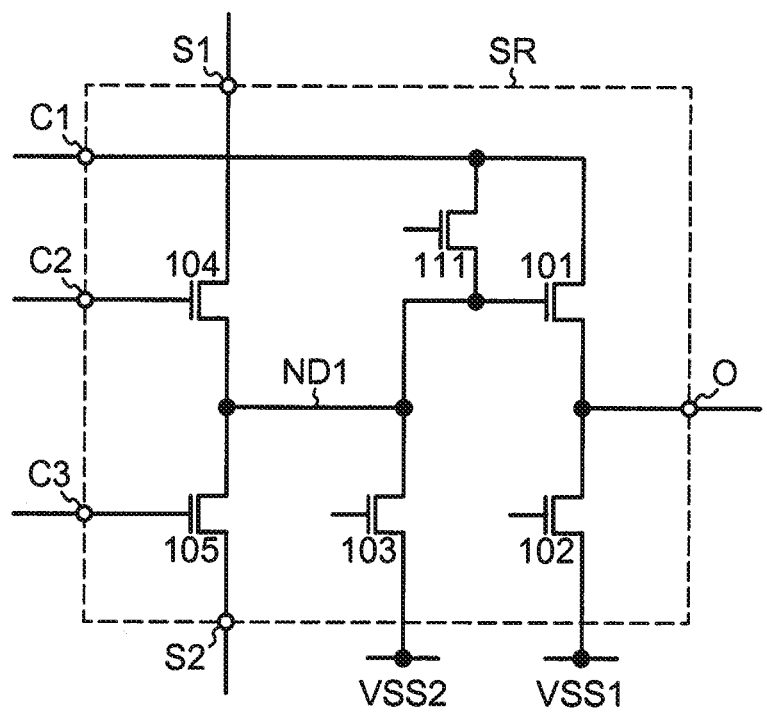

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, or the like, a transistor may be added between the terminal C1 and the node ND1. FIG. 19B illustrates a configuration example where a transistor 111 is added in FIG. 4. A first terminal and a second terminal of the transistor 111 are connected to the terminal C1 and the node ND1, respectively.

Note that the transistor 111 preferably has the same polarity as the transistor 101.

On/off of the transistor 111 may be controlled with a signal input to the gate of the transistor 111.

Note that the gate of the transistor 111 may be connected to the gate of the transistor 102. Alternatively, the gate of the transistor 111 may be connected to the gate of the transistor 103. Alternatively, the gate of the transistor 111 may be connected to the gate of the transistor 102 and the gate of the transistor 103.

Figure 20A:
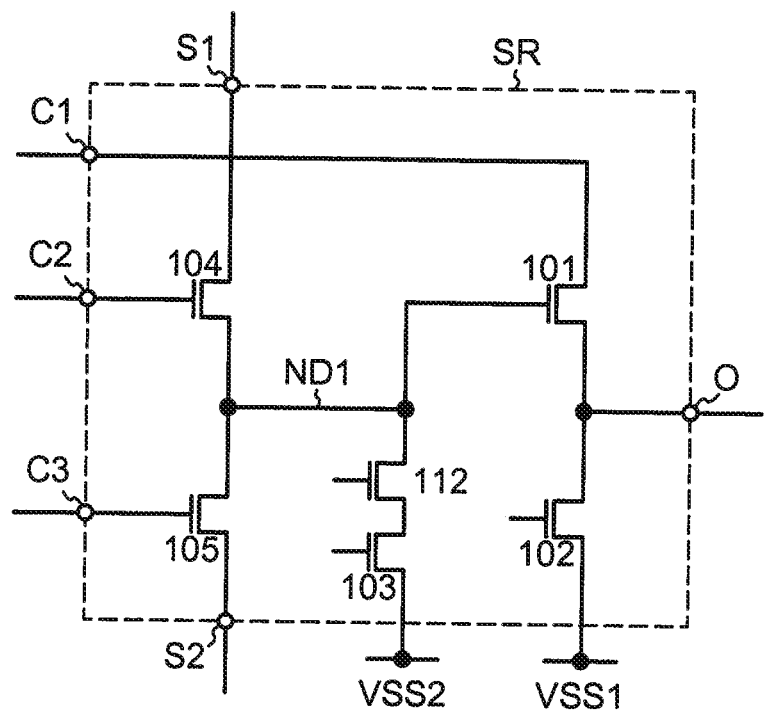
FIGS. 20A and 20B are circuit diagrams each illustrating a device of one embodiment of the present invention.

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, or the like, a transistor directly connected to the transistor 103 may be added. FIG. 20A illustrates a configuration example where a transistor 112 is added in FIG. 4. A first terminal and a second terminal of the transistor 112 are connected to the second terminal of the transistor 103 and the node ND1, respectively.

Note that the transistor 112 preferably has the same polarity as the transistor 101.

On/off of the transistor 112 may be controlled with a signal input to the gate of the transistor 112.

Note that the transistor 112 may be connected between the first terminal of the transistor 101 and the wiring VSS1.

Figure 20B:
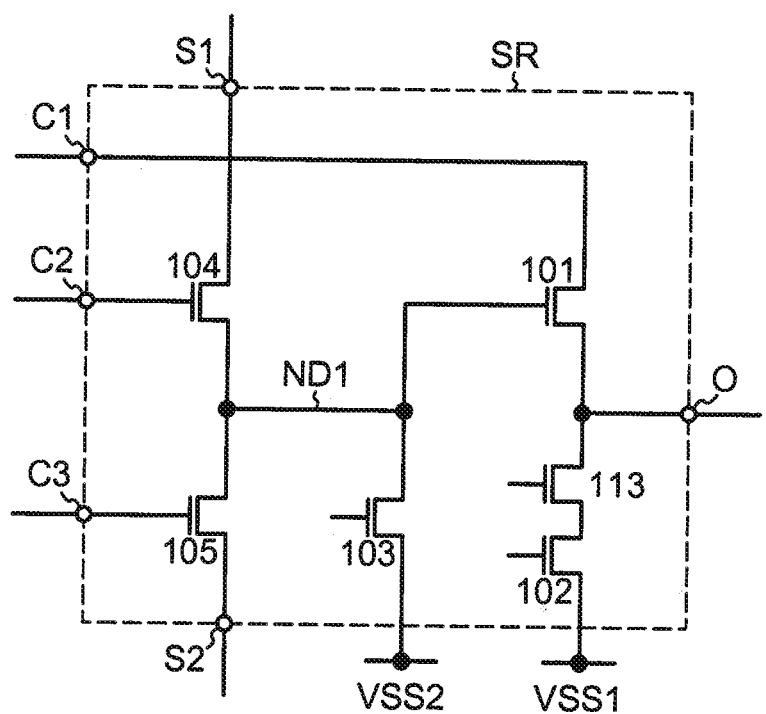

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, or the like, a transistor directly connected to the transistor 102 may be added. FIG. 20B illustrates a configuration example where a transistor 113 is added in FIG. 4. A first terminal and a second terminal of the transistor 113 are connected to the second terminal of the transistor 102 and the terminal O, respectively.

Note that the transistor 113 preferably has the same polarity as the transistor 101.

On/off of the transistor 113 may be controlled with a signal input to the gate of the transistor 113.

Figure 21A:
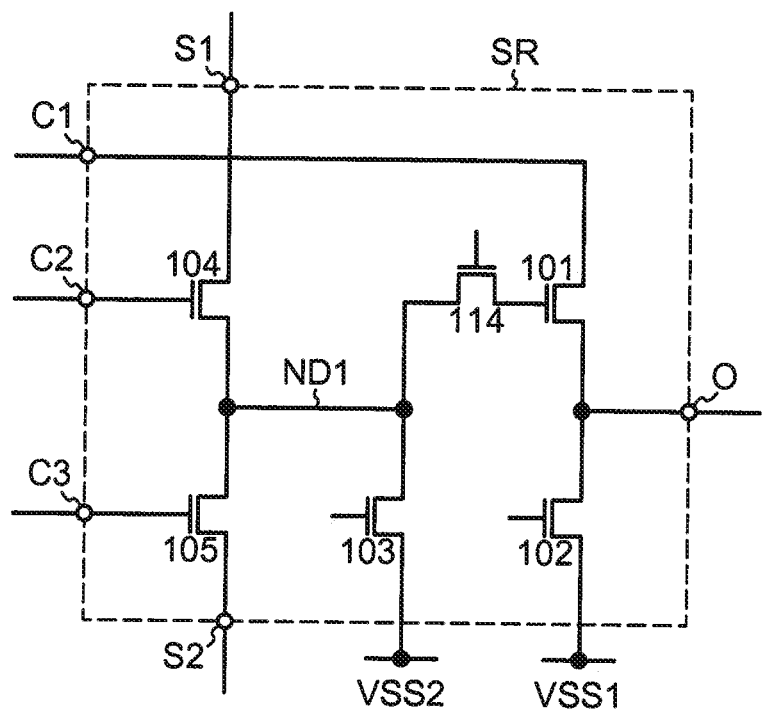
FIGS. 21A and 21B are circuit diagrams each illustrating a device of one embodiment of the present invention.

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 188, FIG. 19A, FIG. 19B, FIG. 20A, FIG. 20B, or the like, a transistor connected among the gate of the transistor 101, the second terminal of the transistor 104, and the second terminal of the transistor 105 may be added. FIG. 21A illustrates a configuration example where a transistor 114 is added in FIG. 4. A first terminal of the transistor 114 is connected to the gate of the transistor 101 and a second terminal of the transistor 114 is connected to the second terminal of the transistor 104, the second terminal of the transistor 105, and the second terminal of the transistor 103.

Note that the transistor 114 preferably has the same polarity as the transistor 101.

Figure 21B:
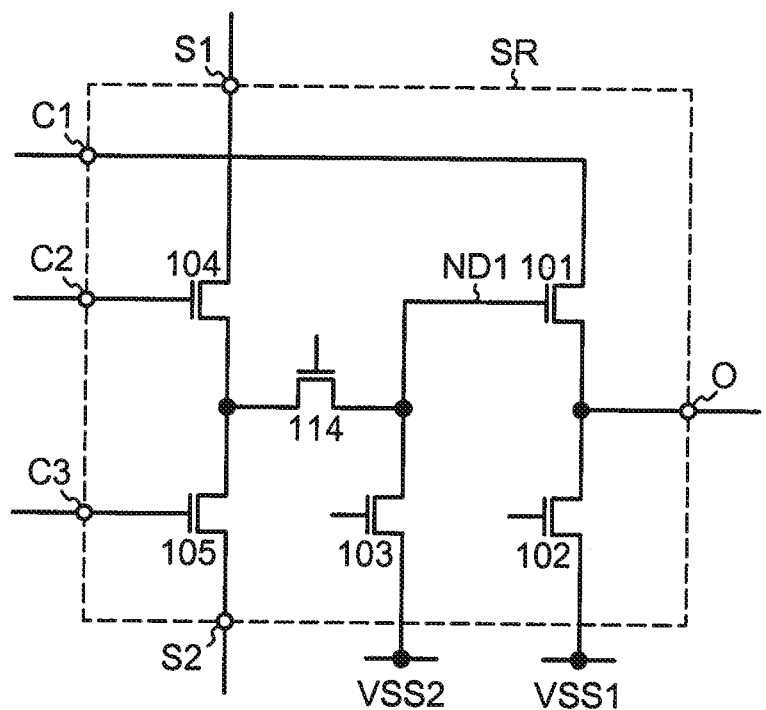

As illustrated in FIG. 21B, the second terminal of the transistor 103 may be connected to the first terminal of the transistor 114.

A gate of the transistor 114 may be connected to the terminal C1. Alternatively, the gate of the transistor 114 may be supplied with a potential corresponding to a high-level signal of the terminal C1.

Figure 22A:
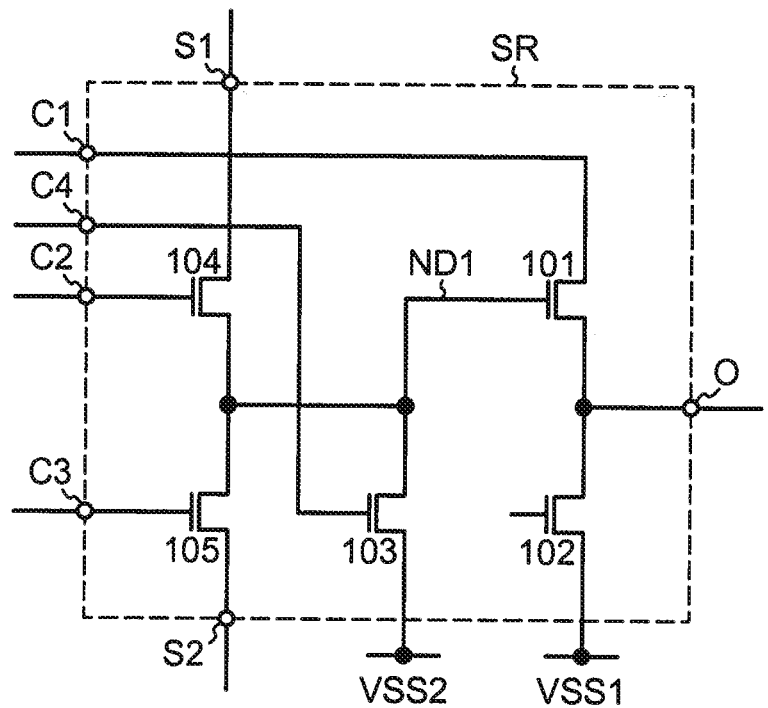
FIGS. 22A and 22B are circuit diagrams each illustrating a device of one embodiment of the present invention.

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, or the like, the gate of the transistor 103 may be connected to the terminal S3, the terminal S4, or the terminal C4. FIG. 22A illustrates a configuration example where the gate of the transistor 103 is connected to the terminal C4 in FIG. 4.

Figure 22B:
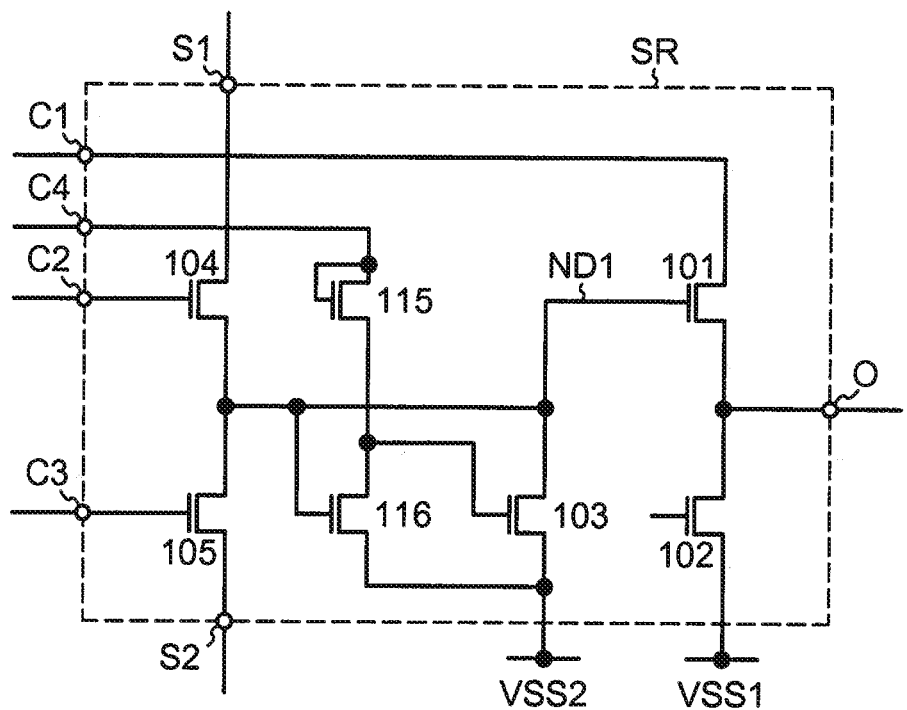

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, or the like, a configuration for controlling the potential of the gate of the transistor 103 may be added. FIG. 22B illustrates a configuration example where a transistor 115 and a transistor 116 are added in FIG. 4. A first terminal, a second terminal, and a gate of the transistor 115 are connected to the terminal C4, the gate of the transistor 103, and the terminal C4, respectively. A first terminal, a second terminal, and a gate of the transistor 116 are connected to the wiring VSS2, the gate of the transistor 103, and the node ND1, respectively.

In the period A, the period B, and the period C, the transistor 115 is off because the signal (signal $V_{CK4}$) of the terminal C4 is at low level. The transistor 116 is turned on because the potential of the node ND1 is set to a high value. Thus, the potential of the gate of the transistor 103 is set to a low value because the potential of the wiring VSS2 is supplied to the gate of the transistor 103. Since the potential of the gate of the transistor 103 is set to the low value, the transistor 103 is turned off.

In the period D, the transistor 115 is turned on because the signal (signal $V_{CK4}$) of the terminal C4 is set at high level. The transistor 116 is turned off because the potential of the node ND is set to a low value. Thus, the potential of the gate of the transistor 103 is set to a high value because the signal (high-level signal $V_{CK4}$) of the terminal C4 is supplied to the gate of the transistor 103. Since the potential of the gate of the transistor 103 is set to the high value, the transistor 103 is turned on.

In the period E, the period F, and the period G, the transistor 115 is turned off because the signal (signal $V_{CK4}$) of the terminal C4 is set at low level. Since the potential of the node ND1 has the low value, the transistor 116 is kept off. Thus, the potential of the gate of the transistor 103 has the high value because the gate of the transistor 103 is set in the floating state. Since the potential of the gate of the transistor 103 has the high value, the transistor 103 is kept on.

In the period H, the transistor 115 is turned on because the signal (signal $V_{CK4}$) of the terminal C4 is set at high level. Since the potential of the node ND1 has the low value, the transistor 116 is kept off. Thus, since the signal (high-level signal $V_{CK4}$) of the terminal C4 is supplied to the gate of the transistor 103, the potential of the gate of the transistor 103 has the high value. Since the potential of the gate of the transistor 103 has the high value, the transistor 103 is kept on.

Note that at least one of the first terminal and the gate of the transistor 115 is connected to the terminal C4. For example, the first terminal of the transistor 115 may be connected to the terminal C4 and the gate of the transistor 115 may be connected to a wiring (not illustrated) to which a potential corresponding to the high-level signal $V_{CK1}$, the high-level signal $V_{CK2}$, the high-level signal $V_{CK3}$, or the high-level signal $V_{CK4}$ is input.

Figure 23A:
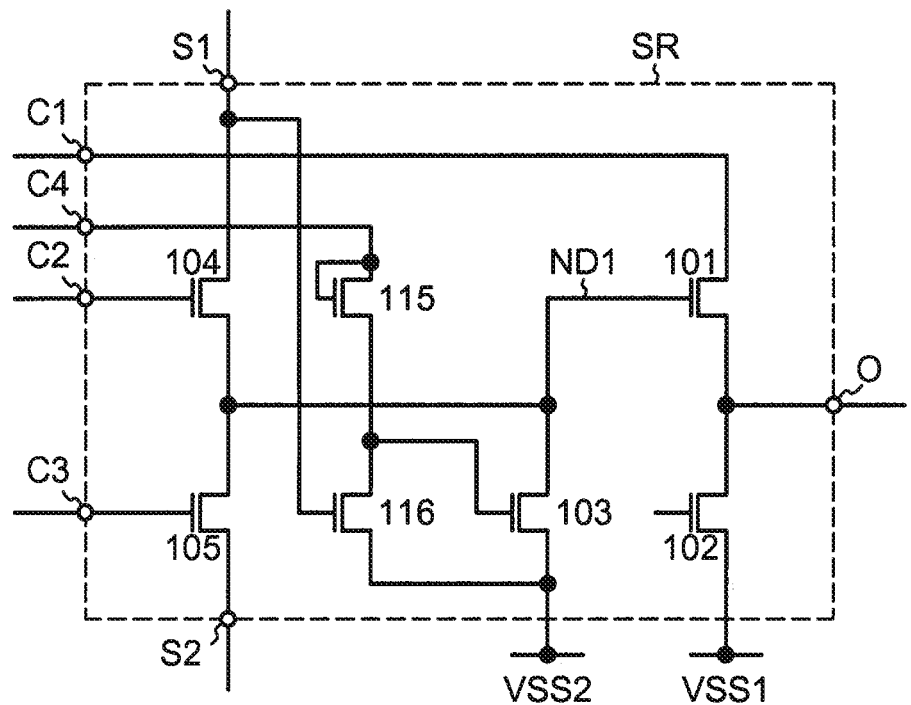
FIGS. 23A and 23B are circuit diagrams each illustrating a device of one embodiment of the present invention.
Figure 23B:
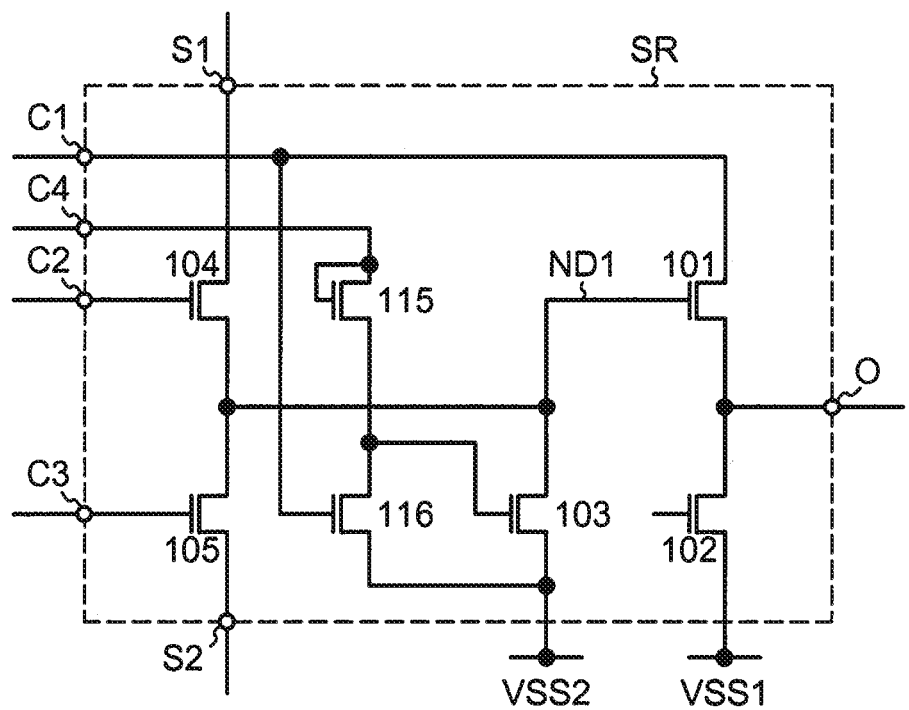

Note that the gate of the transistor 116 may be connected to the terminal C1, the terminal C2, the terminal C3, the terminal S1, the terminal S2, or the terminal O. FIG. 23A illustrates a configuration example where the gate of the transistor 116 is connected to the terminal S1 in FIG. 22B. FIG. 23B illustrates a configuration example where the gate of the transistor 116 is connected to the terminal C1 in FIG. 22B.

Note that the first terminal of the transistor 116 may be connected to the wiring VSS1, the wiring VSS3, the wiring VSS4, the terminal S3, the terminal S4, or the terminal C4.

Note that the transistor 115 and the transistor 116 preferably have the same polarity as the transistor 101.

Figure 24A:
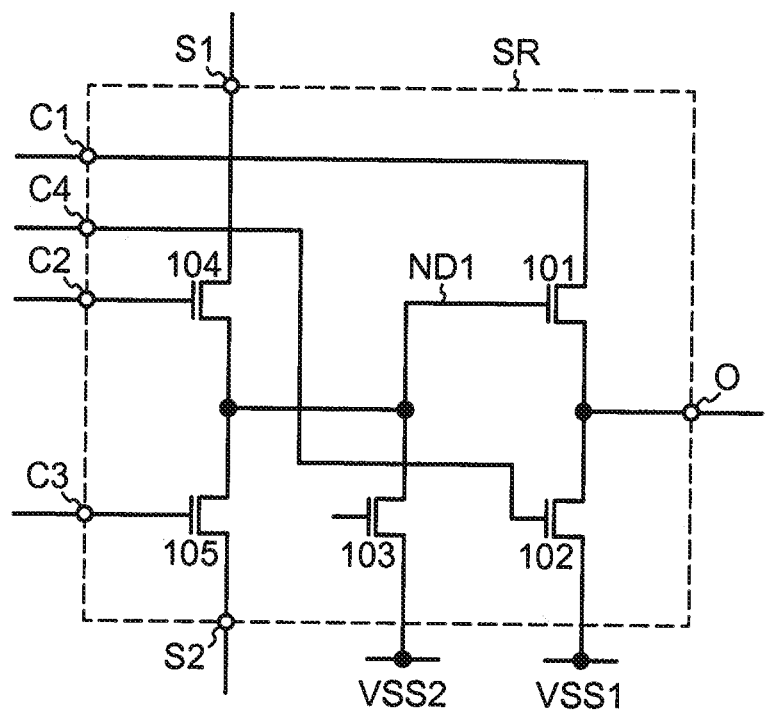
FIGS. 24A and 24B are circuit diagrams each illustrating a device of one embodiment of the present invention.
Figure 24B:
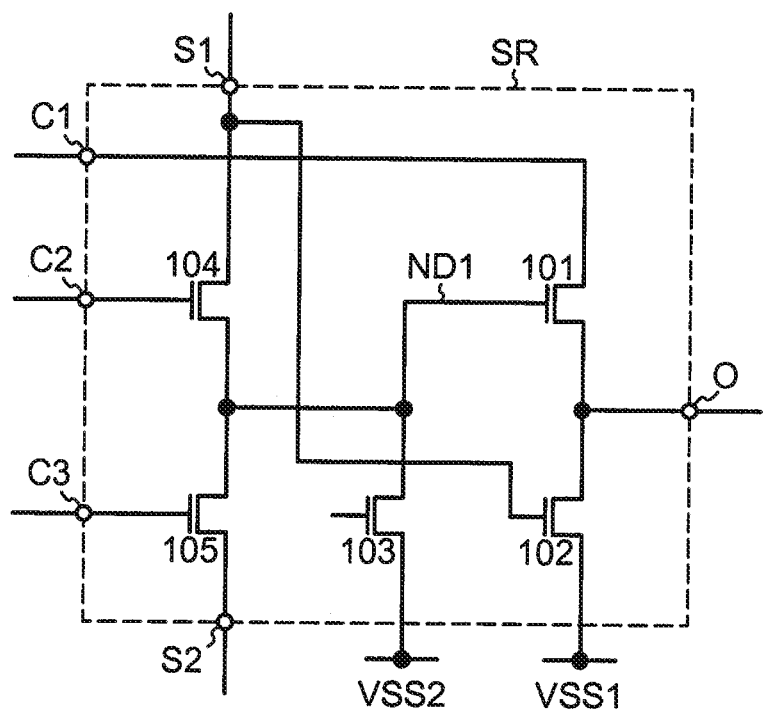

In the circuit SR in this embodiment that is described with or without reference to FIG. 4, FIG. 11A, FIG. 1B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, or the like, the gate of the transistor 102 may be connected to the terminal S1, the terminal S2, the terminal S3, the terminal S4, the terminal C2, the terminal C3, or the terminal C4. FIG. 24A illustrates a configuration example where the gate of the transistor 102 is connected to the terminal C4 in FIG. 4. FIG. 24B illustrates a configuration example where the gate of the transistor 102 is connected to the terminal S1 in FIG. 4.

In the circuit SR in this embodiment that is described with or without reference to FIG. 4, FIG. 11A, FIG. 11B, FIG. 12A, FIG. 12B, FIG. 13A. FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, FIG. 24A, FIG. 24B, or the like, in the case where a plurality of configurations can be applied to each transistor, a transistor having two or more of the plurality of configurations may be provided. In other words, in the case where a first configuration, a second configuration, and a third configuration can be applied to one transistor, two or more of transistors corresponding to the first configuration, the second configuration, and the third configuration may be provided.

Figure 25A:
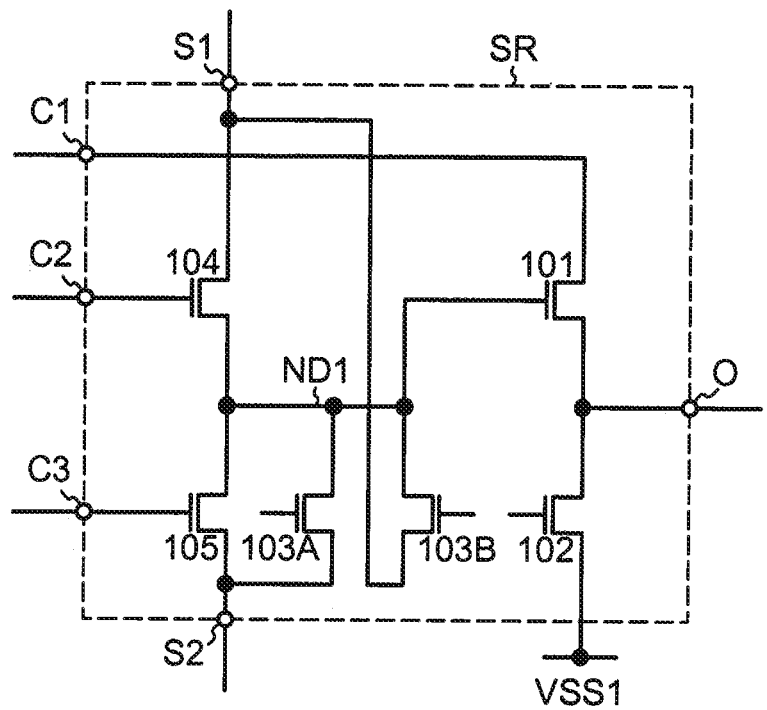
FIGS. 25A and 25B are circuit diagrams each illustrating a device of one embodiment of the present invention.

For example, the first terminal of the transistor 103 is connected to the wiring VSS2 (see FIG. 4), the wiring VSS1 (see FIG. 11A), the terminal S2 (see FIG. 11B), the terminal S1 (see FIG. 12A), the terminal C1, the terminal C2, the terminal C3, the terminal C4, the terminal S3, the terminal S4, or the terminal O. FIG. 25A illustrates a configuration example where a transistor 103A corresponding to the transistor 103 whose first terminal is connected to the terminal S2, and a transistor 103B corresponding to the transistor 103 whose first terminal is connected to the terminal S1 are provided in the circuit SR illustrated in FIG. 4.

Figure 25B:
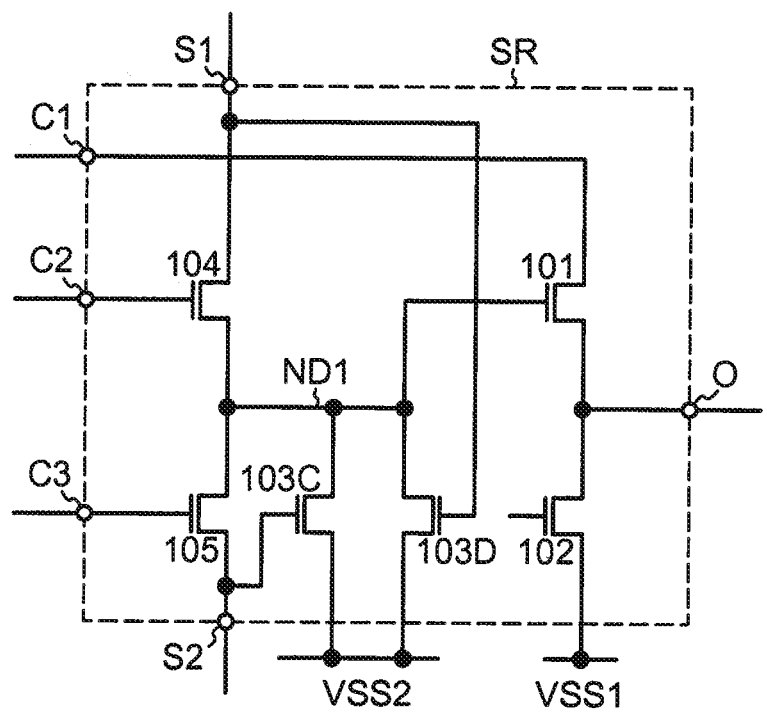

For example, the gate of the transistor 103 is connected to the terminal S3, the terminal S4, the terminal C2, the terminal C3, or the terminal C4 (see FIG. 22A). FIG. 25B illustrates a configuration example where a transistor 103C corresponding to the transistor 103 whose gate is connected to the terminal S2 and a transistor 103D corresponding to the transistor 103 whose gate is connected to the terminal S1 are provided in the circuit SR illustrated in FIG. 4.

Figure 26A:
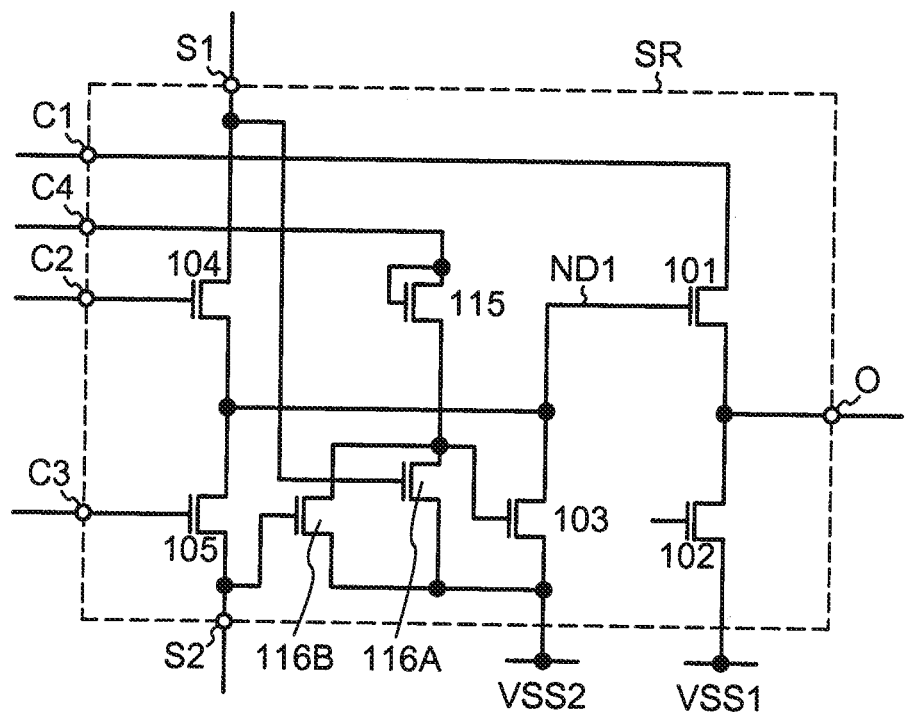
FIGS. 26A and 26B are circuit diagrams each illustrating a device of one embodiment of the present invention.

For example, the gate of the transistor 116 is connected to the node ND1 (see FIG. 22B), the terminal C1 (see FIG. 23B), the terminal C2, the terminal C3, the terminal S1 (see FIG. 23A), the terminal S2, or the terminal O. FIG. 26A illustrates a configuration example where a transistor 116A corresponding to the transistor 116 whose gate is connected to the terminal S1 and a transistor 116B corresponding to the transistor 116 whose gate is connected to the terminal S2 are provided in the circuit SR illustrated in FIG. 22B.

All or some of the circuits SR in this embodiment that are described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, FIG. 24A, FIG. 24B, FIG. 25A, FIG. 25B, FIG. 26A, and the like can be combined.

Figure 26B:
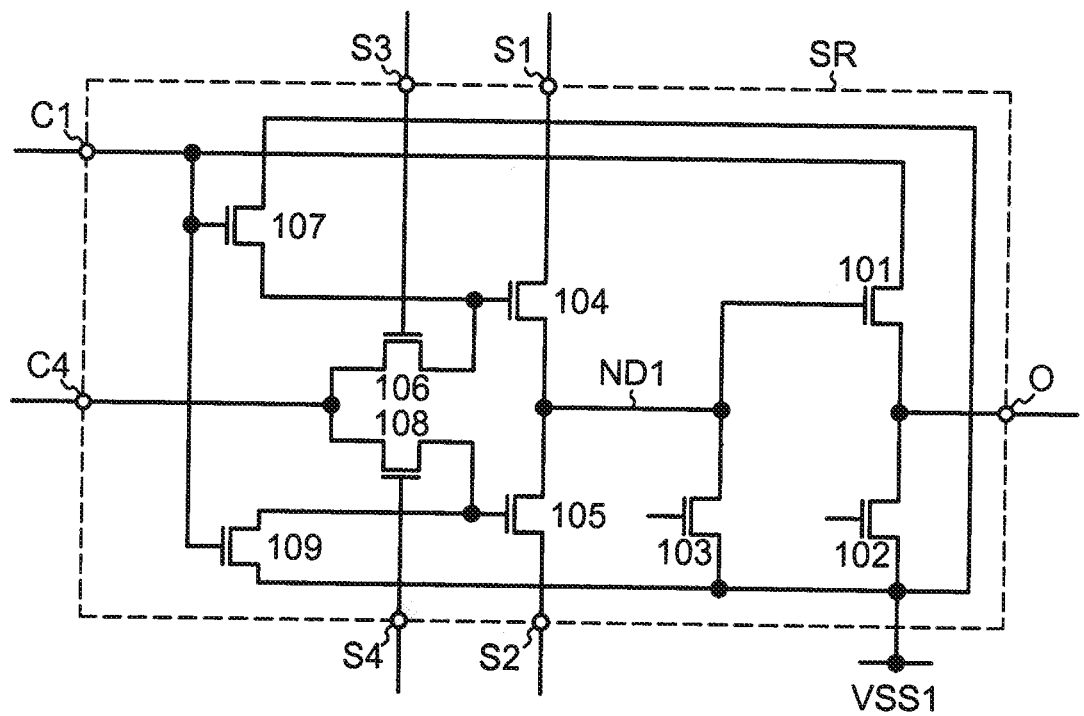

For example, FIG. 26B illustrates a configuration example where, in FIG. 4, the first terminal of the transistor 103 is connected to the wiring VSS1 as illustrated in FIG. 11A, the transistors 106 to 109 are added as illustrated in FIG. 15A, the first terminal of the transistor 107 is connected to the wiring VSS1 as illustrated in FIG. 18B, and the first terminal of the transistor 109 is connected to the wiring VSS1 as illustrated in FIG. 18B.

Figure 27A:
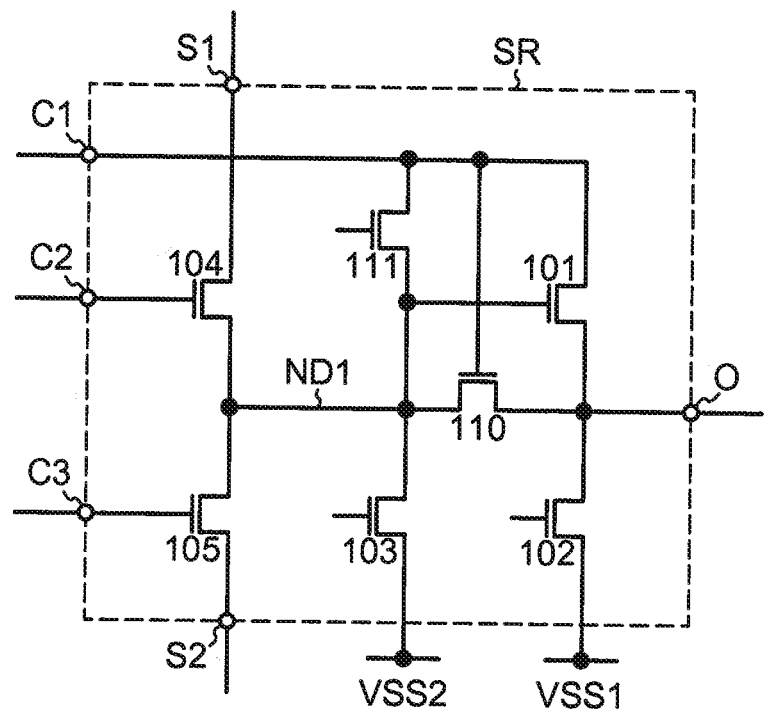
FIGS. 27A and 27B are circuit diagrams each illustrating a device of one embodiment of the present invention.

For example, FIG. 27A illustrates a configuration example where, in FIG. 4, the transistor 110 is added as illustrated in FIG. 19A and the transistor 111 is added as illustrated in FIG. 19B.

Figure 27B:
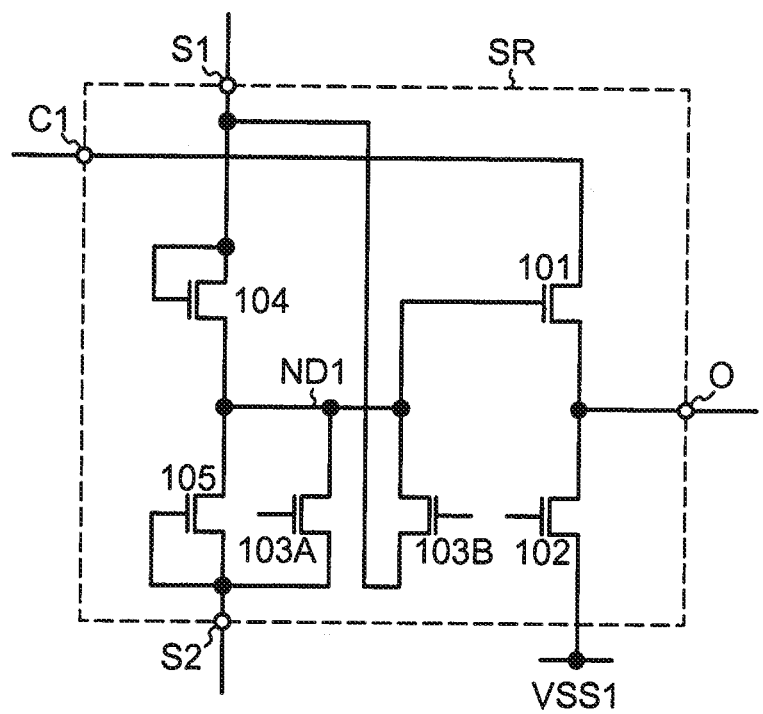

For example, FIG. 27B illustrates a configuration example where, in FIG. 4, the gate of the transistor 104 is connected to the terminal S1 as illustrated in FIG. 14A, the gate of the transistor 105 is connected to the terminal S2 as illustrated in FIG. 14A, the transistor 103A is provided as illustrated in FIG. 25A, and the transistor 103B is provided as illustrated in FIG. 25A.

In the circuit SR in this embodiment that is described with or without reference to FIG. 4, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, FIG. 24A, FIG. 24B, FIG. 25A, FIG. 25B, FIG. 26A, FIG. 26B, FIG. 27A, FIG. 27B, or the like, all or at least one of the plurality of transistors may have a double-gate structure. The transistor having a double-gate structure includes a first gate and a second gate. A channel formation region or a semiconductor layer including the channel formation region of the transistor having a double-gate structure includes a region sandwiched between the first gate and the second gate. The first gate may be provided below or above the second gate. The first gate corresponds to the above "gate" and a portion to which the first gate is connected is the same as a portion to which the above "gate" is connected. The second gate may be connected to the first gate or a dedicated wiring. In the case where the second gate is connected to the first gate, the mobility of the transistor becomes high and the on-state current of the transistor is increased. Thus, W/L of the transistor can be small. In the case where the second gate is connected to a dedicated wiring, electrical characteristics of the transistor can be controlled with a potential or a signal of the dedicated wiring.

Figure 38A:
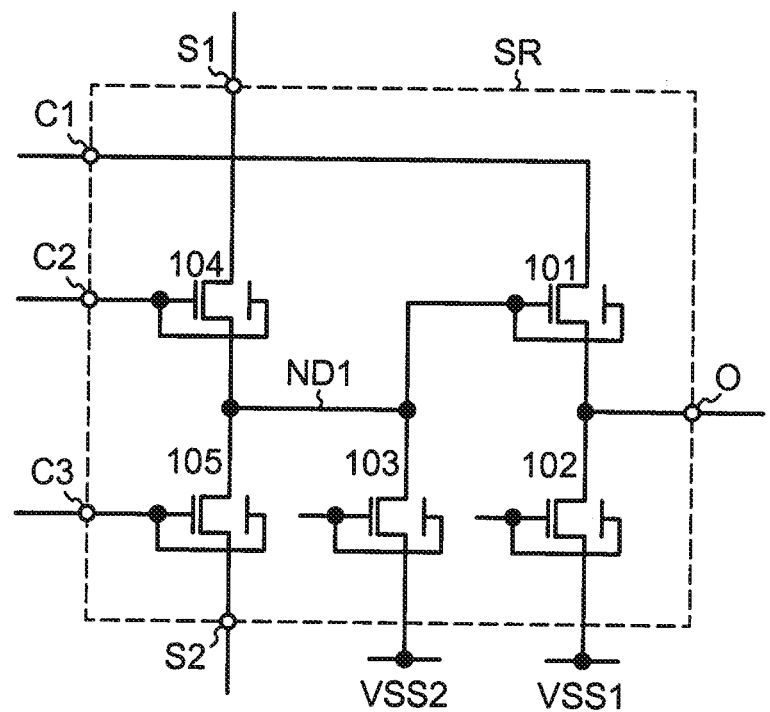
FIGS. 38A and 38B are circuit diagrams each illustrating a device of one embodiment of the present invention.

For example, FIG. 38A illustrates a configuration example where, in FIG. 4, the transistors 101 to 105 each have a double-gate structure in which the first gate and the second gate are connected to each other.

Figure 38B:
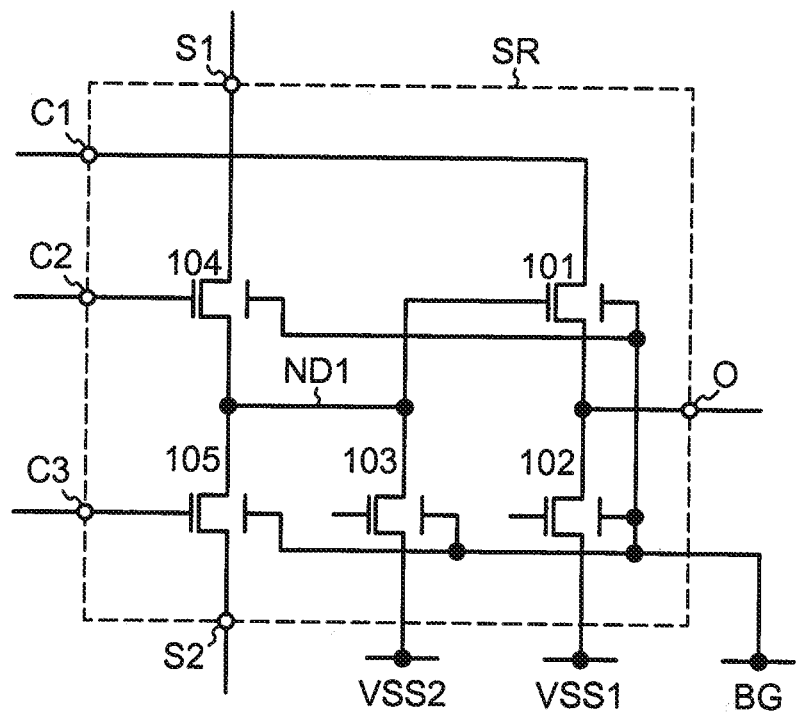

For example, FIG. 38B illustrates a configuration example where, in FIG. 4, the transistors 101 to 105 each have a double-gate structure in which the second gate is connected to a wiring BG.

In this specification and the like, any of a variety of switches can be used as a switch. The switch has a function of determining whether current flows or not by being turning on or off (being brought into an on state or an off state). Alternatively, the switch has a function of selecting and changing a current path. For example, the switch has a function of determining whether current can flow through a path 1 or a path 2 and switching the paths. For example, an electrical switch or a mechanical switch can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as a switch. An example of a mechanical switch is a switch formed using a micro electro mechanical system (MEMS) technology, such as a digital micromirror device (DMD). Such a switch includes an electrode which can be moved mechanically, and operates by controlling electrical conduction and non-conduction in accordance with movement of the electrode.

In the case where a transistor is used as a switch, the polarity (conductivity type) of the transistor is not particularly limited to a certain type because it operates just as a switch. However, a transistor of polarity with a smaller off-state current is preferably used when off-state current is to be suppressed. Examples of a transistor with a smaller off-state current are a transistor provided with an LDD region and a transistor with a multi-gate structure.

Note that in the case where a transistor is used as a switch, an n-channel transistor is preferably used as the switch when the potential of a source of the transistor which operates as the switch is close to a potential of a low-potential-side power supply (e.g., Vss, GND, or 0 V). A p-channel transistor is preferably used as the switch when the potential of the source is close to a potential of a high-potential-side power supply (e.g., Vdd). This is because the absolute value of the gate-source voltage can be increased when the potential of a source of the n-channel transistor is close to the potential of a low-potential-side power supply or when the potential of a source of the p-channel transistor is close to the potential of a high-potential-side power supply, so that the transistor can more accurately operate as a switch. This is also because the transistor does not often perform source follower operation, so that the decrease in output voltage does not often occur.

Note that a CMOS switch including both n-channel and p-channel transistors may be employed as a switch. The use of a CMOS switch as a switch allows more accurate operation of the switch because a current can flow when either the p-channel transistor or the n-channel transistor is turned on. Thus, a voltage can be appropriately output regardless of whether the voltage of an input signal to the switch is high or low. Alternatively, the voltage amplitude of a signal for turning on or off the switch can be made small, so that power consumption can be reduced.

Note that when a transistor is used as a switch, the switch includes an input terminal (one of a source and a drain), an output terminal (the other of the source and the drain), and a terminal for controlling electrical conduction (a gate) in some cases. When a diode is used as a switch, the switch does not have a terminal for controlling electrical conduction in some cases. Therefore, when a diode is used as a switch, the number of wirings for controlling terminals can be small as compared with the case of using a transistor as a switch.

In this specification and the like, for example, transistors with a variety of structures can be used as a transistor, without limitation to a certain type. For example, a transistor including single crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned can be used. In the case of using the TFT, there are various advantages. For example, since the TFT can be formed at temperature lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Alternatively, transmission of light in a display element can be controlled by using the transistor formed using the light-transmitting substrate. Alternatively, part of a film included in the transistor can transmit light because of a small thickness of the transistor. Therefore, the aperture ratio can be improved.

Note that when a catalyst (e.g., nickel) is used in the case of forming polycrystalline silicon, crystallinity can be further improved and a transistor having excellent electrical characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed using the same substrate.

Note that when a catalyst (e.g., nickel) is used in the case of forming microcrystalline silicon, crystallinity can be further improved and a transistor having excellent electrical characteristics can be formed. In that case, crystallinity can be improved by just performing heat treatment without performing laser irradiation. Accordingly, a gate driver circuit (e.g., a scan line driver circuit) and part of a source driver circuit (e.g., an analog switch) can be formed over the same substrate. Note that when laser irradiation for crystallization is not performed, unevenness in crystallinity of silicon can be suppressed. Therefore, high-quality images can be displayed. Note that it is possible to form polycrystalline silicon or microcrystalline silicon without a catalyst (e.g., nickel).

Note that although the crystallinity of silicon is preferably improved to polycrystal, microcrystal, or the like in the whole panel, the present invention is not limited to this. The crystallinity of silicon may be improved only in part of the panel. Selective increase in crystallinity can be achieved by selective laser irradiation or the like. For example, only a peripheral circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, the crystallinity of silicon can be improved only in a region in which a circuit needs to be operated at high speed. Because a pixel region is not particularly needed to be operated at high speed, even if crystallinity is not improved, the pixel circuit can be operated without any problem. Thus, a region whose crystallinity is improved is small, so that manufacturing steps can be decreased. This can increase throughput and reduce manufacturing cost. Alternatively, since the number of necessary manufacturing apparatuses is small, manufacturing cost can be reduced.

Examples of the transistor include a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) and a thin film transistor including a thin film of such a compound semiconductor or an oxide semiconductor. Because manufacturing temperature can be lowered, such a transistor can be formed at room temperature, for example. The transistor can thus be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Such an element can be formed at the same time as the transistor, thus, cost can be reduced.

Note that for example, a transistor formed by an ink-jet method or a printing method can be used as a transistor. Accordingly, such a transistor can be formed at room temperature, can be formed at a low vacuum, or can be formed using a large substrate. Thus, the transistor can be formed without using a mask (reticle), which enables the layout of the transistor to be easily changed. Alternatively, the transistor can be formed without using a resist, leading to reductions in material cost and the number of steps. Furthermore, a film can be formed only in a portion where the film is needed, a material is not wasted as compared with the case of employing a manufacturing method by which etching is performed after the film is formed over the entire surface, so that the cost can be reduced.

Note that for example, a transistor including an organic semiconductor or a carbon nanotube can be used as a transistor. Thus, such a transistor can be formed over a flexible substrate. A device including a transistor which includes an organic semiconductor or a carbon nanotube can resist a shock.

Note that transistors with a variety of different structures can be used for a transistor. For example, a MOS transistor, a junction transistor, a bipolar transistor, or the like can be used as a transistor. By using a MOS transistor as a transistor, the size of the transistor can be reduced. Thus, a number of transistors can be mounted. By using a bipolar transistor as a transistor, a large amount of current can flow. Thus, a circuit can be operated at high speed. Note that a MOS transistor and a bipolar transistor may be formed over one substrate, in which case reductions in power consumption and size, high-speed operation, and the like can be achieved.

Note that in this specification and the like, for example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (reliability can be improved). Alternatively, with the multi-gate structure, the drain-source current does not change so much even if the drain-source voltage fluctuates when the transistor operates in a saturation region, so that a flat slope of the voltage-current characteristics can be obtained. By utilizing the flat slope of the voltage-current characteristics, an ideal current source circuit or an active load having extremely high resistance can be obtained. Accordingly, a differential circuit, a current mirror circuit, or the like having excellent properties can be obtained.

Note that a transistor with a structure where gate electrodes are formed above and below a channel can be used, for example. With the structure where gate electrodes are formed above and below a channel, a circuit structure where a plurality of transistors are connected in parallel is provided. Thus, a channel region is increased, so that the amount of current can be increased. Alternatively, by using the structure where gate electrodes are formed above and below a channel, a depletion layer can be easily formed, resulting in lower subthreshold swing.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor. A transistor with any of a variety of structures such as a planar type, a FIN-type, a TRI-Gate type, a top-gate type, a bottom-gate type, and a double-gate type (with gates above and below a channel) can be used.

Note that for example, a transistor with a structure where a source electrode or a drain electrode overlaps with a channel region (or part of it) can be used as a transistor. By using the structure where a source electrode or a drain electrode overlaps with a channel region (or part of it), unstable operation due to accumulation of electric charge in part of the channel region can be prevented.

Note that for example, a transistor with a structure where an LDD region is provided can be used as a transistor. Provision of the LDD region enables a reduction in off-state current or an increase in the withstand voltage of the transistor (an improvement in reliability). Alternatively, by providing the LDD region, the drain current does not change so much even when the drain-source voltage fluctuates when the transistor operates in a saturation region, so that a flat slope of the voltage-current characteristics can be obtained.

Note that in this specification and the like, a transistor can be formed using any of a variety of substrates, for example. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, and paper. Specifically, when a transistor is formed using a semiconductor substrate, a single crystal substrate, an SOI substrate, or the like, the transistor can have few variations in characteristics, size, shape, or the like, high current supply capability, and a small size. By forming a circuit with the use of such a transistor, power consumption of the circuit can be reduced or the circuit can be highly integrated.

A flexible substrate may be used as the substrate, and the transistor may be provided directly on the flexible substrate. Moreover, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

That is, a transistor may be formed using a substrate, and then, the transistor may be transferred to another substrate. Examples of a substrate to which a transistor is transferred are, in addition to the above substrate over which the transistor can be formed, a paper substrate, a cellophane substrate, an aramid substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

Note that all the circuits which are necessary to realize a predetermined function can be formed using one substrate (e.g., a glass substrate, a plastic substrate, a single crystal substrate, or an SOI substrate). In this manner, the cost can be reduced by a reduction in the number of components or reliability can be improved by a reduction in the number of connection points to circuit components.

Note that not all the circuits which are necessary to realize the predetermined function are needed to be formed using one substrate. That is, part of the circuits which are necessary to realize the predetermined function may be formed using a substrate and another part of the circuits which are necessary to realize the predetermined function may be formed using another substrate. For example, part of the circuits which are necessary to realize the predetermined function can be formed using a glass substrate and another part of the circuits which are necessary to realize the predetermined function can be formed using a single crystal substrate (or an SOI substrate). The single crystal substrate over which the another part of the circuits which are necessary to realize the predetermined function (such a substrate is also referred to as an IC chip) can be connected to the glass substrate by chip on glass (COG), and the IC chip can be provided over the glass substrate. Alternatively, the IC chip can be connected to the glass substrate by tape automated bonding (TAB), chip on film (COF), surface mount technology (SMT), a printed circuit board, or the like. When part of the circuits is formed over the same substrate as a pixel portion in this manner, the cost can be reduced by a reduction in the number of components or reliability can be improved by a reduction in the number of connection points between circuit components. In particular, a circuit in a portion where a driving voltage is high, a circuit in a portion where a driving frequency is high, or the like consumes much power in many cases. In view of the above, such a circuit is formed over a substrate (e.g., a single crystal substrate) different from a substrate over which a pixel portion is formed, whereby an IC chip is formed. The use of this IC chip allows prevention of increase in power consumption.

For example, in this specification and the like, a transistor is an element having at least three terminals: a gate, a drain, and a source. The transistor includes a channel region between the drain (a drain terminal, a drain region, or a drain electrode) and the source (a source terminal, a source region, or a source electrode), and a current can flow through the drain, the channel region, and the source. Here, since the source and the drain of the transistor change depending on the structure, the operating condition, or the like of the transistor, it is difficult to define which is a source or a drain. Therefore, a portion functioning as a source or a drain is not called a source or a drain in some cases. In that case, for example, one of the source and the drain is referred to as a first terminal, a first electrode, or a first region, and the other of the source and the drain is referred to as a second terminal, a second electrode, or a second region in some cases.

Note that a transistor may be an element having at least three terminals of a base, an emitter, and a collector. In that case also, one of the emitter and the collector is referred to as a first terminal, a first electrode, or a first region, and the other of the emitter and the collector is referred to as a second terminal, a second electrode, or a second region in some cases. Note that in the case where a bipolar transistor is used as a transistor, a gate can be rephrased as a base.

For example, in this specification and the like, when it is explicitly described that X and Y are connected, the case where X and Y are electrically connected, the case where X and Y are functionally connected, and the case where X and Y are directly connected are included therein. Accordingly, a connection relation other than connection relations shown in drawings and texts is also included, without being limited to a predetermined connection relation, for example, a connection relation shown in the drawings and the texts.

Here, each of X and Y denotes an object (e.g., a device, an element, a circuit, a wiring, an electrode, a terminal, a conductive film, a layer, or the like).

In the case where X and Y are electrically connected, one or more elements (e.g., a switch, a transistor, a capacitor, an inductor, a resistor, a diode, a display element, a light-emitting element, and a load) that enable an electrical connection between X and Y can be connected between X and Y, for example. Note that the switch is controlled to be turned on or off. That is, the switch has a function of determining whether current flows or not by being turned on or off (becoming an on state or an off state). Alternatively, the switch has a function of selecting and changing a current path.

In the case where X and Y are functionally connected, one or more circuits (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and a control circuit) that enable a functional connection between X and Y can be connected between X and Y, for example. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another element or another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and 22 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that this embodiment can be combined with any of the other embodiments as appropriate. Thus, a content (or part thereof) described in this embodiment can be applied to, combined with, or replaced with a different content in the embodiment and/or a content (or part thereof) described in one or a plurality of different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed. This applies also to other embodiments.

Embodiment 2

In this embodiment, a display device including the device of one embodiment of the present invention is described.

Figure 28A:
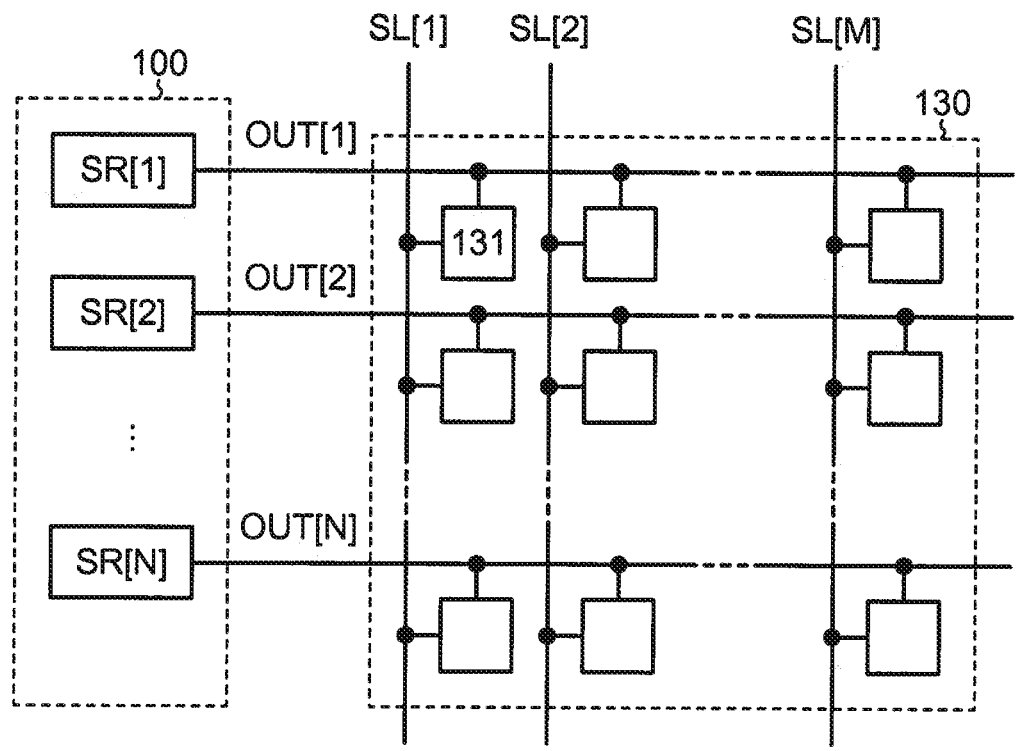
FIGS. 28A to 28C are circuit diagrams illustrating a display device of one embodiment of the present invention.

A display device illustrated in FIG. 28A includes the circuit 100 and a pixel portion 130. In the pixel portion 130, N (N is a natural number of 3 or more) wirings OUT and M (M is a natural number) wirings SL (also referred to as wirings SL[1] to SL[M]) are provided. Pixels 131 are provided for the N wirings OUT and M wirings SL. The circuit 100 has a function of a gate driver (also referred to as a gate line driver circuit, a gate signal line driver circuit, or a scan line driver circuit). The N wirings OUT have a function of gate lines (also referred to as gate signal lines or scan lines). The M wirings SL have a function of transmitting video signals. That is, the M wirings SL have a function of source lines (also referred to as source signal lines or signal lines). The M wirings SL are connected to a circuit having a function of a source driver (also referred to as a source line driver circuit, a source signal line driver circuit, or a signal line driver circuit).

The selection and non-selection of the pixel 131 are controlled based on the potential of the wiring OUT. That is, the selection and non-selection of the pixel 131 are controlled with the circuit 100. When the pixel 131 is selected, a video signal is written from the wiring SL to the pixel 131. While the video signal is held in the pixel 131, the pixel 131 displays an image in accordance with the video signal. After that, when the pixel 131 is not selected, the pixel 131 keeps displaying the image in accordance with the held video signal.

Next, a specific structure example of the pixel 131 is described.

Figure 28B:
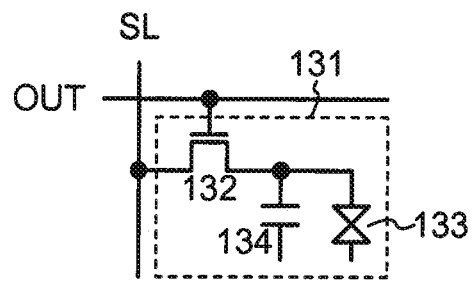

The pixel 131 illustrated in FIG. 28B includes a transistor 132, a liquid crystal element 133, and a capacitor 134. A first terminal of the transistor 132 is connected to the wiring SL, a second terminal of the transistor 132 is electrically connected to a first electrode of the liquid crystal element 133 and a first electrode (also referred to as a pixel electrode) of the capacitor 134, and a gate of the transistor 132 is connected to the wiring OUT. A second electrode (also referred to as a common electrode) of the liquid crystal element 133 is shared by all or two or more of the plurality of pixels 131. In other words, a conductor including a region serving as the second electrode of the liquid crystal element 133 of a first pixel 131 includes a region serving as the second electrode of the liquid crystal element 133 of a second pixel 131. A second electrode of the capacitor 134 is connected to a wiring having a function of a capacitor line. The second electrode of the capacitor 134 is connected to the same wiring in all or two or more of the plurality of pixels 131. Note that the second electrode of the capacitor 134 may be connected to the second electrode of the liquid crystal element 133. On/off of the transistor 132 is controlled with the potential of the wiring OUT. When the transistor 132 is turned on, a video signal of the wiring SL is input to the pixel 131. The liquid crystal element 133 includes a liquid crystal material. The alignment of the liquid crystal material is controlled with the potential difference between the first electrode of the liquid crystal element 133 and the second electrode of the liquid crystal element 133. The capacitor 134 has a function of accumulating electric charge based on the video signal. In other words, the capacitor 134 has a function of maintaining the potential of the first electrode of the liquid crystal element 133 at a value corresponding to the video signal.

Figure 28C:
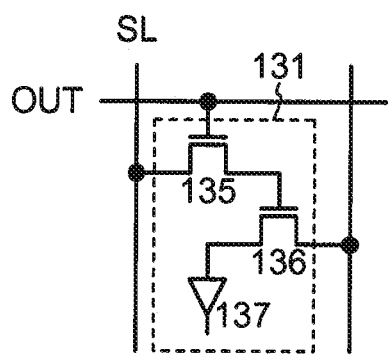

The pixel 131 illustrated in FIG. 28C includes a transistor 135, a transistor 136, and an EL element 137. A first terminal, a second terminal, and a gate of the transistor 135 are connected to the wiring SL, a gate of the transistor 136, and the wiring OUT, respectively. A first terminal and a second terminal of the transistor 136 are connected to a wiring having a function of supplying a current flowing through the EL element 137 and a first electrode (also referred to as a pixel electrode) of the EL element 137, respectively. A second electrode (also referred to as a common electrode) of the EL element 137 is shared by all or two or more of the plurality of pixels 131. In other words, a conductor including a region serving as the second electrode of the EL element 137 of the first pixel 131 includes a region serving as the second electrode of the EL element 137 of the second pixel 131. On/off of the transistor 135 is controlled with the potential of the wiring OUT. When the transistor 135 is turned on, the video signal of the wiring SL is input to the pixel 131. The transistor 136 has a function of supplying a current to the EL element 137. The current supplied to the EL element 137 by the transistor 136 has a value corresponding to the video signal. The EL element 137 has a function of emitting light in accordance with the current supplied from the transistor 136.

The structure of the pixel 131 is not limited to those in FIGS. 28B and 28C. The pixel 131 has any structure as long as it includes a transistor whose gate is connected to the wiring OUT and first terminal is connected to the wiring SL and a display element which displays an image on the basis of a video signal input through the transistor. Alternatively, the pixel 131 has any structure as long as it includes a transistor whose gate is connected to the wiring OUT and first terminal is connected to the wiring SL and a pixel electrode to which a potential or a current based on a video signal input through the transistor is supplied. Alternatively, the pixel 131 has any structure as long as it includes a transistor whose gate is connected to the wiring OUT and first terminal is connected to the wiring SL and a transistor which supplies a current based on a video signal input through the transistor to a display element or a pixel electrode.

This embodiment can be implemented in combination with any of the other embodiments described in this specification as appropriate.

Embodiment 3

In this embodiment, a structure example of a transistor is described with reference to drawings. A transistor described in this embodiment can be applied to the transistors 101 to 116 described in Embodiment 1 and the transistors 132, 135, and 136 described in Embodiment 2.

<Structure Example of Transistor>

Figure 29A:
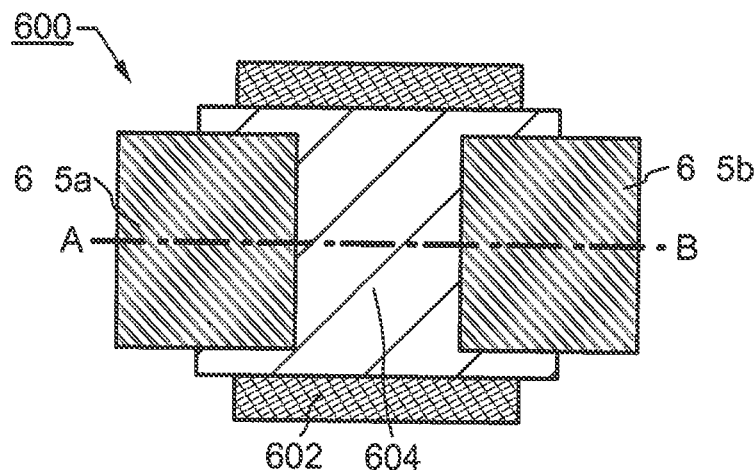
FIGS. 29A and 29B illustrate a structure example of a transistor of one embodiment of the present invention.
Figure 29B:
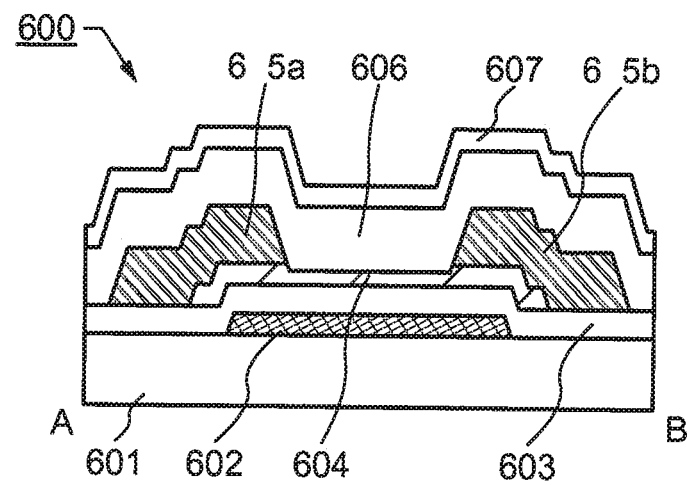

FIG. 29A is a schematic top view of a transistor 600 described below as an example. FIG. 29B is a schematic cross-sectional view of the transistor 600 taken along line A-B in FIG. 29A. The transistor 600 described as an example in FIGS. 29A and 29B is a bottom-gate transistor.

The transistor 600 includes a gate electrode 602 over a substrate 601, an insulating layer 603 over the substrate 601 and the gate electrode 602, an oxide semiconductor layer 604 provided over the insulating layer 603 to overlap with the gate electrode 602, and a pair of electrodes 605a and 605b in contact with a top surface of the oxide semiconductor layer 604. An insulating layer 606 covers the insulating layer 603, the oxide semiconductor layer 604, and the pair of electrodes 605a and 605b. An insulating layer 607 is provided over the insulating layer 606.

There is no particular limitation on the properties of a material and the like of the substrate 601 as long as the material has heat resistance high enough to withstand at least heat treatment performed later. For example, a glass substrate, a ceramic substrate, a quartz substrate, a sapphire substrate, or an yttria-stabilized zirconia (YSZ) substrate may be used as the substrate 601. Alternatively, a single crystal semiconductor substrate or a polycrystalline semiconductor substrate made of silicon or silicon carbide, a compound semiconductor substrate made of silicon germanium, an SOI substrate, or the like can be used as the substrate 601. Still alternatively, any of these substrates provided with a semiconductor element may be used as the substrate 601.

A flexible substrate such as a plastic substrate may be used as the substrate 601, and the transistor 600 may be provided directly on the flexible substrate. Alternatively, a separation layer may be provided between the substrate 601 and the transistor 600. The separation layer can be used when part or the whole of the transistor formed over the separation layer is formed, separated from the substrate 601, and then transferred to another substrate. Thus, the transistor 600 can be transferred to a substrate having low heat resistance or a flexible substrate.

The gate electrode 602 can be formed using a metal selected from aluminum, chromium, copper, tantalum, titanium, molybdenum, and tungsten; an alloy containing any of these metals as a component; an alloy containing any of these metals in combination; or the like. Furthermore, one or both of manganese and zirconium may be used. The gate electrode 602 may have a single-layer structure or a stacked structure of two or more layers. For example, the gate electrode 602 can have a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like. Alternatively, an alloy film or a nitride film that contains aluminum and one or more elements selected from titanium, tantalum, tungsten, molybdenum, chromium, neodymium, and scandium may be used.

The gate electrode 602 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode 602 can have a stacked structure using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZaN), or the like may be provided between the gate electrode 602 and the insulating layer 603. These films each have a work function of 5 eV or higher, preferably 5.5 eV or higher, which is higher than the electron affinity of an oxide semiconductor, thus, the threshold voltage of a transistor including the oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than at least the oxide semiconductor layer 604, specifically, an In—Ga—Zn-based oxynitride semiconductor film having a nitrogen concentration of 7 atomic % or higher is used.

The insulating layer 603 functions as a gate insulating film. The insulating layer 603 in contact with a bottom surface of the oxide semiconductor layer 604 is preferably an oxide insulating film.

The insulating layer 603 has a single-layer structure or a stacked structure using silicon oxide, silicon oxynitride, silicon nitride oxide, silicon nitride, aluminum oxide, hafnium oxide, gallium oxide, or Ga—Zn-based metal oxide, for example.

The insulating layer 603 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, in which case gate leakage current of the transistor can be reduced.

The pair of electrodes 605a and 605b function as a source electrode and a drain electrode of the transistor.

The pair of electrodes 605a and 605b can be formed to have a single-layer structure or a stacked structure using, as a conductive material, any of metals such as aluminum, titanium, chromium, nickel, copper, yttrium, zirconium, molybdenum, silver, tantalum, and tungsten or an alloy containing any of these metals as its main component. For example, the pair of electrodes 605a and 605b can have a single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

The insulating layer 606 is preferably an oxide insulating film which contains oxygen in excess of that in the stoichiometric composition. Part of oxygen is released by heating from the oxide insulating film which contains oxygen in excess of that in the stoichiometric composition. The oxide insulating film which contains oxygen in excess of that in the stoichiometric composition is an oxide insulating film in which the amount of released oxygen converted into oxygen atoms is $1.0\times10^{18}$ atoms/cm$^3$ or more, preferably $3.0\times10^{20}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

As the insulating layer 606, a silicon oxide film, a silicon oxynitride film, or the like can be used.

Note that the insulating layer 606 also functions as a film that relieves damage to the oxide semiconductor layer 604 at the time of forming the insulating layer 607 later.

Moreover, an oxide film transmitting oxygen may be provided between the insulating layer 606 and the oxide semiconductor layer 604.

As the oxide film transmitting oxygen, a silicon oxide film, a silicon oxynitride film, or the like can be used. Note that in this specification, a "silicon oxynitride film" refers to a film that contains more oxygen than nitrogen, and a "silicon nitride oxide film" refers to a film that contains more nitrogen than oxygen.

The insulating layer 607 can be an insulating film having a blocking effect against oxygen, hydrogen, water, and the like. Providing the insulating layer 607 over the insulating layer 606 can prevent outward diffusion of oxygen from the oxide semiconductor layer 604 and entry of hydrogen, water, or the like into the oxide semiconductor layer 604 from the outside. Examples of the insulating film having a blocking effect against oxygen, hydrogen, water, and the like are a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

<Example of Manufacturing Method of Transistor>

Next, an example of a manufacturing method of the transistor 600 in FIGS. 29A and 29B is described.

Figure 30A:
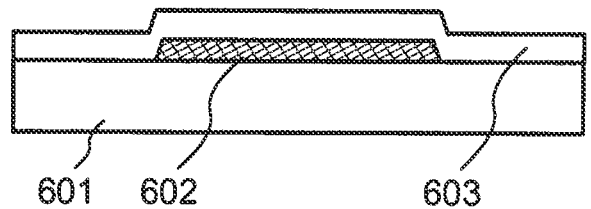
FIGS. 30A to 30D illustrate an example of a method for manufacturing a transistor of one embodiment of the present invention.

First, as illustrated in FIG. 30A, the gate electrode 602 is formed over the substrate 601, and the insulating layer 603 is formed over the gate electrode 602.

Here, a glass substrate is used as the substrate 601.

A method for forming the gate electrode 602 is described below. First, a conductive film is formed by a sputtering method, a CVD method, an evaporation method, or the like and then a resist mask is formed over the conductive film using a first photomask by a photolithography process. Next, part of the conductive film is etched using the resist mask to form the gate electrode 602. After that, the resist mask is removed.

Note that the gate electrode 602 may be formed by an electrolytic plating method, a printing method, an inkjet method, or the like instead of the above formation method.

The insulating layer 603 is formed by a sputtering method, a PECVD method, an evaporation method, or the like.

When a silicon oxide film, a silicon oxynitride film, or a silicon nitride oxide film is formed as the insulating layer 603, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

When a silicon nitride film is formed as the insulating layer 603, it is preferable to use a two-step formation method. First, a first silicon nitride film with few defects is formed by a plasma CVD method using a mixed gas of silane, nitrogen, and ammonia as a source gas. Then, a second silicon nitride film that has low hydrogen concentration and can block hydrogen is formed by switching the source gas to a mixed gas of silane and nitrogen. With such a formation method, a silicon nitride film having few defects and a blocking property against hydrogen can be formed as the insulating layer 603.

When a gallium oxide film is formed as the insulating layer 603, a metal organic chemical vapor deposition (MOCVD) method can be employed.

Figure 30B:
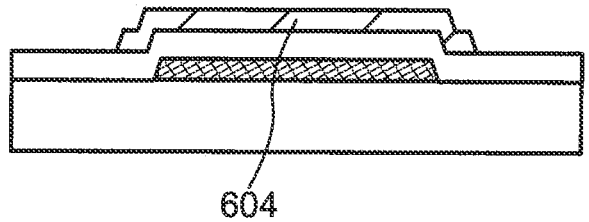

Next, as illustrated in FIG. 30B, the oxide semiconductor layer 604 is formed over the insulating layer 603.

A method for forming the oxide semiconductor layer 604 is described below. First, an oxide semiconductor film is formed. Then, a resist mask is formed over the oxide semiconductor film using a second photomask by a photolithography process. Then, part of the oxide semiconductor film is etched using the resist mask to form the oxide semiconductor layer 604. After that, the resist mask is removed.

After that, heat treatment may be performed. In such a case, the heat treatment is preferably performed under an atmosphere containing oxygen. The temperature of the heat treatment may be, for example, higher than or equal to 150° C. and lower than or equal to 600° C., preferably higher than or equal to 200° C. and lower than or equal to 500° C.

Figure 30C:
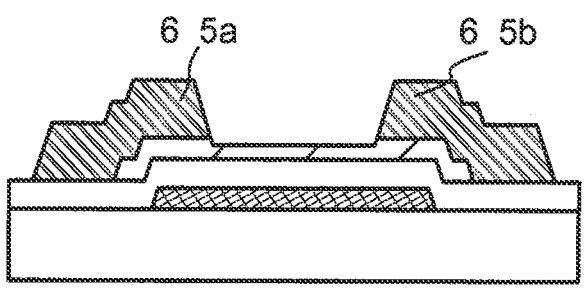

Next, as illustrated in FIG. 30C, the pair of electrodes 605a and 605b are formed.

A method for forming the pair of electrodes 605a and 605b is described below. First, a conductive film is formed by a sputtering method, a PECVD method, an evaporation method, or the like. Next, a resist mask is formed over the conductive film using a third photomask by a photolithography process. Then, part of the conductive film is etched using the resist mask to form the pair of electrodes 605a and 605b. After that, the resist mask is removed.

Note that as illustrated in FIG. 30C, the upper part of the oxide semiconductor layer 604 is partly etched and thinned by the etching of the conductive film in some cases. For this reason, the oxide semiconductor film is preferably formed thick.

Figure 30D:
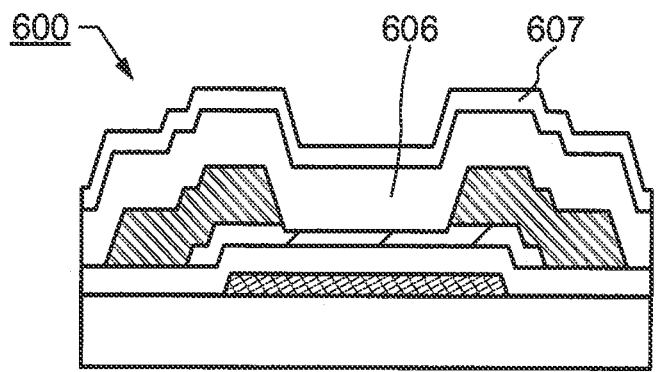

Next, as illustrated in FIG. 30D, the insulating layer 606 is formed over the oxide semiconductor layer 604 and the pair of electrodes 605a and 605b, and the insulating layer 607 is successively formed over the insulating layer 606.

When a silicon oxide film or a silicon oxynitride film is formed as the insulating layer 606, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

For example, a silicon oxide film or a silicon oxynitride film is formed under the following conditions: the substrate placed in an vacuum-evacuated treatment chamber of a plasma CVD apparatus is held at a temperature ranging from 180° C. to 260° C., preferably from 200° C. to 240° C.; the pressure of the treatment chamber into which the source gas is introduced is set in the range from 100 Pa to 250 Pa, preferably from 100 Pa to 200 Pa; and an electrode provided in the treatment chamber is supplied with a high-frequency power ranging from 0.17 W/cm$^2$ to 0.5 W/cm$^2$, preferably from 0.25 W/cm$^2$ to 0.35 W/cm$^2$.

As the film formation conditions, the high-frequency power with the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film becomes higher than that in the stoichiometric composition. However, when the substrate temperature is within the above temperature range, the bond between silicon and oxygen is weak, and accordingly, part of oxygen is released by heating. Thus, it is possible to form an oxide insulating film which contains oxygen in excess of that in the stoichiometric composition and from which part of oxygen is released by heating.

In the case where an oxide insulating film is provided between the oxide semiconductor layer 604 and the insulating layer 606, the oxide insulating film serves as a protection film of the oxide semiconductor layer 604 in the step of forming the insulating layer 606. Thus, the insulating layer 606 can be formed using the high-frequency power with high power density while damage to the oxide semiconductor layer 604 is reduced.

For example, a silicon oxide film or a silicon oxynitride film can be formed as the oxide insulating film under the following conditions: the substrate placed in an vacuum-evacuated treatment chamber of the PECVD apparatus is held at a temperature ranging from 180° C. to 400° C., preferably from 200° C. to 370° C.; the pressure of the treatment chamber into which the source gas is introduced is set in the range from 20 Pa to 250 Pa, preferably from 100 Pa to 250 Pa; and high-frequency power is supplied to the electrode provided in the treatment chamber. Setting the pressure in the treatment chamber in the range from 100 Pa to 250 Pa can reduce damage to the oxide semiconductor layer 604 at the time of forming the oxide insulating film.

A deposition gas containing silicon and an oxidizing gas are preferably used as a source gas of the oxide insulating film. Typical examples of the deposition gas containing silicon are silane, disilane, trisilane, and silane fluoride. Examples of the oxidizing gas are oxygen, ozone, dinitrogen monoxide, and nitrogen dioxide.

The insulating layer 607 can be formed by a sputtering method, a PECVD method, or the like.

When a silicon nitride film or a silicon nitride oxide film is formed as the insulating layer 607, a deposition gas containing silicon, an oxidizing gas, and a gas containing nitrogen are preferably used as a source gas. Typical examples of the deposition gas containing silicon are silane, disilane, trisilane, and silane fluoride. Examples of the oxidizing gas are oxygen, ozone, dinitrogen monoxide, and nitrogen dioxide. Examples of the gas containing nitrogen are nitrogen and ammonia.

Through the above steps, the transistor 600 can be formed.

<Modification Example of Transistor>

Examples of the structure of a transistor that is partly different from the transistor 600 are described below.

Figure 31A:
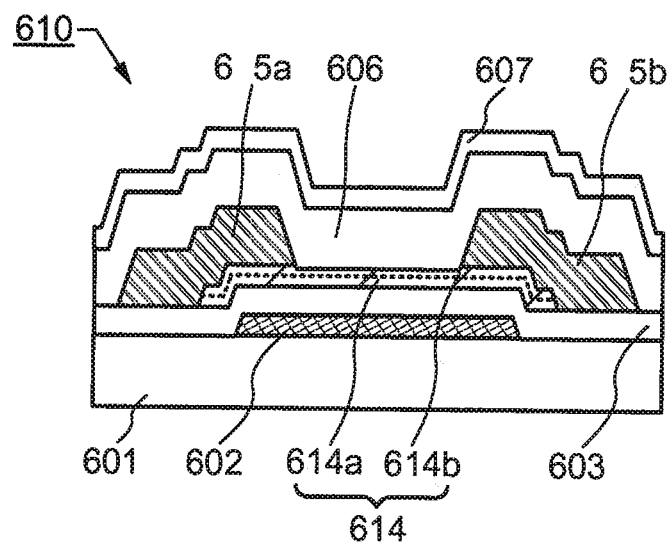
FIGS. 31A and 31B each illustrate a structure example of a transistor of one embodiment of the present invention.

FIG. 31A is a schematic cross-sectional diagram of a transistor 610 described below as an example. The transistor 610 differs from the transistor 600 in the structure of the oxide semiconductor layer.

An oxide semiconductor layer 614 included in the transistor 610 is a stack of an oxide semiconductor layer 614a and an oxide semiconductor layer 614b.

Note that a boundary between the oxide semiconductor layers 614a and 614b is shown by broken lines in FIG. 31A and the like because the boundary is not clear in some cases.

Typical examples of a material of the oxide semiconductor layer 614a are an In—Ga oxide, an In—Zn oxide, and an In-M-Zn oxide (M represents Al, Ti, Ga, Y, Zr, La, Ce, Nd, or Hf). When the oxide semiconductor layer 614a is In-M-Zn oxide, without taking Zn and O into consideration, the proportion of In and the proportion of M are preferably set to less than 50 atomic % and greater than or equal to 50 atomic %, respectively, more preferably less than 25 atomic % and greater than or equal to 75 atomic %, respectively. For example, a material that has an energy gap of 2 eV or more, preferably 2.5 eV or more, more preferably 3 eV or more is used for the oxide semiconductor layer 614a.

The oxide semiconductor layer 614b contains In or Ga, and typically contains an In—Ga oxide, an In—Zn oxide, or an In-M-Zn oxide (M represents Al, Ti, Ga, Y, Zr, La, Ce, Nd, or Hf). The energy at the conduction band bottom of the oxide semiconductor layer 614b is closer to a vacuum level than that of the oxide semiconductor layer 614a, and typically, the difference in the energy at the conduction band bottom between the oxide semiconductor layer 614b and the oxide semiconductor layer 614a is preferably 0.05 eV or more, 0.07 eV or more, 0.1 eV or more, or 0.15 eV or more and 2 eV or less, 1 eV or less, 0.5 eV or less, or 0.4 eV or less.

For example, when the oxide semiconductor layer 614b is an In-M-Zn oxide, the proportion of In and the proportion of M, not taking Zn and O into consideration, are preferably greater than or equal to 25 atomic % and less than 75 atomic %, respectively, more preferably greater than or equal to 34 atomic % and less than 66 atomic %, respectively.

For example, for the oxide semiconductor layer 614a, an In—Ga—Zn oxide with an atomic ratio of In:Ga:Zn=1:1:1, 1:1:1.2, or 3:1:2 can be used. For the oxide semiconductor layer 614b, an In—Ga—Zn oxide with an atomic ratio of In:Ga:Zn=1:3:2, 1:6:4, or 1:9:6 can be used. Note that the atomic ratio of each of the oxide semiconductor layers 614a and 614b may vary within a margin of ±20% of the corresponding atomic ratio.

The oxide with a high content of Ga serving as a stabilizer is used for the oxide semiconductor layer 614b provided over the oxide semiconductor layer 614a, thereby preventing release of oxygen from the oxide semiconductor layers 614a and 614b.

Note that without limitation to the materials given above, a material with an appropriate composition depending on intended semiconductor characteristics and electrical characteristics (e.g., field-effect mobility and threshold voltage) of a transistor can be used. In order to obtain intended semiconductor characteristics of the transistor, it is preferable that the carrier density, the impurity concentration, the defect density, the atomic ratio of a metal element to oxygen, the interatomic distance, the density, and the like of each of the oxide semiconductor layers 614a and 614b be set to appropriate values.

Although the oxide semiconductor layer 614 is a stack of two oxide semiconductor layers in the above structure, it may be a stack of three or more oxide semiconductor layers.

Figure 31B:
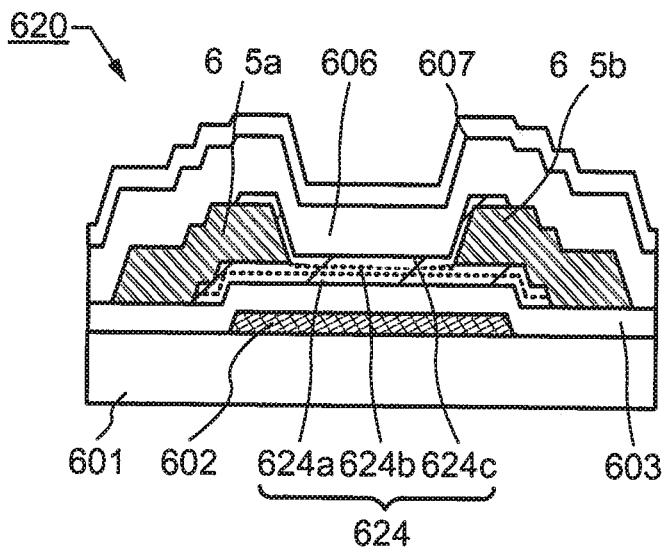

FIG. 31B is a schematic cross-sectional diagram of a transistor 620 described below as an example. The transistor 620 differs from the transistor 600 and the transistor 610 in the structure of the oxide semiconductor layer.

In an oxide semiconductor layer 624 included in the transistor 620, an oxide semiconductor layer 624a, an oxide semiconductor layer 624b, and an oxide semiconductor layer 624c are stacked in this order.

The oxide semiconductor layers 624a and 624b are stacked over the insulating layer 603. The oxide semiconductor layer 624c is provided in contact with a top surface of the oxide semiconductor layer 624b and top and side surfaces of the pair of electrodes 605a and 605b.

The oxide semiconductor layer 624b can have a structure similar to that of the oxide semiconductor layer 614a exemplified in Modification Example 1, for example. Moreover, the oxide semiconductor layers 624a and 624c can have a structure similar to that of the oxide semiconductor layer 614b exemplified in Modification Example 1, for example.

For example, when an oxide with a high content of Ga serving as a stabilizer is used for the oxide semiconductor layer 624a provided under the oxide semiconductor layer 624b and the oxide semiconductor layer 624c provided over the oxide semiconductor layer 624b, oxygen can be prevented from being released from the oxide semiconductor layers 624a to 624c.

For example, in the case where a channel is formed mainly in the oxide semiconductor layer 624b, the on-state current of the transistor 620 can be increased when an oxide with a high content of In is used for the oxide semiconductor layer 624b and the pair of electrodes 605a and 605b are provided in contact with the oxide semiconductor layer 624b.

<Another Structure Example of Transistor>

A structural example of a top-gate transistor to which the oxide semiconductor film of one embodiment of the present invention can be applied is described below.

Note that components having structures or functions similar to the above are denoted by the same reference numerals, and the description thereof is omitted below.

Figure 32A:
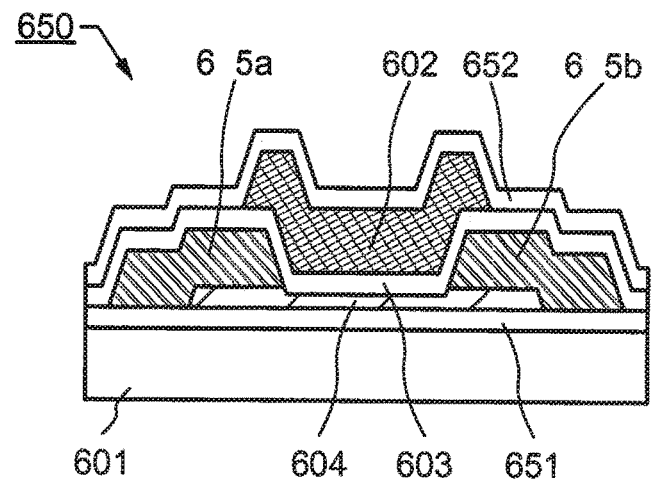
FIGS. 32A to 32C each illustrate a structure example of a transistor of one embodiment of the present invention.

FIG. 32A is a schematic cross-sectional diagram of a top-gate transistor 650 described below as an example.

The transistor 650 includes the oxide semiconductor layer 604 over the substrate 601 provided with an insulating layer 651, the pair of electrodes 605a and 605b in contact with the top surface of the oxide semiconductor layer 604, the insulating layer 603 over the oxide semiconductor layer 604 and the pair of electrodes 605a and 605b, and the gate electrode 602 provided over the insulating layer 603 to overlap with the oxide semiconductor layer 604. An insulating layer 652 is provided to cover the insulating layer 603 and the gate electrode 602.

The insulating layer 651 has a function of suppressing diffusion of impurities from the substrate 601 to the oxide semiconductor layer 604. For example, a structure similar to that of the insulating layer 607 can be employed. Note that the insulating layer 651 is not necessarily provided.

Like the insulating layer 607, the insulating layer 652 can be an insulating film having a blocking effect against oxygen, hydrogen, water, and the like. Note that the insulating layer 607 is not necessarily provided.

Examples of the structure of a transistor that is partly different from the transistor 650 are described below.

Figure 32B:
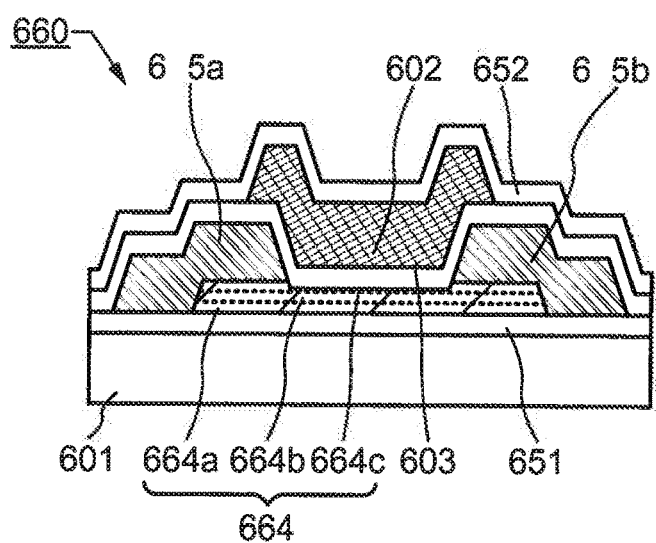

FIG. 32B is a schematic cross-sectional diagram of a transistor 660. The transistor 660 differs from the transistor 650 in the structure of the oxide semiconductor layer.

In an oxide semiconductor layer 664 included in the transistor 660, an oxide semiconductor layer 664a, an oxide semiconductor layer 664b, and an oxide semiconductor layer 664c are stacked in this order.

The oxide semiconductor film described above can be used as one or more of the oxide semiconductor layers 664a to 664c.

The oxide semiconductor layer 664b can have a structure similar to that of the oxide semiconductor layer 614a exemplified in Modification Example 1, for example. The oxide semiconductor layers 664a and 664c can have a structure similar to that of the oxide semiconductor layer 614b exemplified in Modification Example 1, for example.

For example, when an oxide with a high content of Ga serving as a stabilizer is used for the oxide semiconductor layer 664a provided under the oxide semiconductor layer 664b and the oxide semiconductor layer 664c provided over the oxide semiconductor layer 664b, oxygen can be prevented from being released from the oxide semiconductor layers 664a to 664c.

A structure example of a transistor, which is partly different from the transistor 650, is described below.

Figure 32C:
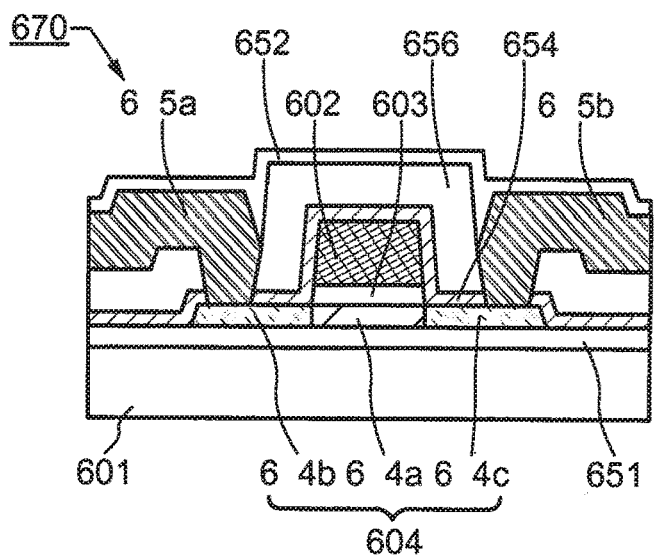

FIG. 32C is a schematic cross-sectional diagram of a transistor 670 exemplified below. The transistor 670 differs from the transistor 650 in the shapes of the pair of electrodes 605a and 605b in contact with the oxide semiconductor layer 604, the shape of the gate electrode 602, and the like.

The transistor 670 includes the oxide semiconductor layer 604 over the substrate 601 provided with the insulating layer 651, the insulating layer 603 over the oxide semiconductor layer 604, the gate electrode 602 over the insulating layer 603, an insulating layer 654 over the insulating layer 651 and the oxide semiconductor layer 604, an insulating layer 656 over the insulating layer 654, the pair of electrodes 605a and 605b electrically connected to the oxide semiconductor layer 604 through openings provided in the insulating layers 654 and 656, and the insulating layer 652 over the insulating layer 656 and the pair of electrodes 605a and 605b.

The insulating layer 654 is formed using, for example, an insulating film containing hydrogen. As an example of the insulating film containing hydrogen, a silicon nitride film can be given. Hydrogen contained in the insulating layer 654 is bonded to oxygen vacancies in the oxide semiconductor layer 604 to be carriers in the oxide semiconductor layer 604. Thus, in the structure illustrated in FIG. 32C, regions where the oxide semiconductor layer 604 and the insulating layer 654 are in contact with each other refer to an n-type region 604b and an n-type region 604c. Note that a region between the n-type region 604b and the n-type region 604c serves as a channel region 604a.

By providing the n-type regions 604b and 604c in the oxide semiconductor layer 604, contact resistance with the pair of electrodes 605a and 605b can be reduced. The n-type regions 604b and 604c can be formed using the insulating layer 654 covering the gate electrode 602 at the time of forming the gate electrode 602 in a self-aligned manner. The transistor 670 illustrated in FIG. 32C is a so-called top-gate transistor having a self-aligned structure. With a top-gate transistor having a self-aligned structure, an overlap of the gate electrode 602 and the pair of electrodes 605a and 605b serving as a source electrode and a drain electrode is not formed, which enables a reduction in parasitic capacitance between the electrodes.

The insulating layer 656 included in the transistor 670 can be formed using a silicon oxynitride film, for example.

This embodiment can be implemented in combination with any of the other embodiments described in this specification as appropriate.

Embodiment 4

In this embodiment, an oxide semiconductor layer that can be used as a semiconductor layer of the transistor with low off-state current described in the above embodiment is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In-Ce-Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, 3:1:2, or 2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is $1 \times 10^{17}/cm^3$ or lower, $1 \times 10^{16}/cm^3$ or lower, $1 \times 10^{15}/cm^3$ or lower, $1 \times 10^{14}/cm^3$ or lower, or $1 \times 10^{13}/cm^3$ or lower.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1 \times 10^{-18}$ A, preferably less than or equal to $1 \times 10^{-21}$ A, further preferably less than or equal to $1 \times 10^{-24}$ A; or at 85° C., less than or equal to $1 \times 10^{-15}$ A, preferably less than or equal to $1 \times 10^{-18}$ A, further preferably loss than or equal to $1 \times 10^{-21}$ A. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

A structure of the oxide semiconductor film is described below.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charge trapped by the carrier traps in the oxide semiconductor film takes a long time to be released, and might behave like fixed charge. Thus, the transistor that includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 m, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high resolution TEM image of the nc-OS film, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an amorphous-like OS film, a microcrystalline oxide semiconductor film, and a CAAC-OS film, for example.

In this specification, the term "parallel" indicates that the angle formed between two straight lines is greater than or equal to −10° and less than or equal to 10°, and accordingly also includes the case where the angle is greater than or equal to −5° and less than or equal to 5. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

Note that the structures, methods, and the like described in this embodiment can be used as appropriate in combination with any of the structures, methods, and the like described in the other embodiments.

Embodiment 5

In this embodiment, an example of a display module is described below with reference to FIG. 33 and FIG. 34.

Figure 33:
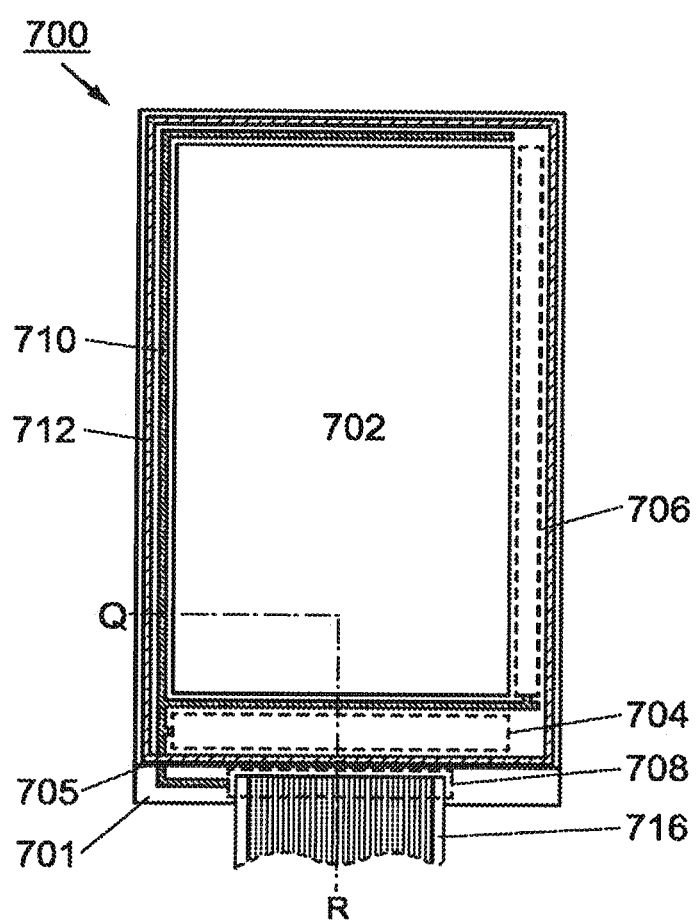
FIG. 33 is a top view illustrating one embodiment of a display device.

FIG. 33 is a top view of an example of a display module. A display module 700 illustrated in FIG. 33 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 33, a display element is provided between the first substrate 701 and the second substrate 705.

In the display module 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display module 700. An example of the display module 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display module 700 include a plurality of transistors. As the plurality of transistors, any of the transistors that are described in the above embodiments can be used.

The display module 700 can include any of a variety of elements. The display module 700 includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophorectic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption. Note that in this embodiment, a structure including a liquid crystal element as a display element is described below.

As a display method in the display module 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display, the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases. Note that in this embodiment, a structure in which a backlight and the like are not provided, that is, a so-called reflective liquid crystal display module is described below.

Figure 34:
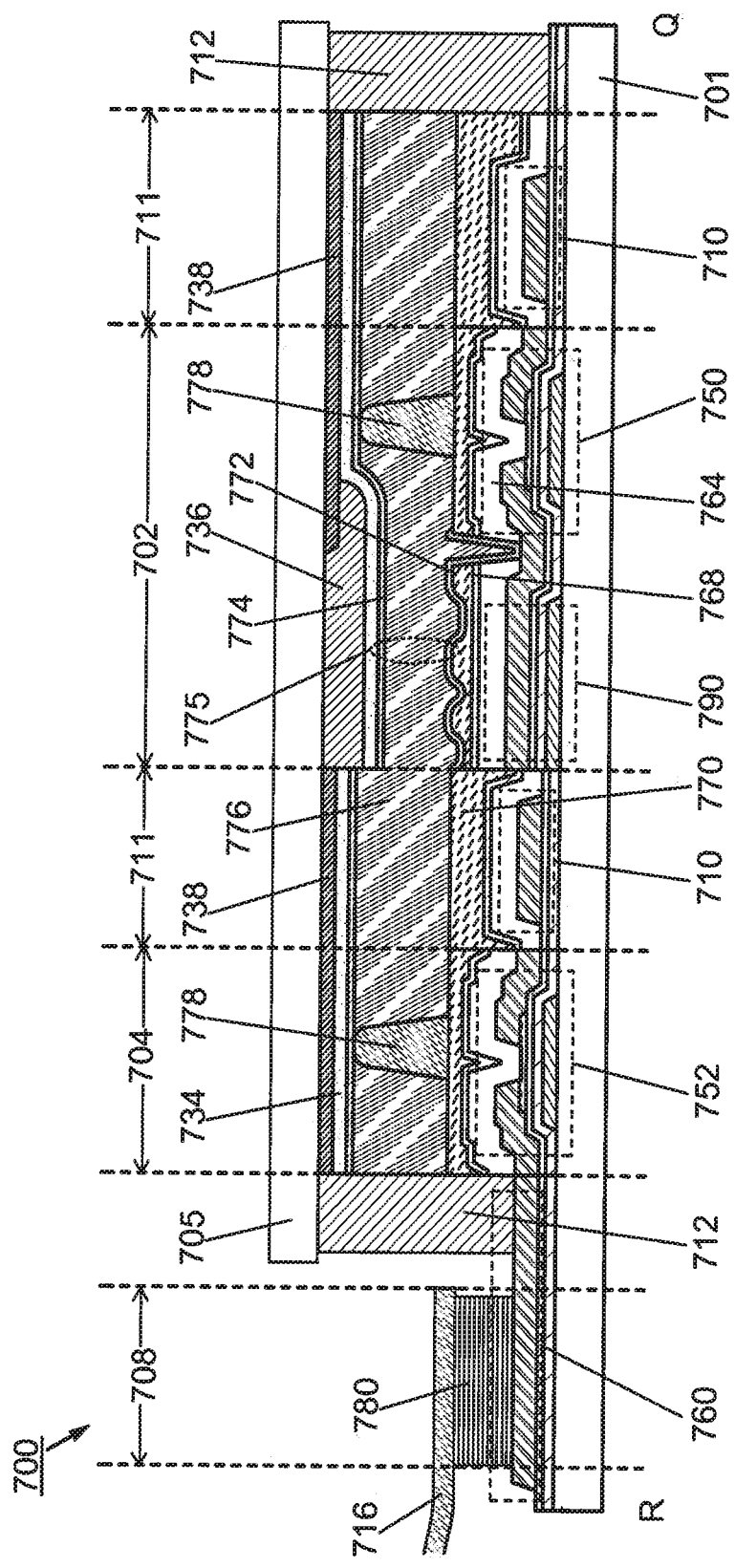
FIG. 34 is a cross-sectional view illustrating one embodiment of a display device.

FIG. 34 is a cross-sectional view taken along dashed-dotted line Q-R in FIG. 33. The display module illustrated in FIG. 34 is described in detail below.

<Display Module>

The display module 700 illustrated in FIG. 34 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 34, insulating films 764 and 768 and a planarization insulating film 770 are formed over the transistor 750, the transistor 752, and the capacitor 790.

As the insulating film 764, a silicon oxide film, a silicon oxynitride film, or the like may be formed by a PECVD device, for example. As the insulating film 768, a silicon nitride film or the like may be formed by a PECVD device, for example. The planarization insulating film 770 can be formed using a heat-resistant organic material, such as a polyimide resin, an acrylic resin, a polyimide amide resin, a benzocyclobutene resin, a polyamide rosin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film formed in the same process as a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Liquid Crystal Element as Display Element>

The display module 700 illustrated in FIG. 34 includes a liquid crystal element 775. The liquid crystal element 775 includes a conductive film 772, a conductive film 774, and a liquid crystal layer 776. The liquid crystal layer 776 is formed using a liquid crystal material having a dielectric constant anisotropy of greater than or equal to 2 and less than or equal to 3.8. The conductive film 774 is provided on the second substrate 705 side and functions as a counter electrode. The display module 700 in FIG. 34 is capable of displaying an image in such a manner that transmission or non-transmission of light is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display module 700 in FIG. 34 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display module 700 in FIG. 34. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved. As illustrated in FIG. 34, a reflective color liquid crystal display device can display an image without a backlight, which enables a reduction in power consumption.

Note that the display module 700 illustrated in FIG. 34 is a reflective color liquid crystal display module given as an example, but a display type is not limited thereto. For example, a transmissive color liquid crystal display module in which the conductive film 772 is a conductive film that transmits visible light may be used. In the case of a transmissive color liquid crystal display module, projections and depressions are not necessarily provided on the planarization insulating film 770.

Although not illustrated in FIG. 34, an alignment film may be provided on a side of the conductive film 772 in contact with the liquid crystal layer 776 and on a side of the conductive film 774 in contact with the liquid crystal layer 776. Although not illustrated in FIG. 34, an optical member (an optical substrate) and the like such as a polarizing member, a retardation member, or an anti-reflection member may be provided as appropriate. For example, circular polarization may be employed by using a polarizing substrate and a retardation substrate. In the case of the transmissive display module or the semi-transmissive display module, a backlight, a sidelight, or the like may be used as a light source.

As the liquid crystal element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal. (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

The structure described in this embodiment can be used in appropriate combination with any of the structures described in the other embodiments.

Embodiment 6

In this embodiment, an input/output device (also referred to as a touch panel) obtained by providing a touch sensor (a contact sensor device) for the display module described in the above embodiment is described with reference to FIGS. 35A to 35C and FIG. 36. Hereinafter, the description of the same portions as the above embodiments is omitted in some cases.

FIGS. 35A to 35C are projection drawings illustrating a structure of the input/output device.

FIG. 35A is a projection drawing of an input/output device 800, and FIG. 35B is a projection drawing illustrating a structure of a sensor unit 820U included in the input/output device 800.

Figure 36:
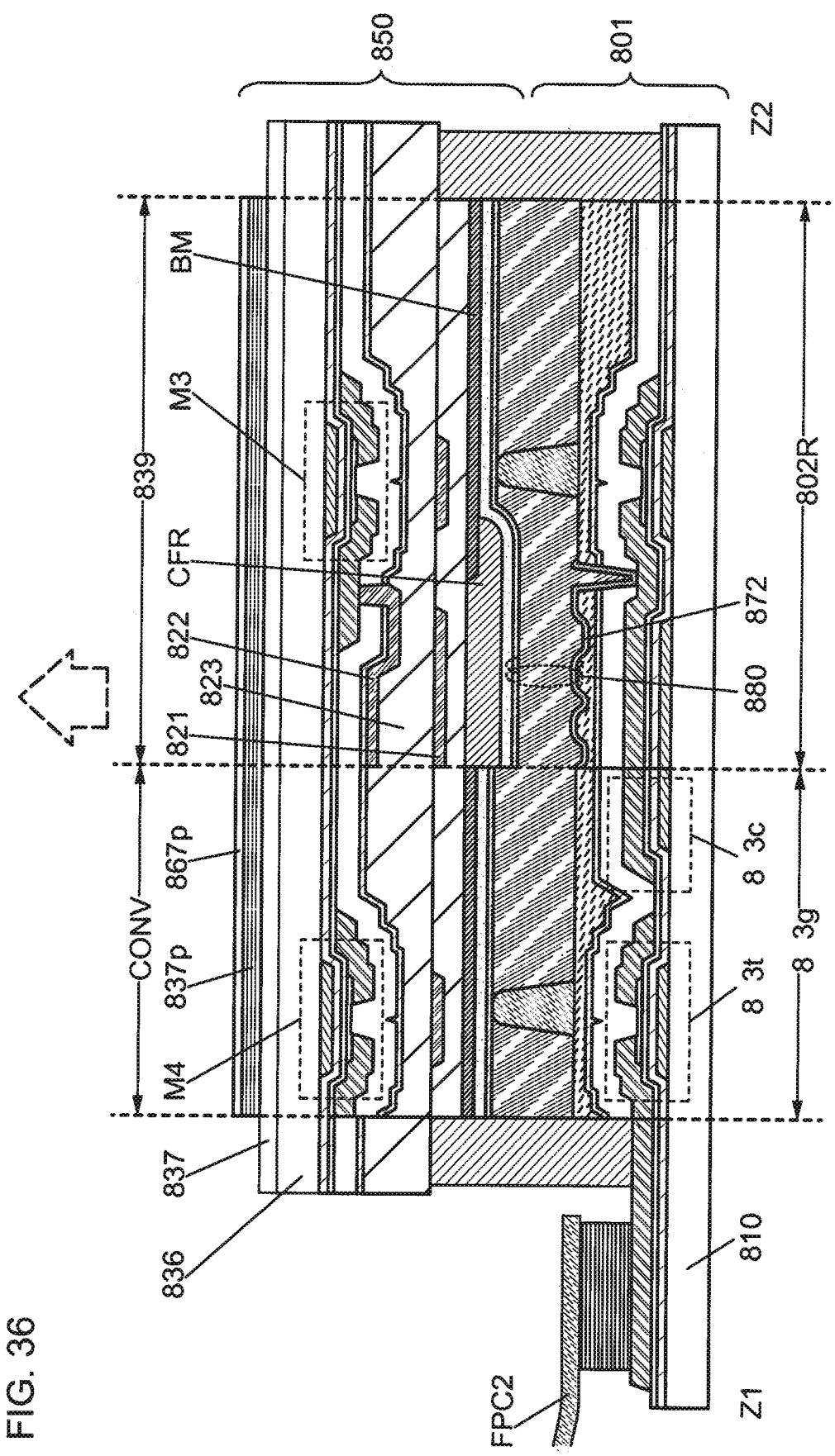
FIG. 36 is a cross-sectional view illustrating a structure of an input/output device of one embodiment.

FIG. 36 is a cross-sectional view taken along line Z1-Z2 of the input/output device 800 in FIG. 35A.

<Structure Example 1 of Input/Output Device>

The input/output device 800 described in this embodiment includes an input device 850 and a display module 801. The input device 850 includes a plurality of sensor units 820U arranged in matrix and each provided with window portions 834 transmitting visible light, a scan line G1 electrically connected to a plurality of sensor units 820U placed in the row direction (indicated by arrow Rx in the drawing), a signal line DL electrically connected to a plurality of sensor units 820U placed in the column direction (indicated by arrow Ry in the drawing), and a first base material 836 supporting the sensor unit 820U, the scan line G1, and the signal line DL. The display module 801 includes a plurality of pixels 802 overlapping with the window portions 834 and arranged in matrix and a second base material 810 supporting the pixels 802 (see FIGS. 35A to 35C).

The sensor unit 820U includes a sensor element Ca overlapping with the window portion 834 and a sensor circuit 839 electrically connected to the sensor element Ca (see FIG. 35B).

The sensor element Ca includes an insulating layer 823, and a first electrode 821 and a second electrode 822 between which the insulating layer 823 (not illustrated in FIG. 35B) is sandwiched (see FIG. 35B).

A selection signal is supplied to the sensor circuit 839, and the sensor circuit 839 supplies a sensor signal DATA based on the change in capacitance of the sensor element Ca.

The scan line G1 can supply the selection signal, the signal line DL can supply the sensor signal DATA, and the sensor circuit 839 is placed to overlap with gaps between the plurality of window portions 834.

In addition, the input/output device 800 described in this embodiment includes a coloring layer between the sensor unit 820U and the pixel 802 overlapping with the window portion 834 of the sensor unit 820U.

The input/output device 800 described in this embodiment includes the input device 850 including the plurality of sensor units 820U, each of which is provided with the window portions 834 transmitting visible light, and the display module 801 including the plurality of pixels 802 overlapping with the window portions 834. The coloring layer is included between the window portion 834 and the pixel 802.

With such a structure, the input/output device can supply a sensor signal based on the change in the capacitance and positional information of the sensor unit supplying the sensor signal and can display image data relating to the positional information of the sensor unit. As a result, a novel input/output device with high convenience or high reliability can be provided.

The input/output device 800 may include a flexible substrate FPC 1 to which a signal from the input device 850 is supplied and/or a flexible substrate FPC 2 supplying a signal including image data to the display module 801.

In addition, a protective base material 837 or a protective layer 837p that protects the input/output device 800 by preventing damage and/or an anti-reflective layer 867p that weakens the intensity of external light reflected by the input/output device 800 may be included.

Moreover, the input/output device 800 includes a scan line driver circuit 803g that supplies the selection signal to a scan line of the display module 801, a wiring 811 supplying a signal, and a terminal 819 electrically connected to the flexible substrate FPC 2.

Components of the input/output device 800 are described below. Note that these components cannot be clearly distinguished and one component also serves as another component or includes part of another component in some cases. For example, the input device 850 including the coloring layer overlapping with the plurality of window portions 834 also serves as a color filter.

The input/output device 800 includes the input device 850 and the display module 801 (see FIG. 35A).

The input device 850 includes the plurality of sensor units 820U and the first base material 836 supporting the sensor units 820U. For example, the plurality of sensor units 820U are arranged in matrix with 40 rows and 15 columns on the first base material 836.

The window portion 834 transmits visible light.

A coloring layer transmitting light of a predetermined color is provided to overlap with the window portion 834. For example, a coloring layer CFB transmitting blue light, a coloring layer CFG transmitting green light, and a coloring layer CFR transmitting red light are included (see FIG. 35B).

Note that, in addition to the coloring layers transmitting blue light, green light, and/or red light, coloring layers transmitting light of various colors such as a coloring layer transmitting white light and a coloring layer transmitting yellow light can be included.

For a coloring layer, a metal material, a pigment, dye, or the like can be used.

A light-blocking layer BM is provided to surround the window portions 834. The light-blocking layer BM does not easily transmit light as compared to the window portion 834.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 839 are provided to overlap with the light-blocking layer BM.

Note that a light-transmitting overcoat layer covering the coloring layer and the light-blocking layer BM can be provided.

The sensor element Ca includes the first electrode 821, the second electrode 822, and the insulating layer 823 between the first electrode 821 and the second electrode 822 (see FIG. 36).

The first electrode 821 is formed in, for example, an island shape so as to be apart from other regions. A layer that can be formed in the same process as that of the first electrode 821 is preferably placed close to the first electrode 821 so that the user of the input/output device 800 does not recognize the first electrode 821. Further preferably, the number of the window portions 834 placed in the gap between the first electrode 821 and the layer placed close to the first electrode 821 is reduced as much as possible. In particular, the window portion 834 is preferably not placed in the gap.

When an object whose dielectric constant is different from that of the air gets closer to the first electrode 821 or the second electrode 822 of the sensor element Ca that is put in the air, the capacitance of the sensor element Ca is changed. Specifically, when a finger or the like gets closer to the sensor element Ca, the capacitance of the sensor element Ca is changed. Thus, the sensor element Ca can be used in a proximity sensor.

The first electrode 821 and the second electrode 822 include a conductive material.

For example, an inorganic conductive material, an organic conductive material, a metal material, a conductive ceramic material, or the like can be used for the first electrode 821 and the second electrode 822.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used for the first electrode 821 and the second electrode 822.

Alternatively, a conductive oxide such as indium oxide, indium tin oxide, indium zinc oxide, zinc oxide, or zinc oxide to which gallium is added can be used for the first electrode 821 and the second electrode 822.

Alternatively, graphene or graphite can be used for the first electrode 821 and the second electrode 822. The film including graphene can be formed, for example, by reducing a film containing graphene oxide. As a reducing method, a method with application of heat, a method using a reducing agent, or the like can be employed.

Alternatively, a conductive polymer can be used for the first electrode 821 and the second electrode 822.

The sensor circuit 839 includes transistors M1 to M3, for example. In addition, the sensor circuit 839 includes wirings supplying a power supply potential and a signal. For example, the signal line DL, the wiring VPI, a wiring CS, the scan line G01, the wiring RES, and the wiring VRES are included.

Note that the sensor circuit 839 may be placed not to overlap with the window portion 834.

A conductive material can be used for the wirings (e.g., the signal line DL, the wiring VPI, the wiring CS, the scan line G1, the wiring RES, and the wiring VRES). For example, an inorganic conductive material, an organic conductive material, a metal material, a conductive ceramic material, or the like can be used for the wirings. Alternatively, a material which is the same as those of the first electrode 821 and the second electrode 822 may be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 839 may be formed on the first base material 836. Alternatively, the sensor circuit 839 formed on another base material may be transferred to the first base material 836.

Examples of the materials of the first base material 836 and the second base material 810 are glass substrates or flexible materials (e.g., a resin, a resin film, and a plastic film).

More specifically, non-alkali glass, soda-lime glass, potash glass, crystal glass, or the like can be used for the first base material 836 and the second base material 810. Alternatively, a resin film or resin plate of polyester, polyolefin, polyamide, polyimide, polycarbonate, an acrylic resin, or the like can be used for the first base material 836.

For example, a glass substrate, a resin film or resin plate of polyester, polyolefin, polyamide, polyimide, polycarbonate, an acrylic resin, or the like, a stack thereof, or the like can be used as the protective base material 837 and/or the protective layer 837*p*.

For example, a hard coat layer or a ceramic coat layer can be used as the protective layer 837*p*. Specifically, a layer containing a UV curable resin or aluminum oxide may be formed to overlap with the second electrode 822.

The display module 801 includes the plurality of pixels 802 arranged in matrix (see FIG. 35C).

For example, the pixel 802 includes a sub-pixel 802B, a sub-pixel 802G, and a sub-pixel 802R, and each sub-pixel includes a display element and a pixel circuit for driving the display element.

In the pixel 802, the sub-pixel 8021 is placed to overlap with the coloring layer CFB, the sub-pixel 802G is placed to overlap with the coloring layer CFO, and the sub-pixel 802R is placed to overlap with the coloring layer CFR.

The coloring layer CPR is positioned in a region overlapping with the liquid crystal element 880. Note that the liquid crystal element 880 includes a reflective electrode 872 as one electrode (see FIG. 36). Thus, part of external light reflected by the reflective electrode 872 passes through the coloring layer CFR and is emitted in a direction indicated by an arrow in the drawing. The reflective electrode 872 can have a structure similar to that of the conductive film 772 serving as the reflective electrode in the above embodiment. The liquid crystal element 880 includes a liquid crystal layer having a dielectric constant anisotropy of greater than or equal to 2 and less than or equal to 3.8.

The light-blocking layer BM is provided to surround the coloring layer (e.g., the coloring layer CFR).

The scan line driver circuit 803*g* includes a transistor 803*t* and a capacitor 803*c* (see FIG. 36).

Various circuits that can convert the sensor signal DATA supplied from the sensor unit 820U and supply the converted signal to the flexible substrate FPC 1 can be used as a converter CONV (see FIG. 35A and FIG. 36).

For example, a transistor M4 can be used in the converter CONV.

The display module 801 includes the anti-reflective layer 867*p* positioned in a region overlapping with pixels. As the anti-reflective layer 867*p*, a circular polarizing plate can be used, for example.

As illustrated in FIG. 35A, the display module 801 includes the wirings 811 through which signals can be supplied. The wirings 811 are provided with the terminal 819. Note that the flexible substrate FPC 2 through which a signal such as an image signal or a synchronization signal is supplied is electrically connected to the terminal 819.

Note that a printed wiring board (PWB) may be attached to the flexible substrate FPC 2.

The display module 801 includes wirings such as scan lines, signal lines, and power supply lines. Any of various conductive films can be used as the wirings.

For the wirings included in the display module 801, for example, a metal element selected from aluminum, chromium, copper, tantalum, titanium, molybdenum, tungsten, nickel, yttrium, zirconium, silver, and manganese; an alloy including any of the above-described metal elements; or an alloy including any of the above-described metal elements in combination can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

As specific structures of the wirings included in the display module 801, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a stacked structure in which an alloy film or a nitride film which contains one or more elements selected from titanium, tantalum, tungsten, molybdenum, chromium, neodymium, and scandium is stacked over an aluminum film can be used. Alternatively, a light-transmitting conductive material including indium oxide, tin oxide, or zinc oxide may be used.

This embodiment can be combined with any of the other embodiments in this specification as appropriate.

Embodiment 7

In this embodiment, specific examples of electronic devices each of which is manufactured using the liquid crystal display device described in the above embodiment are described with reference to FIGS. 37A to 37C.

Examples of electronic devices to which one embodiment of the present invention can be applied include a television set (also referred to as a television or a television receiver), a monitor of a computer or the like, a camera such as a digital camera or a digital video camera, a digital photo frame, a mobile phone, a portable game machine, a portable information terminal, a music reproducing device, a game machine (e.g., a pachinko machine or a slot machine), and a game console. FIGS. 37A to 37C illustrate specific examples of these electronic devices.

Figure 37A:
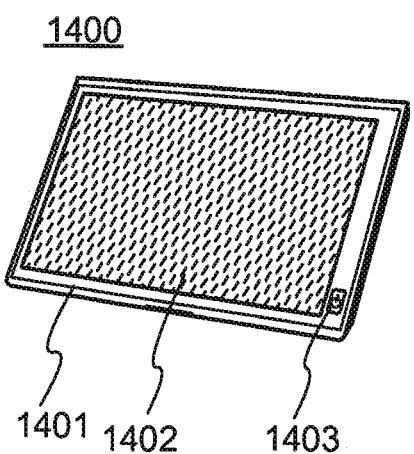
FIGS. 37A to 37C each illustrate an electronic device of one embodiment of the present invention.

FIG. 37A illustrates a portable information terminal 1400 including a display portion. The portable information terminal 1400 includes a display portion 1402 and an operation button 1403 which are incorporated in a housing 1401. The liquid crystal display device of one embodiment of the present invention can be used for the display portion 1402.

Figure 37B:
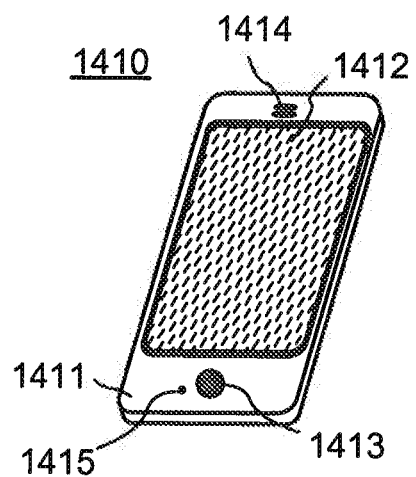

FIG. 37B illustrates a cellular phone 1410. The cellular phone 1410 includes a display portion 1412, an operation button 1413, a speaker 1414, and a microphone 1415 which are incorporated in a housing 1411. The liquid crystal display device of one embodiment of the present invention can be used for the display portion 1412.

Figure 37C:
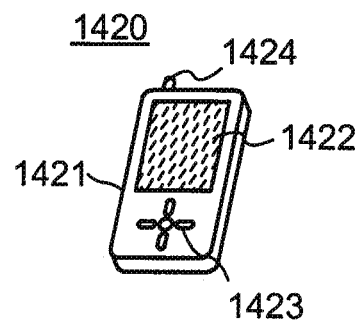

FIG. 37C illustrates a music reproducing device 1420. The music reproducing device 1420 includes a display portion 1422, an operation button 1423, and an antenna 1424 which are incorporated in a housing 1421. In addition, the antenna 1424 transmits and receives data via a wireless signal. The liquid crystal display device of one embodiment of the present invention can be used for the display portion 1422.

The display portions 1402, 1412, and 1422 each have a touch-input function. When a user touches a displayed button (not illustrated) which is displayed on the display portion 1402, 1412, or 1422 with his/her fingers or the like, the user can carry out operation on the screen and input of information.

When the liquid crystal display device described in the above embodiment is used for the display portions 1402, 1412, and 1422, the display quality of the display portions 1402, 1412, and 1422 can be improved.

This embodiment can be implemented in an appropriate combination with any of the structures described in the other embodiments.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a TFT and a light-emitting element, even when this specification or the like does not include a description of the case where a semiconductor device including the TFT is used alone or the case where a light-emitting device including the light-emitting element is used alone, one embodiment of the invention can be constituted by only the semiconductor device including the TFT and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the content taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial No. 2014-090314 filed with Japan Patent Office on Apr. 24, 2014, the entire contents of which are hereby incorporated by reference.

What is claimed is:

1. A semiconductor device comprising a shift register,
wherein the shift register includes first to third flipflops,
wherein the first flipflop has a function of outputting a first signal to a first wiring,
wherein the second flipflop has a function of outputting a second signal to a second wiring,
wherein the third flipflop has a function of outputting a third signal to a third wiring,
wherein the first signal has a value synchronized with a first clock signal,
wherein the second signal has a value synchronized with a second clock signal,
wherein the third signal has a value synchronized with a third clock signal,
wherein the second flipflop includes first to fifth transistors,
wherein one of a source and a drain of the first transistor is electrically connected to a fourth wiring,
wherein the other of the source and the drain of the first transistor is electrically connected to the second wiring,
wherein one of a source and a drain of the second transistor is electrically connected to the first wiring,
wherein the other of the source and the drain of the second transistor is electrically connected to a gate of the first transistor,
wherein one of a source and a drain of the third transistor is electrically connected to the third wiring,
wherein the other of the source and the drain of the third transistor is electrically connected to the gate of the first transistor,
wherein the first wiring is electrically connected to either a gate and a source or a gate and a drain of the fourth transistor,
wherein the other of the source and the drain of the fourth transistor is electrically connected to a gate of the second transistor,
wherein the third wiring is electrically connected to either a gate and a source or a gate and a drain of the fifth transistor,
wherein the other of the source and the drain of the fifth transistor is electrically connected to a gate of the third transistor, and
wherein the fourth wiring has a function of transmitting the second clock signal.

2. The semiconductor device according to claim 1, wherein W (W refers to a channel width)/L (L refers to a channel length) of the fourth transistor is 0.8 to 1.2 times W/L of the fifth transistor.

3. The semiconductor device according to claim 1, wherein W (W refers to a channel width)/L (L refers to a channel length) of the second transistor is 0.8 to 1.2 times W/L of the third transistor.

4. The semiconductor device according to claim 1, wherein the first transistor includes an oxide semiconductor in a channel formation region.

5. A display module comprising an FPC and the semiconductor device according to claim 1.

6. An electronic device comprising a speaker, an operation button, an antenna and the display module according to claim 5.

* * * * *